US012696362B2

(12) United States Patent
Tanaka

(10) Patent No.: US 12,696,362 B2
(45) Date of Patent: Jul. 28, 2026

(54) ELECTROLUMINESCENCE ELEMENT AND METHOD OF MANUFACTURING ELECTROLUMINESCENCE ELEMENT

(71) Applicant: MIKUNI ELECTRON CORPORATION, Saitama (JP)

(72) Inventor: Sakae Tanaka, Saitama (JP)

(73) Assignee: MIKUNI ELECTRON CORPORATION, Saitama (JP)

(*) Notice: Subject to any disclaimer, the term of this patent is extended or adjusted under 35 U.S.C. 154(b) by 639 days.

(21) Appl. No.: 18/066,382

(22) Filed: Dec. 15, 2022

(65) Prior Publication Data

US 2023/0146966 A1 May 11, 2023

Related U.S. Application Data

(63) Continuation of application No. PCT/JP2021/023638, filed on Jun. 22, 2021.

(30) Foreign Application Priority Data

Jun. 23, 2020 (JP) ................................ 2020-107890

(51) Int. Cl.
*H05B 33/26* (2006.01)
*H10D 30/67* (2025.01)
(Continued)

(52) U.S. Cl.
CPC .......... *H05B 33/26* (2013.01); *H10K 50/166* (2023.02); *H10K 50/818* (2023.02);
(Continued)

(58) Field of Classification Search
None
See application file for complete search history.

(56) References Cited

U.S. PATENT DOCUMENTS 5,245,450 A 9/1993 Ukai et al.
6,037,718 A 3/2000 Nagami
(Continued)

FOREIGN PATENT DOCUMENTS

CN 1716366 A 1/2006
CN 1924684 A 3/2007
(Continued)

OTHER PUBLICATIONS

Korean Office Action issued in Korean Patent Application No. 10-2022-7042390 dated Jan. 18, 2024.
(Continued)

*Primary Examiner* — Michael Lebentritt
(74) *Attorney, Agent, or Firm* — McDonald Hopkins LLC

(57) ABSTRACT

A method of manufacturing an electroluminescence element according to an embodiment of the present invention includes forming a first electrode on a substrate, forming a first electron transport layer in contact with the first electrode, forming a first insulating layer having an opening in a region overlapping with the first electrode, forming a second electron transport layer includes metal oxide semiconductor by applying a composition to the opening and removing a solvent after application, forming a light emitting layer overlapping with the second electron transport layer, the light emitting layer containing an electroluminescent material, forming a second electrode in a region overlapping with the light emitting layer.

17 Claims, 41 Drawing Sheets

(51) Int. Cl.

| | |
|---|---|
| ***H10D 86/40*** | (2025.01) |
| ***H10D 86/60*** | (2025.01) |
| ***H10K 50/16*** | (2023.01) |
| ***H10K 50/818*** | (2023.01) |
| ***H10K 50/822*** | (2023.01) |
| ***H10K 59/121*** | (2023.01) |
| ***H10K 59/80*** | (2023.01) |
| ***H10K 71/40*** | (2023.01) |

(52) U.S. Cl.

CPC ....... *H10K 50/822* (2023.02); *H10K 59/1213* (2023.02); *H10K 59/80518* (2023.02); *H10K 71/40* (2023.02); *H10D 30/6734* (2025.01); *H10D 30/6755* (2025.01); *H10D 86/423* (2025.01); *H10D 86/60* (2025.01)

(56) References Cited

U.S. PATENT DOCUMENTS 6,730,970 B1 5/2004 Katoh et al.
8,344,387 B2 1/2013 Akimoto et al.
8,421,068 B2 4/2013 Yamazaki et al.
8,427,607 B2 4/2013 Lee et al.
8,598,610 B2 12/2013 Oda
8,816,380 B2 8/2014 Oda
9,899,420 B2 2/2018 Yamazaki et al.
10,020,374 B2 7/2018 Sone et al.
10,068,932 B2 9/2018 Kawamura et al.
10,074,709 B1 9/2018 Tanaka
10,079,231 B2 9/2018 Ikeda
10,102,804 B2 10/2018 Tanikame
10,141,343 B2 11/2018 Ito et al.
10,141,384 B2 11/2018 Takata
10,158,005 B2 12/2018 Akimoto et al.
10,243,005 B2 3/2019 Yamazaki et al.
10,326,008 B2 6/2019 Kimura
10,365,524 B2 7/2019 Kim et al.
10,388,520 B2 8/2019 Yamazaki et al.
10,418,384 B2 9/2019 Yamazaki et al.
10,559,602 B2 2/2020 Kubota et al.
10,593,283 B2 3/2020 Hsu et al.
10,615,233 B2 4/2020 Muccini et al.
11,024,725 B2 6/2021 Yamazaki et al.
11,233,132 B2 1/2022 Kimura
11,239,449 B2 2/2022 Tanaka
11,329,166 B2 5/2022 Hosaka et al.
11,352,555 B2 * 6/2022 Park ....................... C09K 11/08
2001/0002857 A1 6/2001 Shimada et al.
2002/0020875 A1 2/2002 Arao et al.
2002/0056838 A1 5/2002 Ogawa
2002/0089616 A1 7/2002 Hashimoto et al.
2002/0093600 A1 7/2002 Chol
2002/0140891 A1 10/2002 Tomioka et al.
2002/0149722 A1 10/2002 Anno et al.
2002/0167280 A1 11/2002 Hayashi et al.
2003/0137242 A1 7/2003 Seki
2003/0184699 A1 10/2003 Matsumoto et al.
2003/0197666 A1 10/2003 Akimoto et al.
2004/0095168 A1 5/2004 Miyazawa
2004/0222429 A1 11/2004 Yamazaki et al.
2004/0227891 A1 11/2004 Hirota
2005/0018114 A1 1/2005 Park et al.
2005/0199880 A1 9/2005 Hoffman et al.
2006/0007073 A1 1/2006 Kwak
2007/0069202 A1 3/2007 Choi et al.
2007/0126671 A1 6/2007 Naoaki
2007/0269936 A1 11/2007 Tanaka et al.
2008/0042963 A1 2/2008 Fujita
2008/0122341 A1 5/2008 Orita et al.
2008/0238835 A1 10/2008 Asano et al.
2009/0072725 A1 3/2009 Suzuki et al.
2009/0135105 A1 5/2009 Nakamura et al.
2009/0135125 A1 5/2009 Park
2009/0140955 A1 6/2009 Nakamura et al.
2009/0179195 A1 7/2009 Obata et al.
2009/0179208 A1 7/2009 Obata et al.
2009/0189161 A1 7/2009 Honda
2009/0206332 A1 8/2009 Son et al.
2009/0236596 A1 9/2009 Itai
2009/0283763 A1 11/2009 Park et al.
2009/0315043 A1 12/2009 Nakamura et al.
2010/0006834 A1 1/2010 Kim et al.
2010/0020283 A1 1/2010 Suzuki
2010/0102313 A1 4/2010 Miyairi et al.
2010/0193782 A1 8/2010 Sakata
2010/0200851 A1 8/2010 Oikawa et al.
2010/0224872 A1 9/2010 Kimura
2010/0224878 A1 9/2010 Kimura
2010/0224880 A1 9/2010 Kimura
2010/0230680 A1 9/2010 Seong et al.
2010/0244020 A1 9/2010 Sakata et al.
2010/0244031 A1 9/2010 Akimoto et al.
2010/0244710 A1 9/2010 Obata et al.
2010/0279474 A1 11/2010 Akimoto et al.
2010/0301383 A1 12/2010 Shitagaki et al.
2011/0024740 A1 2/2011 Yamazaki et al.
2011/0031492 A1 2/2011 Yamazaki et al.
2011/0031496 A1 2/2011 Yamazaki et al.
2011/0073868 A1 3/2011 Nakagawa et al.
2011/0090417 A1 4/2011 Kim et al.
2011/0108835 A1 5/2011 Kim et al.
2011/0127521 A1 6/2011 Yamazaki
2011/0127523 A1 6/2011 Yamazaki
2011/0133178 A1 6/2011 Yamazaki et al.
2011/0141076 A1 6/2011 Fukuhara et al.
2011/0147738 A1 6/2011 Yamazaki et al.
2011/0176100 A1 7/2011 Nishida et al.
2011/0181349 A1 7/2011 Yamazaki et al.
2011/0212570 A1 9/2011 Yamazaki et al.
2011/0240987 A1 10/2011 Lee et al.
2011/0240994 A1 10/2011 Yamazaki
2011/0248258 A1 10/2011 Kim et al.
2011/0278571 A1 11/2011 Yamazaki et al.
2011/0309411 A1 12/2011 Takemura
2012/0007083 A1 1/2012 You et al.
2012/0112200 A1 5/2012 Nagano
2012/0138922 A1 6/2012 Yamazaki et al.
2012/0146062 A1 6/2012 Oda
2012/0146713 A1 6/2012 Kim et al.
2012/0161126 A1 6/2012 Yamazaki
2012/0187395 A1 7/2012 Koezuka
2012/0248451 A1 10/2012 Sone et al.
2012/0313903 A1 12/2012 Pyon et al.
2012/0319102 A1 12/2012 Yamazaki et al.
2013/0001602 A1 1/2013 Park et al.
2013/0082254 A1 4/2013 Yamazaki et al.
2013/0240842 A1 9/2013 Rinzler et al.
2013/0242222 A1 9/2013 Nishida et al.
2013/0270552 A1 10/2013 Yamazaki et al.
2013/0286054 A1 10/2013 Kitadani et al.
2013/0328045 A1 12/2013 Takata et al.
2014/0014947 A1 1/2014 Yamazaki
2014/0027762 A1 1/2014 Tsurume et al.
2014/0077160 A1 3/2014 Dai et al.
2014/0111406 A1 4/2014 Wang et al.
2014/0111728 A1 4/2014 Li et al.
2014/0183461 A1 * 7/2014 Kim ....................... H10K 59/35 438/47
2014/0340608 A1 11/2014 Yamazaki et al.
2015/0137103 A1 5/2015 Hosono et al.
2015/0137113 A1 5/2015 Yu et al.
2015/0153599 A1 6/2015 Yamazaki et al.
2015/0171371 A1 * 6/2015 Jeon ..................... H10K 59/873 257/40
2015/0179802 A1 6/2015 Kim et al.
2015/0221678 A1 8/2015 Yamazaki et al.
2015/0221775 A1 8/2015 Yamazaki et al.
2015/0228799 A1 8/2015 Koezuka et al.
2016/0056214 A1 2/2016 Pyo et al.
2016/0155858 A1 6/2016 Yoo et al.
2016/0155980 A1 6/2016 Lee et al.
2016/0218324 A1 7/2016 Kim et al.
2016/0284854 A1 9/2016 Okazaki et al.
2016/0285027 A1 9/2016 Hosono et al.

(56) References Cited

U.S. PATENT DOCUMENTS

2016/0300950 A1 10/2016 Lee et al.
2016/0329388 A1* 11/2016 Yokota ................. H10K 59/876
2016/0343868 A1 11/2016 Koezuka et al.
2017/0098782 A1 4/2017 Choi et al.
2017/0117705 A1 4/2017 Sekine et al.
2017/0133437 A1* 5/2017 Komatsu ................ H10K 50/16
2017/0176826 A1 6/2017 Tsuda et al.
2017/0186984 A1 6/2017 Hosono et al.
2018/0122833 A1 5/2018 Lee et al.
2018/0166585 A1 6/2018 Takechi
2018/0301472 A1 10/2018 Matsukizono
2019/0006451 A1 1/2019 Tanaka
2019/0013333 A1 1/2019 Inoue et al.
2020/0089064 A1 3/2020 Morinaga et al.
2020/0373430 A1 11/2020 Shima et al.
2021/0012728 A1 1/2021 Shan
2021/0327987 A1 10/2021 Fang et al.

FOREIGN PATENT DOCUMENTS

CN 101126881 A 2/2008
CN 101165906 A 4/2008
CN 101226311 A 7/2008
CN 101336491 A 12/2008
CN 101383125 A 3/2009
CN 101634770 A 1/2010
CN 101847661 A 9/2010
CN 101995700 A 3/2011
CN 101997003 A 3/2011
CN 101997007 A 3/2011
CN 102129142 A 7/2011
CN 102629061 A 8/2012
CN 102629577 A 8/2012
CN 102782858 A 11/2012
CN 103309093 9/2013
CN 103377617 A 10/2013
CN 104597680 A 5/2015
CN 105762196 A 7/2016
CN 107479265 A 12/2017
CN 108550582 A 9/2018
CN 108598128 A * 9/2018 ........... H10H 20/831
CN 109637493 A 4/2019
CN 109904191 A * 6/2019 ......... H10K 59/8723
CN 110875437 A 3/2020
DE 102019117580 A1 * 1/2020 ........... H10K 59/879
EP 2634812 A1 9/2013
EP 3410490 A3 2/2019
EP 3618136 A2 3/2020
JP H09-152625 A 6/1997
JP H09-269508 A 10/1997
JP 2909266 B2 6/1999
JP H11-212493 A 8/1999
JP 2001-144298 A 5/2001
JP 2001-291583 A 10/2001
JP 2002-033331 A 1/2002
JP 2002-055326 A 2/2002
JP 2002-303877 A 10/2002
JP 2002-311424 A 10/2002
JP 2002-343578 A 11/2002
JP 2003-005203 A 1/2003
JP 2003-050405 A 2/2003
JP 2003-108034 A 4/2003
JP 2003-295207 A 10/2003
JP 2004-145300 A 5/2004
JP 2004-341465 A 12/2004
JP 2005-004193 A 1/2005
JP 2005-338653 A 12/2005
JP 2006-165529 A 6/2006
JP 2006332031 A * 12/2006
JP 2006350312 A * 12/2006
JP 2007-053286 A 3/2007
JP 2007-095685 A 4/2007
JP 2007-149922 A 6/2007
JP 2007-157871 A 6/2007
JP 2007-310334 A 11/2007
JP 2008-033296 A 2/2008
JP 2008-066385 A 3/2008
JP 2008-084655 A 4/2008
JP 2009-075613 A 4/2009
JP 2009-128907 A 6/2009
JP 2009-175563 A 8/2009
JP 2010-040552 A 2/2010
JP 2010-050165 A 3/2010
JP 2010-102217 A 5/2010
JP 2010-153842 A 7/2010
JP 2010-206187 A 9/2010
JP 2010-232645 A 10/2010
JP 2010-232651 A 10/2010
JP 2010-232652 A 10/2010
JP 2010-251731 A 11/2010
JP 2010-283338 A 12/2010
JP 2011-014347 A 1/2011
JP 2011-049550 A 3/2011
JP 2011-128442 A 6/2011
JP 2011-146694 A 7/2011
JP 2011-199273 A 10/2011
JP 2011-223004 A 11/2011
JP 2011-258940 A 12/2011
JP 2012-059860 A 3/2012
JP 2012-146764 A 8/2012
JP 2012-151461 A 8/2012
JP 2012-191131 A 10/2012
JP 2013-068949 A 4/2013
JP 2013088657 A 5/2013
JP 2014-505324 A 2/2014
JP 2014-154382 A 8/2014
JP 2014-218706 A 11/2014
JP 2015-124117 A 7/2015
JP 2015-143396 A 8/2015
JP 2015-179822 A 10/2015
JP 2015-228515 A 12/2015
JP 2016-181695 A 10/2016
JP 2016-213052 A 12/2016
JP 2016-219801 A 12/2016
JP 2017-005064 A 1/2017
JP 2017-028288 A 2/2017
JP 2017-057288 A 3/2017
JP 2017-076789 A 4/2017
JP 2017-084868 A 5/2017
JP 2017-116622 A 6/2017
JP 2017-168860 A 9/2017
JP 2017-537350 A 12/2017
JP 2018-055123 A 4/2018
JP 2018-098364 A 6/2018
JP 2018-133144 A 8/2018
JP 2018-206822 A 12/2018
JP 2019-016659 A 1/2019
JP 2019-149561 A 9/2019
JP 2020-035942 A 3/2020
KR 20030044888 A * 6/2003 ............. H10H 29/10
KR 10-2006-0003633 A 1/2006
KR 20090031147 A * 3/2009 ....... H10K 59/80524
KR 10-2011-0015373 A 2/2011
KR 10-2011-0041139 A 4/2011
KR 10-2013-0037569 A 4/2013
KR 10-2014-0081662 A 7/2014
KR 10-2016-0120394 A 10/2016
KR 10-2017-0021903 A 2/2017
TW 201545360 A 12/2015
TW 201630181 A 8/2016
TW 201639213 A 11/2016
TW 201714313 A 4/2017
WO 2005/071764 A1 8/2005
WO 2006/098420 A1 9/2006
WO 2007/043697 A1 4/2007
WO 2007/043704 A1 4/2007
WO 2011/027702 A1 3/2011
WO 2015/098458 A1 7/2015
WO 2016/043234 A1 3/2016
WO 2016/195039 A1 12/2016
WO 2017/085591 A1 5/2017
WO 2019/043510 A1 3/2019

(56) References Cited

FOREIGN PATENT DOCUMENTS

WO WO-2020226045 A1 * 11/2020 ............ H10D 30/67
WO WO-2021261493 A1 * 12/2021 ............ H10K 71/40

OTHER PUBLICATIONS

European Office Action issued in European Patent Application No. 19186679.7 dated Jan. 24, 2024.
Japanese Notice of Allowance issued in Japanese Patent Application No. 2023-035885 dated May 28, 2024.
Office Action issued on Dec. 31, 2024 for U.S. Appl. No. 18/678,553.
Office Action issued on Feb. 6, 2025 for U.S. Appl. No. 17/554,074.
Office Action issued on Oct. 18, 2024 for Korean application No. 10-2022-7042390.
Extended European Search Report issued for European application No. 24191215.3 on Oct. 18, 2024.
Notice of Allowance issued on Oct. 18, 2024 for Chinese application No. 201910651062.1.
Japanese Notice of Allowance issued in Japanese Patent Application No. 2022-190674 dated Aug. 29, 2023.
Extended European search report issued in European Patent Application No. 21827868.7 dated Sep. 5, 2023.
Hee Yeon Kim et al, "Transparent InP Quantum Dot Light-Emitting Diodes with ZrO2 Electron Transport Layer and Indium Zinc Oxide Top Electrode", Advanced Functional Materials, Wiley-Vch Verlag Gmbh & Co. KGAA, DE, vol. 26, No. 20, Apr. 6, 2016, pp. 3454-3461, XP072413443.
Japanese Office Action issued in Japanese Patent Application No. 2020-018120 dated Sep. 5, 2023.
US Notice of Allowance issued in U.S. Appl. No. 18/190,208 dated Oct. 25, 2023.
Chinese Office Action issued in Chinese Patent Application No. 202110157696.9 dated Aug. 2, 2025 (Partial English machine translation).
Japanese Office Action issued in Japanese Patent Application No. 2022-532499 dated Jul. 4, 2023.
Chinese Notice of Allowance issued in Chinese Patent Application No. 201910900911.2 dated Jun. 6, 2025.
Chinese Office Action issued in Chinese Patent Application No. 202180044882.X dated Jun. 12, 2025.
Chinese Office Action issued in Chinese Patent Application No. 201911056626.3 dated Mar. 12, 2024.
Office Action issued on Jun. 11, 2024 for Chinese application No. 201910651062.1.
US Office Action issued in U.S. Appl. No. 18/299,101 dated Nov. 9, 2023.
Japanese Office Action issued in Japanese Patent Application No. 2023-035885 dated Nov. 21, 2023.
Extended European Search Report issued for European application No. 23191776.6 dated Nov. 28, 2023.
Woo Jae Jang et al., "Low Resistive High-Work-Function Gate Electrode for Transparent a-IGZO TFTs", IEEE Transactions On Electron Devices, IEEE, USA, vol. 64, No. 1, Jan. 1, 2017, pp. 164-169, XP011637544 ISSN: 0018-9383, DOI:10.1109/TED.2016.2631567 [retrieved on Dec. 26, 2016].
US Office Action issued in U.S. Appl. No. 17/554,074 dated Aug. 28, 2024.
Chinese Office Action issued in Chinese Patent Application No. 201910900911.2 dated Sep. 14, 2024.
European Office Action issued in European Patent Application No. 19186679.7 dated Sep. 27, 2024.
Japanese Office Action issued in Japanese Patent Application No. 2024-020841 dated Nov. 19, 2024.
Chinese Office Action issued in Chinese Patent Application No. 202180044882.X dated Dec. 26, 2024.
Notice of Allowance issued on Jul. 29, 2024 for Chinese application No. 201911056626.3.
Taiwanese Office Action issued in Taiwanese Patent Application No. 112116069 dated May 29, 2023.
Partial Search Report issued on Oct. 2, 2018 for EP application No. 18173345.2.
Extended European Search Report issued on Jan. 14, 2019 for EP application No. 18173345.2.
Extended European Search Report issued on Feb. 14, 2020 for EP application No. 19199145.4.
Extended European Search Report issued on Feb. 11, 2020 for EP application No. 19186679.7.
Hosono et al., "Transparent Amorphous Oxide Semiconductors for Organic Electronics: Application to Inverted OLEDs", PNAS Early Edition, Oct. 17, 2016, pp. 1-6.
U.S. Office action for U.S. Appl. No. 16/206,744 dated Mar. 5, 2020.
Extended European Search Report issued on May 29, 2020 for EP No. 19213814.7.
Notice of Allowance mailed on Sep. 30, 2020 for the corresponding U.S. Appl. No. 16/678,229.
Office Action issued on Oct. 14, 2020 for the corresponding U.S. Appl. No. 16/206,744.
Notice of Allowance mailed on Jan. 19, 2021 for the corresponding to Japanese application No. 2017-107278.
US Office Action issued in U.S. Appl. No. 16/860,160 dated Mar. 3, 2021.
US Office Action issued in U.S. Appl. No. 16/206,744 dated Apr. 23, 2021.
US Office Action issued in U.S. Appl. No. 16/577,044 dated Jun. 24, 2021.
Extended European search report issued in European Patent Application No. 21154269.1 dated Jul. 15, 2021.
Extended European search report issued in European Patent Application No. 22161095.9 dated May 9, 2022.
US Office Action issued in U.S. Appl. No. 17/163,939 dated Jun. 7, 2022.
Japanese Office Action issued in Japanese Patent Application No. 2019-029934 dated Aug. 2, 2022.
Japanese Office Action issued in Japanese Patent Application No. 2018-162568 dated Aug. 23, 2022.
Gyujeong Lee et al, "Vertical organic light-emitting transistor showing a high current on/off ratio through dielectric encapsulation for the effective charge pathway", Journal of Applied Physics, Jan. 12, 2017, vol. 121, pp. 024502-(1-8).
Taiwanese Office Action issued in Taiwanese Patent Application No. 111131731 dated Sep. 1, 2022.
Japanese Office Action issued in Japanese Patent Application No. 2018-180487 dated Sep. 6, 2022.
Notice of Allowance mailed on Nov. 8, 2022 for the corresponding to Korean application No. KR10-2018-0057002.
Notice of Allowance mailed on Nov. 29, 2022 for the corresponding U.S. Appl. No. 17/543,793.
International Search Report issued in Patent Application No. PCT/JP2021/023638 dated Sep. 14, 2021.
Written Opinion issued in Patent Application No. PCT/JP2021/023638 dated Sep. 14, 2021.
Korean Office Action issued in Korean Patent Application No. 10-2023-0014691 dated Sep. 27, 2023.
Chinese Office Action issued in Chinese Patent Application No. 201810479338.8 dated Apr. 1, 2023.
Office Action issued on Mar. 31, 2025 for European Application No. 23191776.6.
Office Action issued on Apr. 7, 2025 for European Application No. 21827868.7.
Notice of Allowance issued on May 20, 2025 for U.S. Appl. No. 17/554,074.
Extended European Search Report issued on Mar. 2, 2023 for EP application No. 22212464.6.
European Office Action issued in European Patent Application No. 24191215.3 dated Jan. 30, 2026.
The Extended European search report issued in European Patent Application No. 25214939.8 dated Feb. 9, 2026.
US Notice of Allowance issued in U.S. Appl. No. 18/806,908 dated Oct. 28, 2025.
Japanese Office Action issued in Japanese Patent Application No. 2025-029725 dated Dec. 2, 2025.

(56) References Cited

OTHER PUBLICATIONS

European Office Action issued in European Patent Application No. 23191776.6 dated Feb. 12, 2026.
Chinese Office Action issued in Chinese Patent Application No. 202110157696.9 dated Feb. 15, 2026.
Chinese Office Action issued in Chinese Patent Application No. 202110157696.9 dated Apr. 24, 2026.
Japanese Office Action issue in Japanese Patent Application No. 2025-029725 dated May 26, 2026.

* cited by examiner

ELECTROLUMINESCENCE ELEMENT AND METHOD OF MANUFACTURING ELECTROLUMINESCENCE ELEMENT

CROSS-REFERENCE TO RELATED APPLICATIONS

This application is a Continuation of International Patent Application No. PCT/JP2021/023638, filed on Jun. 22, 2021, which claims the benefit of priority to Japanese Patent Application No. 2020-107890, filed on Jun. 23, 2020, the entire contents of which are incorporated herein by reference.

FIELD

An embodiment of the present invention relates to an element structure and a material of an electroluminescence element (hereinafter, also referred to as an "EL element") using an electroluminescence material. An embodiment of the invention disclosed herein relates to an inverted structure electroluminescence element using a coating-type inorganic transparent oxide semiconductor material in a layer that transports electrons to a light emitting layer.

BACKGROUND

The EL element has a pair of electrodes called an anode and a cathode and has a structure in which a light emitting layer is arranged between the pair of electrodes. In the case where a potential is applied to the electrode of the EL element, an electron is injected from the cathode into the light emitting layer, and a hole is injected from the anode into the light emitting layer. The electron and hole recombine on a host-molecule of the light emitting layer. The energy emitted thereby excites a light emitting molecule in the light emitting layer, which then returns to the ground state to emit light.

In order for electrons to enter the light emitting layer, it is necessary to overcome an energy barrier created by the difference between the electron affinity of the light emitting layer and the work function of the cathode. In addition, in order for holes to enter the light emitting layer, it is necessary to overcome a barrier created by the difference between the ionization energy of the light emitting layer and the work function of the anode. In order to efficiently emit light, it is necessary to reduce the energy barrier. Therefore, an electron transport layer may be inserted between the cathode and the light emitting layer, and a hole transport layer may be inserted between the anode and the light emitting layer. For example, the electron transport layer may have an electron affinity between the work function of the cathode and the electron affinity of the light emitting layer.

On the other hand, although the basic structure of the EL element is a 2-terminal type element, a 3-terminal type EL element to which a third electrode is added is further disclosed. For example, an organic EL element including an anode, a layer formed of an organic electroluminescence material called a light emitting material layer, a cathode, and an auxiliary electrode arranged with respect to the cathode and the light emitting material layer via an insulating layer is disclosed (see Japanese laid-open patent publication No. 2002-343578). In addition, a light emitting transistor having a structure in which a hole injection layer, a carrier distribution layer, a hole transport layer, and a light emitting layer are stacked from the anode side to the cathode side and an auxiliary electrode is arranged with respect to the anode via an insulating film is disclosed (see international patent publication No. WO2007/043697).

In addition, an organic light emitting transistor element is disclosed that is configured to include an auxiliary electrode, an insulating film arranged on the auxiliary electrode, a first electrode arranged at a predetermined size on the insulating film, a charge injection suppressing layer on the first electrode, a charge injection layer arranged on the insulating film without the first electrode, a light emitting layer arranged on the charge injection suppressing layer and the charge injection layer or on the charge injection layer, and a second electrode arranged on the light emitting layer (see Japanese laid-open patent publication No. 2007-149922 and Japanese laid-open patent publication No. 2007-157871).

Since the electron mobility in the light emitting material layer of the organic EL element disclosed in Japanese laid-open patent publication No. 2002-343578 is low, the amount of electrons injected from the cathode is substantially determined by the potential difference between the anode and the cathode and the bias voltage applied from the auxiliary electrode hardly affects the carrier injection. Since the light emitting material layer has low electron mobility and high resistance, the injection of electrons into the light emitting material layer is concentrated exclusively in the vicinity of the cathode, and the bias voltage applied to the auxiliary electrode does not affect the amount of electron injection.

In the light emitting transistor described in international patent publication No. WO2007/043697, since the auxiliary electrode controls the state of light emission/non-light emission, the amounts of carriers (electrons, holes) of different polarities injected into the light emitting layer cannot be individually controlled independently even by using an external circuit. Furthermore, the light emitting transistor described in Japanese laid-open patent publication No. 2002-343578 cannot control the position of the area where the electron and the hole recombine in the light emitting layer, that is, the light emitting area.

In addition, in the organic light emitting transistor elements described in Japanese laid-open patent publication No. 2007-149922 and Japanese laid-open patent publication No. 2007-157871, since the carrier (electron) mobility of the electron transport layer formed of an organic material is low, there is a problem that a display panel having a large screen and high definition cannot be realized.

There is a problem that the thickness of the electron transport layer cannot be increased because there is no material that has sufficiently high mobility and is transparent. In the case of forming an electron transport layer by a sputtering method or a CVD method, an increase in the size of the substrate is costly, the process is complicated, and the productivity is problematic. In addition, in these methods, there is a problem that processing at high temperature is required.

SUMMARY

A method of manufacturing an electroluminescence element according to an embodiment of the present invention includes forming a first electrode on a substrate, forming a first electron transport layer in contact with the first electrode, forming a first insulating layer having an opening in a region overlapping with the first electrode, forming a second electron transport layer includes metal oxide semiconductor by applying a composition to the opening and removing a solvent after application, forming a light emitting layer overlapping with the second electron transport layer, the light emitting layer containing an electroluminescent material, forming a second electrode in a region overlapping with the light emitting layer.

An electroluminescence element according to an embodiment of the present invention includes a first electrode, a second electrode having a region facing the first electrode, a first insulating layer between the first electrode and the second electrode, an electron transport layer electrically connected to the first electrode, and a light emitting layer containing an electroluminescent material between the electron transport layer and the second electrode, wherein the first insulating layer has an opening, the opening has an overlapping region where the second electrode, the light emitting layer, the electron transport layer, and the first electrode overlap, the electron transport layer has a first electron transport layer in contact with the first electrode layer and a second electron transport layer arranged in the opening and in contact with the first electron transport layer, and a thickness of the second electron transport layer is larger at the edge of the opening than at the center of the opening, the second electron transport layer is in contact with a side surface of the opening and rises along the side surface, and the second electron transport layer is positioned within the opening without exceeding the opening of the first insulating layer.

A display device according to an embodiment of the present invention includes a pixel comprising the electroluminescence element, and a driving transistor connected to the electroluminescence element on a substrate, wherein the driving transistor comprises: an oxide semiconductor layer, a first insulating layer located under the oxide semiconductor layer, a first gate electrode having a region overlapping with the oxide semiconductor layer, the first gate electrode arranged on the substrate side of the oxide semiconductor layer with the first insulating layer interposed therebetween, a second gate electrode having a region overlapping with the oxide semiconductor layer and the first gate electrode, the second gate electrode arranged opposite to the substrate side of the oxide semiconductor layer, and the first electrode is electrically connected to the oxide semiconductor layer

DESCRIPTION OF EMBODIMENTS

Hereinafter, embodiments of the present invention will be described with reference to the drawings and the like. However, the present invention includes many different aspects, and should not be construed as being limited to the embodiments exemplified below. In order to make the description clearer, although the drawings attached to the present specification may be schematically represented with respect to the width, thickness, shape, and the like of each part as compared with the actual embodiment, they are merely examples and does not necessarily limit the contents of the present invention. In addition, in the present invention, when a specific element described in a certain drawing and a specific element described in another drawing have the same or corresponding relationship, the same symbols (or symbols denoted as symbols followed by a, b, and the like) are given, and repeated description may be omitted as appropriate. Further, the letters “first” and “second” with respect to each element are convenient signs used to distinguish each element, and do not have any further meaning unless otherwise specified.

In the present specification, in the case where a member or area is referred to as being “above (or below)” another member or area, this includes not only the case where it is directly above (or below) another member or area but also the case where it is above (or below) another member or area. That is, it includes the case of including another component between a certain member or area above (or below) another member or area.

First Embodiment

1. Structure of EL Element

A structure of an EL element is classified into a bottom-emission type in which light is emitted through a substrate and a top-emission type in which light is emitted to a side opposite to the substrate. In addition, the structure of an EL element is classified into a stacked structure in which an anode, a hole transport layer, a light emitting layer, an electron transport layer, and a cathode are stacked in this order from the substrate side, and an inverted stacked structure in the reverse order, based on the stacking order in the manufacturing process. The EL element according to the present embodiment is classified into the inverted stacked structure and can be applied to both the bottom-emission type and the top-emission type.

1-1. Bottom-Emission Type EL Element

Figure 1:
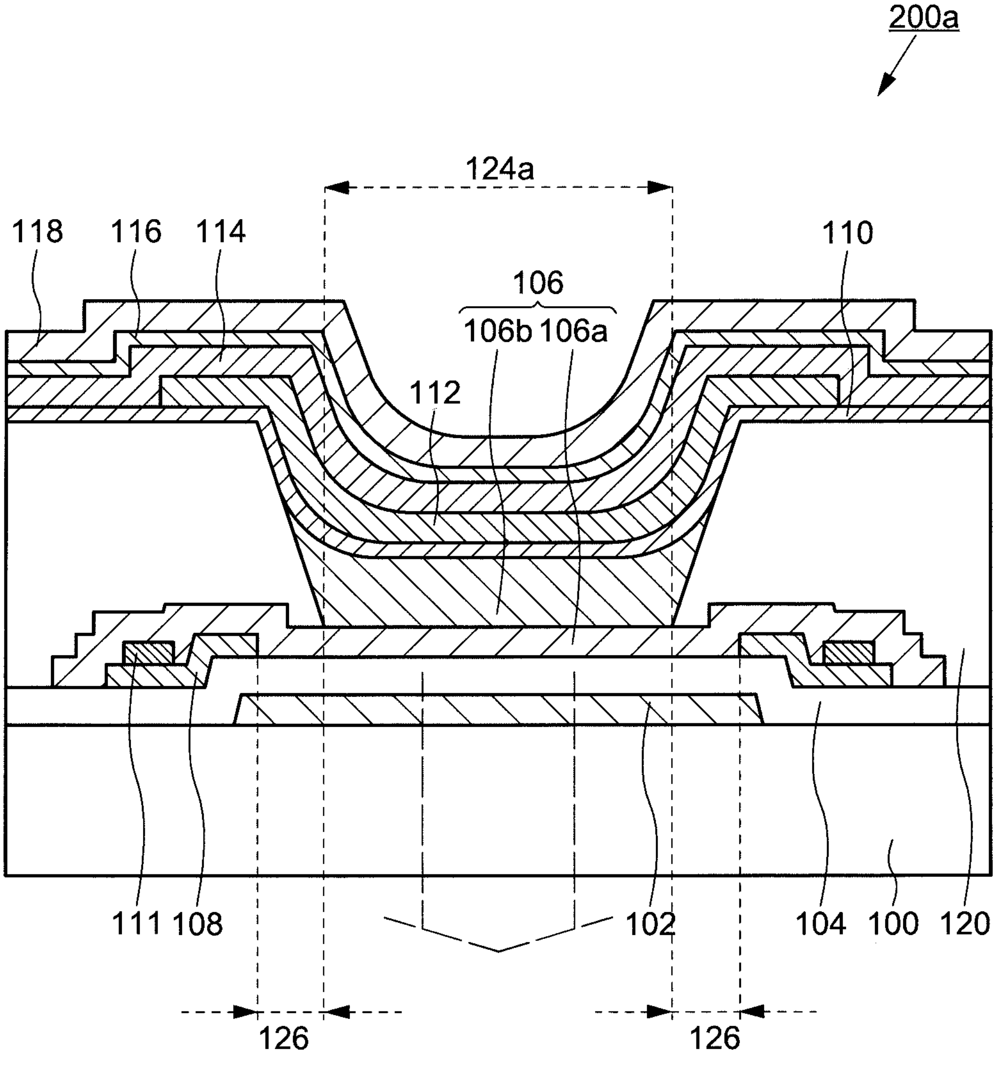
FIG. 1 is a cross-sectional view showing a structure of an EL element according to an embodiment of the present invention.

FIG. 1 shows a cross-sectional structure of an EL element 200*a* according to an embodiment of the present invention. The EL element 200*a* shown in FIG. 1 is the bottom-emission type and has the inverted stacked structure. That is, the EL element 200*a* has a structure in which a first electrode 102, a first insulating layer 104, an electron transport layer 106 (a first electron transport layer 106*a*, a second electron transport layer 106*b*), a light emitting layer 112, and a third electrode 118 are stacked from a substrate 100 side.

FIG. 1 further shows a configuration in which a hole transport layer 114 and a hole injection layer 116 are arranged between the light emitting layer 112 and the third electrode 118. In the EL element 200*a*, one of the hole injection layer 116 and the hole transport layer 114 may be omitted or may be replaced with a hole injection transport layer having both functions of hole injection and hole transport. Although not shown in FIG. 1, a hole-blocking layer may be arranged between an electron injection layer 110 and the light emitting layer 112, or an electron blocking layer may be arranged between the light emitting layer 112 and the hole transport layer 114.

In the EL element 200*a* shown in FIG. 1, the first electrode 102, the first insulating layer 104, the electron transport layer 106 (the first electron transport layer 106*a*, the second electron transport layer 106*b*), the electron injection layer 110, the light emitting layer 112, and the third electrode 118 are arranged overlapping in longitudinal direction. On the other hand, a second electrode 108 is arranged on the outer side of an area (overlapping area) where these layers overlap, and is arranged so as to be electrically connected to the first electron transport layer 106*a*. That is, the first electron transport layer 106*a* is arranged wider than the first electrode 102. At least a part of an outer end portion of the first electron transport layer 106*a* is arranged outside the first electrode 102. As a result, the first electron transport layer 106*a* includes an area that overlaps with the first electrode 102 via the first insulating layer 104, and further includes an area that does not overlap with the first electrode 102 on the outer side of that area. The second electrode 108 is arranged to be in contact with at least a part of the first electron transport layer 106*a* on the outer side of the overlapping area. For example, the second electrode 108 may be arranged so as to be sandwiched between the first electron transport layer 106*a* and the first insulating layer 104. The second electrode 108 is preferably arranged so as to surround the outer periphery of the first electron transport layer 106*a*. Such an arrangement of the second electrode 108 makes it possible to uniform a length from a center area of the first electron transport layer 106*a* to the second electrode 108 over the entire circumference. However, the EL element 200*a* according to an embodiment of the present invention is not limited to such an arrangement, and the second electrode 108 may be arranged in a part of the area at the peripheral portion of the first electron transport layer 106*a*. Further, a wiring 111 may be arranged in a part of the area in contact with the second electrode 108. The wiring 111 may be arranged to be sandwiched between the second electrode 108 and the first electron transport layer 106*a*.

The contact area can be increased by arranging the upper surface of the second electrode 108 in contact with the first electron transport layer 106*a* of the EL element 200*a*. As a result, a series resistance component of the EL element 200*a* is reduced and the drive voltage can be lowered. In addition, the current density flowing into the second electrode 108 of the EL element 200*a* may be reduced. Further, since the second electrode 108 is formed first, the second electrode 108 can be contacted with in an area with few surface defects of the first electron transport layer 106*a* of the EL element 200*a*.

In FIG. 1, the third electrode 118 has a function of injecting a hole into the hole injection layer 116 and is an electrode also referred to as an "anode". The second electrode 108 has a function of injecting an electron into the electron transport layer 106 and is an electrode also referred to as a "cathode". The first electrode 102 has a function of controlling the amount of carriers (electrons) injected into the light emitting layer 112 and is also referred to as an "electrode for controlling the amount of carrier injection".

The electron transport layer 106 of the EL element 200*a* is shown with two distinct layers of the first electron transport layer 106*a* and the second electron transport layer 106*b*. Although the electron transport layer 106 will be described later, the first electron transport layer 106*a* and the second electron transport layer 106*b* have a common function of transporting electrons injected from the second electrode 108 to the light emitting layer 112. On the other hand, the first electron transport layer 106*a* in contact with the second electrode 108 and the second electron transport layer 106*b* arranged on a side closer to the light emitting layer 112 have different electron concentrations and electron mobilities. For example, the carrier concentration (electron concentration) of the second electron transport layer 106*b* is preferably relatively lower than the carrier concentration (electron concentration) of the first electron transport layer 106*a* in order to prevent the deactivation of exciton of the light emitting layer. Further, the thickness of the second electron transport layer 106*b* is preferably thicker than the thickness of the first electron transport layer 106*a*.

Also, the first electron transport layer 106*a* and the second electron transport layer 106*b* may be regarded as a single layer because of a common function of transporting electrons injected from the second electrode 108 to the light emitting layer 112.

The EL element 200*a* includes a second insulating layer 120 arranged between the first electron transport layer 106*a* and the electron injection layer 110. The second insulating layer 120 has an opening 124 that covers the periphery and exposes the upper surface of the first electron transport layer 106*a*. A second electron transport layer 106*b* is arranged in the opening 124 of the second insulating layer 120. An area where the second electron transport layer 106*b* is arranged is smaller than an area where the first electron transport layer 106*a* is arranged. The first electron transport layer 106*a* and the second electron transport layer 106*b* are contacted with each other at the opening 124 of the second insulating layer 120. The first electron transport layer 106*a*, the second electron transport layer 106*b*, the electron injection layer 110, the light emitting layer 112, and the third electrode 118 are stacked in an area 124*a* where the opening 124 is arranged. An area where these layers are stacked becomes the light emitting area of the EL element 200*a*. In other words, the opening 124 of the second insulating layer 120 defines the light emitting area of the EL element 200*a*.

The second electron transport layer 106*b* is arranged in the opening 124 of the second insulating layer 120. The thickness of the second electron transport layer 106*b* is smaller than the thickness of the second insulating layer 120. That is, the upper surface of the second electron transport layer 106*b* (the surface opposite to the substrate 100) is lower (the substrate 100 side) than the upper surface (the surface opposite to the substrate 100) of the second insulating layer 120. The second electron transport layer 106*b* has a concave surface shape in which the thickness at the center portion is smaller than that at the end portion of the opening 124. In this case, the thickness of the second electron transport layer 106*b* indicates a distance from the bottom of the opening 124 in the stacking direction (the direction perpendicular to the upper surface of the substrate 100). The concave surface shape of the second electron transport layer 106*b* is arranged inside the opening 124 of the second insulating layer 120. Although the concave surface shape of the upper surface of the second electron transport layer 106*b* is not particularly limited, the concave surface shape of the second insulating layer 120 is preferably a contiguous concave surface shape and is rounded in the vicinity of the side wall. The upper surface of the second electron transport layer 106*b* has less unevenness and can be formed flatter than in the other film deposition methods. In order to prevent deactivation of the exciton of the light emitting layer, the thickness of the second electron transport layer 106*b* needs to be 150 nm or more. Preferably, the film is formed to have a thickness of 200 nm or more.

Configuring the second electron transport layer 106*b* in this manner makes it possible to increase the adhesion area between the second electron transport layer 106*b* and the second insulating layer 120, and the adhesion is improved. In addition, since the thickness of the second electron transport layer 106*b* at the end portion is thicker than that of the central portion, the electric field can be suppressed from concentrating at the end portion of the third electrode 118 and the second electrode 108, so that the withstand voltage can be improved, and the light emission can be prevented from concentrating at the peripheral part of the area 124*a* where the opening 124 is arranged, thereby prolonging the light emission lifetime of the element.

In addition, a side surface of the second insulating layer 120 in the opening 124 is preferred to be inclined so as to open upward. Such a cross-sectional shape of the opening 124 can reduce the steepness of a step. As a result, in the case where the light emitting layer 112, the third electrode 118, and the like are arranged overlapped with the opening 124, each layer can be formed along the stepped portion. In other words, it is possible to prevent cracks in the light emitting layer 112, the third-electrode 118, and the like, and so-called step breakage can be prevented.

The second electrode 108 is sandwiched between the first insulating layer 104 and the second insulating layer 120. The second electrode 108 is arranged at a position not exposed from the opening 124 by being sandwiched between the first insulating layer 104 and the second insulating layer 120. The second electrode 108 is arranged so as to overlap with the third electrode 118 across the insulating layer. Since the end portion of the second electrode 108 is not exposed to the opening 124 of the second insulating layer 120, it is configured so that an electric field concentration does not occur between the third electrode 118 and the second electrode 108 in the light emitting area. In the EL element 200*a*, an offset area 126 is arranged so that the second electrode 108 is not exposed to the opening 124 of the second insulating layer 120. The offset area 126 is an area from the end portion of the opening 124 to the end portion of the second electrode 108, and corresponds to an area where the first electron transport layer 106*a* is sandwiched between the first insulating layer 104 and the second insulating layer 120. For the purpose of preventing electric field concentration, in the case where the total thickness of the electron transport layer 106, the electron injection layer 110, the light emitting layer 112, the hole transport layer 114, the hole injection layer 116, and the like is 100 nm to 1000 nm, the length of the offset area 126 (the direction in which carriers (electrons) flow) is preferably about 1 μm to 20 μm, for example, about 2 μm to 10 μm, as the length of 10 times the total thickness or more.

As described above, the second electrode 108 is sandwiched between the first insulating layer 104 and the second insulating layer 120, and the end portion of the second electrode 108 is arranged outside the area 124*a* where the opening 124 of the second insulating layer 120 is arranged, so that the withstand voltage of the EL element 200*a* according to the present embodiment can be increased and the uniformity of the emission intensity in the light emitting area can be increased. Arranging the second insulating layer 120 makes it possible to increase the distance between the third electrode 118 and the second electrode 108 and reduce the parasitic capacitance.

The first electrode 102 is arranged so as to overlap with the area where the opening 124 of the second insulating layer 120 is arranged and is arranged so as to overlap with the first electron transport layer 106*a* via the first insulating layer 104. The first electrode 102 is insulated from the first electron transport layer 106*a* by the first insulating layer 104. Although there is no transfer of carriers between the first electrode 102 and the first electron transport layer 106*a*, the first electron transport layer 106*a* is affected by an electric field generated by the application of a voltage to the first electrode 102.

The first electron transport layer 106*a* is subjected to an electric field formed by the first electrode 102. The amount of carriers (electrons) transported from the electron transport layer 106 (the first electron transport layer 106*a* and the second electron transport layer 106*b*) to the light emitting layer 112 can be controlled by the electric field strength of the first electrode 102. When the voltage applied to the first electrode 102 increases, the electric field acting on the electron transport layer 106 (the first electron transport layer 106*a* and the second electron transport layer 106*b*) also increases. Since the electric field generated by applying a positive voltage to the first electrode 102 acts to draw carriers (electrons) from the second electrode 108 to the first electron transport layer 106*a*, the amount of carriers (electrons) transported to the light emitting layer 112 can be increased. That is, the amount of carriers (electrons) transported from the first electron transport layers 106*a* to the light emitting layer 112 can be controlled by the magnitude of the voltage applied to the first electrode 102. In other words, the balance (carrier balance) between the amount of electrons injected from the second electrode 108 and the amount of holes injected from the third electrode 118 can be adjusted by controlling the voltage applied to the first electrode 102.

The first electrode 102 is preferably arranged so as to overlap with the offset area 126 of the first electron transport layer 106*a*. Such an arrangement allows the first electrode 102 to apply an electric field to the offset area 126. When a positive voltage is applied to the first electrode 102, carriers (electrons) are induced in the first electron transport layer 106*a* forming the offset area 126, thereby preventing the offset area 126 from becoming high in resistance. In the case where the length of the offset area 126 is about 2 μm to 10 μm, electrons can be prevented from flowing from the second electrode 108 to the first electron transport layer 106*a* when the first electrode 102 is connected to the earth potential. This is because the offset area 126 operates as a thin film transistor (Thin Film Transistor: TFT) having the first electrode 102 as a bottom gate.

Since the EL element 200*a* shown in FIG. 1 is of the bottom-emission type, the first electrode 102 has light transmittance. For example, the first electrode 102 may be formed of a transparent conductive film. On the other hand, the third electrode 118 has a light-reflecting surface for reflecting light emitted from the light emitting layer 112. The third electrode 118 is preferably formed of a material having a large work function for injecting a hole into the hole injection layer 116. For example, the third electrode 118 is formed of a transparent conductive film such as indium-tin-oxide (ITO). For example, the light-reflecting surface of the third electrode 118 can be formed by stacking a metal film such as an aluminum alloy on a transparent conductive film.

As will be described later, the electron transport layer 106 (the first electron transport layer 106*a* and the second electron transport layer 106*b*) is formed of an oxide semiconductor having light transmittance. The oxide semiconductor having light transmittance is an inorganic material and is thermally stable because it is an oxide. In the EL element 200*a*, stable light emission without degradation of properties can be realized even in the inverted stacked structure by forming the electron transport layer 106 with an oxide semiconductor.

1-2. Top-Emission Type EL Element

Figure 2:
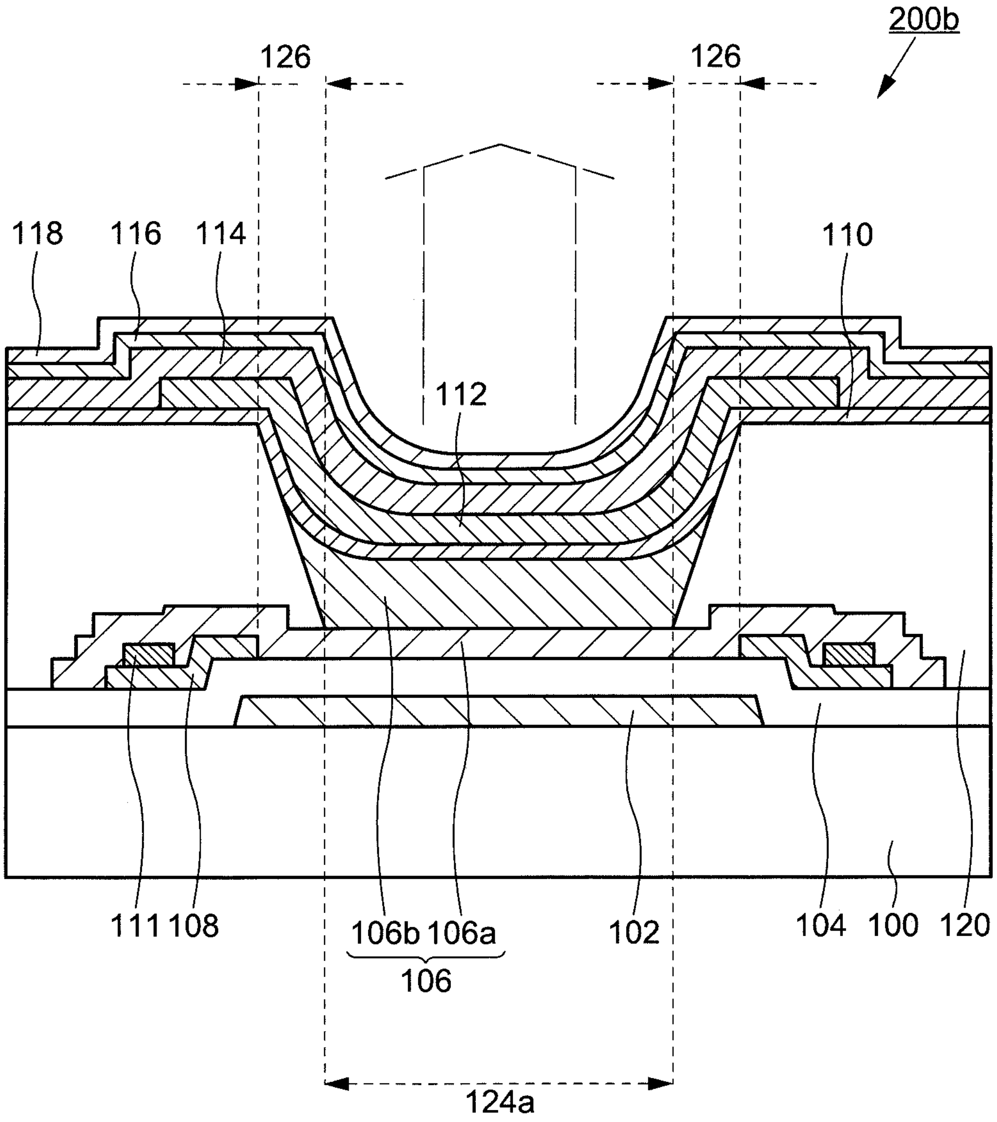
FIG. 2 is a cross-sectional view showing a structure of an EL element according to an embodiment of the present invention.

FIG. 2 shows a top-emission type EL element 200*b*. The top-emission type EL element 200*b* has the same structure as the bottom-emission type EL element 200*a* shown in FIG. 1 except that the configurations of the third electrode 118 and the first electrode 102 are different. In the case where the EL element 200*b* is of the top-emission type, the first electrode 102 is formed of a metal film so as to form a light-reflecting surface, and the third electrode 118 is formed of a transparent conductive film so as to transmit light emitted from the light emitting layer 112. Since the second electrode 108 is arranged on the outer side of the light emitting area, there is no need to change the structure and the constituent material. Although not shown in this diagram, a silicon nitride film ($Si_3N_4$ film), a silicon oxide film ($SiO_2$ film), an aluminum oxide film ($Al_2O_3$ film), or the like, which is formed by a plasma CVD (Chemical Vapor Deposition) method or a sputtering method as a thin film sealing layer, is usually formed on the upper layer of the third electrode 118.

Since the first electrode 102 is formed of a metal film, it functions as a light-reflecting plate in the EL element 200*b*. Since the electron transport layer 106 (the first electron transport layer 106*a* and the second electron transport layer 106*b*) is formed of an oxide semiconductor film having light transmittance, the attenuation of light reflected by the first electrode 102 can be prevented, and light extraction efficiency (external quantum efficiency) can be increase.

In the top-emission type EL element 200*b*, the configurations of the third electrode 118 and the first electrode 102 are different from that of the bottom-emission type EL element 200*a*. That is, the EL element according to the present embodiment can realize both the bottom-emission type and the top emission type with a slight change while sharing the inverted stacked type.

In the bottom-emission type EL element 200*a* shown in FIG. 1 and the top-emission type EL element 200*b* shown in FIG. 2 have a structure in which the electron transport layer 106, the electron injection layer 110, the light emitting layer 112, and the third electrode 118 are stacked at least in the longitudinal direction, and the first electrode 102 is arranged so as to be close to the electron transport layer 106 with the first insulating layer 104 interposed therebetween, and the second electrode 108 is arranged on the outer periphery area of the area 124*a* where the opening 124 is arranged. In the EL element 200, the potential of the first electrode 102 is controlled independently of the third electrode 118 and the second electrode 108, so that the amount of carriers (electrons) transported from the electron transport layer 106 to the light emitting layer 112 can be controlled. The EL element 200 can realize both the bottom-emission type and the top emission type by appropriately selecting the materials of the first electrode 102 and the third electrode 118.

2. Components of EL Element 2-1. First Electrode (Electrode for Controlling the Amount of Carrier Injection)

The first electrode 102 is formed using a metal material, a metal oxide material, a metal nitride material, or a metal oxynitride material having conductivity. The metal material is formed of a metal material such as aluminum (Al), silver (Ag), titanium (Ti), molybdenum (Mo), or tantalum (Ta), or an alloy material or a stacked metal using these metals. For example, indium tin oxide ($In_2O_3 \cdot SnO_2$: ITO), indium zinc oxide ($In_2O_3 \cdot ZnO$: IZO), tin oxide ($SnO_2$), and zinc oxide (ZnO) can be used as the metal oxide materials. In addition, titanium oxide ($TiO_x$: Nb) doped with niobium (Nb) or the like can be used as the metal oxide material. Titanium-nitride ($TiN_x$), zirconium-nitride ($ZrN_x$), or the like can be used as the metal nitride material. Titanium oxynitride ($TiO_xN_y$), tantalum oxynitride ($TaO_xN_y$), zirconium oxynitride ($ZrO_xN_y$), hafnium oxynitride ($HfO_xN_y$), or the like can be used as the metal-oxynitride material. A trace amount of metal elements that improve conductivity may be added to the metal oxide material, the metal nitride material, and the metal oxynitride material. For example, titanium oxide ($TiO_x$: Ta) doped with tantalum (Ta) may be used.

The material for forming the first electrode 102 may be appropriately selected depending on whether the EL element 200 is the top-emission type or bottom-emission type. In the case of the bottom-emission type, the first electrode 102 is formed of a metal oxide material, a metal nitride material, or a metal oxynitride material having conductivity and having light transmittance. As a result, the EL element 200*a* can emit the light emitted from the light emitting layer 112 through the first electrode 102. On the other hand, in the case of the top emission type, the first electrode 102 is formed of a metal material having high reflectance to visible light. In the EL element 200*b*, the first electrode 102 is formed of a metal material, so that the light emitted from the light emitting layer 112 can be reflected and emitted from the third electrode 118.

2-2. First Insulating Layer

The first insulating layer 104 is formed using an inorganic insulating material. Silicon oxide, silicon nitride, silicon oxynitride, aluminum oxide, or the like can be selected as the inorganic insulating material. The first insulating layer 104 is formed by a plasma CVD (Chemical Vapor Deposition) method, a sputtering method, or the like. The first insulating layer 104 is formed with a thickness of 50 nm to 900 nm, preferably 100 nm to 600 nm. Setting the thickness of the first insulating layer 104 within the above range makes it possible to apply the electric field generated by the first electrode 102 to the electron transport layer 106, and even when the bias voltage increases, it is possible to prevent a tunneling current from flowing from the first electrode 102 to the electron transport layer 106 due to the tunneling effect.

The first insulating layer 104 may have both insulating properties and transparency by using such an insulating material. As a result, the first insulating layer 104 can be applied to both the bottom-emission type EL element 200*a* and the top-emission type EL element 200*b*. In addition, the first electrode 102 and the electron transport layer 106 may be insulated from each other and the first electrode 102 and the second electrode 108 may be insulated from each other.

2-3. Second Insulating Layer

In the present embodiment, the second insulating layer 120 is formed of a polar organic insulating material. For example, a straight-chain fluorine organic material may be used as the second insulating layer 120. For example, a fluoroalkylsilane (FAS)-based material is used as the straight-chain fluorine organic material. For example, H, 1H, 2H, 2H-perfluorodecyltrichlorosilane (FDTS), tridecafluoro-1,1,2,2-tetrahydrooctyltrichlorosilane (FOTS), and the like are used as the fluoroalkylsilane (FAS)-based material.

In addition, for example, the second insulating layer 120 may include a fluorine liquid repellent in a photosensitive resin material. Positive-type photosensitive resin compositions and negative-type photosensitive resin compositions containing a straight-chain fluorine organic material as the main component are already commercially available, and it is possible to adjust the liquid repellent performance by mixing an appropriate amount of fluorine liquid repellent with these photosensitive resin compositions.

Since the second insulating layer 120 is formed using a straight-chain fluorine organic material, a high liquid-repellent surface with poor wettability is formed. In other words, negative charges appear on the upper surface of the second insulating layer 120 by the microphase-separation phenomenon by forming the second insulating layer 120 containing a bipolar molecule or a side chain. As will be described later, the opening 124 exposing the first electron transport layer 106*a* is formed on the second insulating layer 120, and then the second electron transport layer 106*b* is formed in the opening 124 of the second insulating layer 120. The side surface of the second insulating layer 120 in the opening 124 has high wettability and high lyophilic. The second electron transport layer 106*b* can be efficiently arranged in the opening 124 of the second insulating layer 120 by utilizing the liquid repellency of the upper surface and the lyophilic of the side surface of the opening of the second insulating layer 120.

In addition, an organic insulating material such as polyimide, acryl, or epoxy may be used for the second insulating layer 120. In this case, the liquid repellency of the upper surface of the second insulating layer 120 may be improved by, for example, a fluorine plasma treatment.

On the other hand, forming the second insulating layer 120 with an organic insulating material makes it easy to control the cross-sectional shape of the opening 124. The opening 124 of the second insulating layer 120 is preferably tapered, and the cross-sectional shape of the opening 124 can be tapered by using a photosensitive organic insulating material. The thickness of the second insulating layer 120 is not particularly limited and may be, for example, 200 nm to 5000 nm. In the case of imparting the second insulating layer 120 of a function as a flattening film, the thickness is preferred to be about 2 μm to 5 μm.

2-4. Electron Transport Layer

The electron transport layer 106 is preferably formed of a material having high electron mobility in order to transport carriers (electrons) injected from the second electrode 108 into the surface of the light emitting area of the EL element 200. In addition, in the case of the bottom-emission type, the electron transport layer 106 is preferably formed of a material having good visible light transmittance because it is arranged closer to the light emission side than the light emitting layer. In addition, in order to make the carrier concentration different between the first electron transport layer 106*a* and the second electron transport layer 106*b*, the electron transport layer 106 is preferably formed of a material easy to control the carrier concentration.

In the present embodiment, a metal oxide material is used for the electron transport layer 106 (the first electron transport layer 106*a* and the second electron transport layer 106*b*). An oxide semiconductor material having a bandgap of 2.8 eV or more, preferably 3.0 eV or more, and high electron mobility is preferably used as the metal oxide material. Even when a thin film is formed, such an oxide semiconductor material has semiconducting properties, transparent to visible light, and has n-type electrical conductivity.

A quaternary oxide material, a ternary oxide material, a binary oxide material, and a unitary oxide material are exemplified as the oxide semiconductor material applied to the electron transport layer 106. The metal oxide material exemplified here is classified as the oxide semiconductor because the bandgap is 2.8 eV or more, exhibits n-type conductivity, and the donor concentration can be controlled by oxygen-deficiency or the like.

The quaternary oxide material includes $In_2O_3$—$Ga_2O_3$—$SnO_2$—ZnO-based oxide material, the ternary oxide material includes $In_2O_3$—$Ga_2O_3$—ZnO-based oxide material, $In_2O_3$—$SnO_2$—ZnO-based oxide material, $In_2O_3$—$Ga_2O_3$—$SnO_2$-based oxide material, $In_2O_3$—$Ga_2O_3$—$SmO_x$-based oxide material, $In_2O_3$—$Al_2O_3$—ZnO-based oxide material, $Ga_2O_3$—$SnO_2$—ZnO-based oxide material, $Ga_2O_3$—$Al_2O_3$—ZnO-based oxide material, and $SnO_2$—$Al_2O_3$—ZnO-based oxide material, the binary oxide material includes $In_2O_3$—ZnO-based oxide material, $In_2O_3$—$Ga_2O_3$-based oxide material, $In_2O_3$—$WO_3$-based oxide material, $In_2O_3$—$SnO_2$-based oxide material, $SnO_2$—ZnO-based oxide material, $Al_2O_3$—ZnO-based oxide material, $Ga_2O_3$—$SnO_2$-based oxide material, $Ga_2O_3$—ZnO-based oxide material, $Ga_2O_3$—MgO-based oxide material, MgO—ZnO-based oxide material, $SnO_2$—MgO-based oxide material, and $In_2O_3$—MgO-based oxide material, and the unitary oxide material includes $In_2O_3$-based metal oxide material, $Ga_2O_3$-based metal oxide material, $SnO_2$-based metal oxide material, and ZnO-based metal oxide material.

In addition, the metal oxide material may contain silicon (Si), nickel (Ni), tungsten (W), hafnium (Hf), titanium (Ti), zirconium (Zr), and tantalum (Ta). For example, the In—Ga—Zn—O-based oxide material described above is a metal oxide material containing at least In and Ga and Zn and the composition ratio is not particularly limited. In other words, a material represented by the chemical formula $InMO_3(ZnO)_m$ (m>0) can be used as the first electron transport layer 106*a* and the second electron transport layer 106*b*. In this case, M represents one or more metal elements selected from Ga, Al, Mg, Ti, Ta, W, Hf, and Si. Also, the quaternary oxide material, the ternary oxide material, the binary oxide material, and the unitary oxide material are not limited to those in which the contained oxide has a stoichiometric composition and may be composed of an oxide material having composition deviated from the stoichiometric composition. In addition, the oxide semiconductor layer as the electron transport layer 106 may have an amorphous phase, may have crystallinity, or may be a mixture of an amorphous phase and a crystalline phase.

The first electron transport layer 106*a* and the second electron transport layer 106*b* are preferably formed using oxide semiconductor materials having different compositions. For example, the first electron transport layer 106*a* is preferably formed of a tin (Sn)-based oxide semiconductor ($InGaSnO_x$, $InWSnO_x$, $InAlSnO_x$, $InSiSnO_x$) with high electron mobility and high PBTS reliability evaluation. The second electron transport layer 106*b* is preferably formed of a zinc (Zn)-based oxide semiconductor ($ZnSiO_x$, $ZnMgO_x$, $ZnALO_x$, ZnIn, $ZnGaO_x$ or the like), which is difficult to crystallize in large particle size and easy to form an amorphous film or a nano-microcrystalline film. In other words, the first electron transport layer 106*a* is preferably a metal oxide containing tin oxide and indium oxide as the main component, and at least one selected from gallium oxide, tungsten oxide, aluminum oxide, and silicon oxide, and the second electron transport layer 106*b* is preferably a metal oxide containing zinc oxide as the main component and at least one selected from silicon oxide, magnesium oxide, indium oxide, aluminum oxide, and gallium oxide. Selecting a material that is less likely to be crystallized in large particle size and easy to form an amorphous film or a nano-microcrystalline film as the second electron transport layer 106*b* makes it possible to flow a space-charge limited current, and an EL element having a long lifetime can be formed.

Selecting the oxide semiconductor materials having different compositions as described above makes it possible to optimize the bandgaps of the first electron transport layer 106*a* and the second electron transport layer 106*b*. For example, the bandgap of the second electron transport layer 106*b* can be increased with respect to the bandgap of the first electron transport layer 106*a*. Specifically, the bandgap of the first electron transport layer 106*a* may be 3.0 eV or more, and the bandgap of the second electron transport layer 106*b* may be equal to or larger than the bandgap of the first electron transport layer 106*a*. The bandgap of the second electron transport layer 106*b* is preferably 3.4 eV or more. Setting the bandgap of the second electron transport layer 106*b* to 3.4 eV or more makes it possible to reduce the absorbance of blue light and improve reliability.

In addition, indium tin oxide ($In_2O_3 \cdot SnO_2$: ITO), indium zinc oxide ($In_2O_3 \cdot ZnO$: IZO), tin oxide ($SnO_2$), titanium oxide ($TiO_x$), or the like is used as the electron transport layer 106 (the first electron transport layer 106*a* and the second electron transport layer 106*b*). Gallium nitride (GaN), aluminum-gallium nitride ($GaAlN_x$), or the like is used as the metal nitride material. Titanium oxynitride ($TiO_xN_y$), tantalum oxynitride ($TaO_xN_y$), zirconium oxynitride ($ZrO_xN_y$), hafnium oxynitride ($HfO_xN_y$), or the like is used as the metal-oxynitride material. A trace amount of metal elements that improves conductivity may be added to the metal oxide material, the metal nitride material, and the metal oxynitride material. For example, titanium oxide doped with niobium ($TiO_x$: Nb) may be used. In order to make the bandgap of these metal compounds at least 2.8 eV or more, the oxygen content or the nitrogen content may be adjusted.

The first electron transport layer 106*a* formed of the oxide semiconductor material can be formed by a sputtering method, a vacuum-deposition method, a coating method or the like. The second electron transport layer 106*b* formed of the oxide semiconductor material can be formed by a coating method. The first electron transport layer 106*a* preferably has a thickness of 10 nm to 70 nm, and the second electron transport layer 106*b* is formed with a thickness of 150 nm to 900 nm. In order to prevent a decrease in withstand voltage and breakdown due to foreign substances and particles, the thickness of the second electron transport layer 106*b* should be as thick as possible.

The carrier concentration of the first electron transport layer 106*a* is preferably 10 times or more, preferably 100 times or more higher than the carrier concentration of the second electron transport layer 106*b*. For example, the carrier concentration (electron concentration) of the first electron transport layer 106*a* is preferably in the range of $10^{14}/cm^3$ to $10^{19}/cm^3$, the carrier concentration (electron concentration) of the second electron transport layer 106*b* is preferably in the range of $10^{11}/cm^3$ to $10^{17}/cm^3$, and the difference between both carrier concentrations is preferably one order of magnitude or more, more preferably two orders of magnitude or more, as described above.

In addition, the electron mobility of the second electron transport layer 106*b* with respect to the electron mobility of the first electron transport layer 106*a* is preferably 1/10 or less. For example, the electron mobility of the first electron transport layer 106*a* is preferably 10 $cm^2/V \cdot sec$ to 200 $cm^2/V \cdot sec$, and the electron mobility of the second electron transport layer 106*b* is preferably 0.001 $cm^2/V \cdot sec$ to 10 $cm^2/V \cdot sec$.

Since the first electron transport layer 106*a* has high carrier concentration and high electron mobility as described above, the resistance can be reduced in a short time when a positive voltage is applied to the first electrode 102. The first electron transport layer 106*a* can uniform the in-plane distribution of electrons injected from the second electrode 108 by having such physical properties. In other words, carriers (electrons) injected from the peripheral part of the first electron transport layer 106*a* can be transported toward the center by the second electrode 108, and it is possible to uniform the electron concentration in the light emitting area. As a result, the in-plane uniformity of the emission intensity of the EL element 200 can be achieved. In addition, using the first electron transport layer 106*a* having high electron mobility makes it possible to transport the carriers (electrons) injected from the second electrode 108 to the area where the electric field of the first electrode 102 acts in a short time.

The second electron transport layer 106*b* is arranged proximate to the light emitting layer 112. Therefore, in the case where the carrier concentration (electron concentration) of the second electron transport layer 106*b* is $10^{20}/cm^3$ or more, the excited state in the light emitting layer 112 is deactivated and the luminous efficiency is lowered. On the other hand, in the case where the carrier concentration (electron concentration) of the second electron transport layer 106*b* is $10^{11}/cm^3$ or less, the carrier supplied to the light emitting layer 112 is reduced, and a satisfactory brightness cannot be obtained. As described above, the emission efficiency of EL element 200 can be increased and the in-plane uniformity of the emission intensity can be achieved by making the carrier concentrations and the electron mobilities of the first electron transport layer 106*a* and the second electron transport layer 106*b* different from each other. The current flowing through the second electron transport layer 106*b* is required to be a space-charge-limited current to obtain uniform emission intensity.

2-5. Second Electrode (Cathode)

Conventionally, materials such as an aluminum-lithium alloy (AlLi) and a magnesium-silver alloy (MgAg) have been used as the cathode material of the EL element. However, these materials are easily deteriorated under the influence of oxygen and moisture in the atmosphere and are difficult to handle. These materials are metals or alkaline metals, and in order to have light transmittance, it is necessary to reduce the thickness of the film to form a semi-transmissive film. However, if the cathode is made to be a thin film, the seat resistance becomes high. Since the resistance of the electrode acts as a series resistance component in the EL element, thinning of the cathode increases the drive voltage and increases the power consumption. Further, it also becomes a cause of non-uniformity of the emission intensity (brightness) in the plane of the light emitting area of the EL element.

In the EL element 200 according to the present embodiment, the second electrode 108 is formed of a metal oxide material, a metal nitride material, or a metal oxynitride material having conductivity. In other words, the second electrode 108 is formed of a low resistance oxide conductor film. For example, the metal oxide conductive material includes indium tin oxide ($In_2O_3 \cdot SnO_2$: ITO), indium tin zinc oxide ($In_2O_3 \cdot SnO_2 \cdot ZnO$: ITZO), indium tin silicon oxide ($In_2O_3 \cdot SnO_2$. $SiO_2$: ITSO), tin oxide ($SnO_2$), aluminum zinc tin oxide ($Al_2O_3 \cdot ZnO \cdot SnO_2$: AZTO), gallium zinc tin oxide ($Ga_2O_3 \cdot ZnO \cdot SnO_2$: GZTO), zinc tin oxide ($ZnO \cdot SnO_2$: ZTO), and gallium tin oxide ($Ga_2O_3 \cdot SnO_2$: GTO). Such a metal oxide material can form a good ohmic contact with the first electron transport layer 106*a*.

In addition, in the second electrode 108, titanium oxide ($TiO_x$: Nb) doped with niobium (Nb) or the like can be applied as the metal oxide material, and titanium nitride ($TiN_x$), zirconium nitride ($ZrN_x$), or the like can be applied as the metal nitride material, and titanium oxynitride ($TiO_xN_y$), tantalum oxynitride ($TaO_xN_y$), zirconium oxynitride ($ZrO_xN_y$), hafnium oxynitride ($HfO_xN_y$), or the like can be applied as the metal oxynitride material. In addition, a trace amount of metal elements that improves conductivity may be added to the metal oxide material, the metal nitride material, and the metal oxynitride material. For example, titanium oxide doped with tantalum ($TiO_x$: Ta) may be used. A refractory metal silicide oxide such as $TiSiO_x$ may be used. Using such a metal oxide material, a metal nitride material, or a metal oxynitride material exhibiting n-type electrical conductivity makes it possible to ensure bonding stability even when the material contacted the wiring 111. That is, using such a metal oxide material, a metal nitride material, or a metal oxynitride material makes it possible to prevent an oxidation-reduction reaction (local battery reaction) with aluminum (Al) having a base potential.

The carrier concentration of the second electrode 108 is preferably $10^{20}/cm^3$ to $10^{21}/cm^3$. Since the second electrode 108 has such a carrier concentration, it is possible to reduce resistance and suppress the series resistance loss. As a result, the power consumption of the EL element 200 can be reduced, and the current efficiency can be improved.

2-6. Electron Injection Layer

In the EL element, an electron injection layer is used to reduce the energy barrier for injecting electrons from the cathode to the electron transport material. In the EL element 200 according to the present embodiment, the electron injection layer 110 is preferably arranged in order to facilitate injection of electrons from the electron transport layer 106 formed of the oxide semiconductor to the light emitting layer 112. The electron injection layer 110 is arranged between the electron transport layer 106 and the light emitting layer 112. As shown in FIG. 1 and FIG. 2, forming the electron injection layer 110 on the entire surface of the display area is important to improve yield and reliability.

The electron injection layer 110 is preferably formed using a material having a small work function in order to inject electrons into the light emitting layer 112 formed including the electroluminescence material. The electron injection layer 110 contains calcium (Ca) oxide and aluminum (Al) oxide. For example, a C12A7 ($12CaO \cdot 7Al_2O_3$) electride is preferably used as the electron injection layer 110. Since the C12A7 electride has semiconducting properties and can be controlled from a high resistance to a low resistance, and has a work function of 2.4 eV to 3.2 eV, which is about the same as an alkali metal, it can be suitably used as the electron injection layer 110.

The electron injection layer 110 formed by the C12A7 electride is formed by a sputtering method using a polycrystal of C12A7 electride as a target. Since the C12A7 electride has semiconducting properties, the thickness of the electron injection layer 110 can be within 1 nm to 10 nm. Also, it is preferred that the molar ratio of Ca:Al of the C12A7 electride is in the range of 13:13 to 11:16. The electron injection layer 110 using the C12A7 electrode can be formed by a sputtering method. The electron injection layer 110 formed of the C12A7 electron is preferably amorphous but may be crystalline.

Since the C12A7 electride is stable in the atmosphere, it is convenient to handle as compared with an alkali metal compound such as lithium fluoride (LiF), lithium oxide ($Li_2O$), sodium chloride (NaCl), and potassium chloride (KCl), which are conventionally used as an electron injection layer. This eliminates the need to operate in dry air or an inert gas in the manufacturing process of the EL element 200 and reduces the limitation of the manufacturing process.

In addition, because of the large ionization potential, the C12A7 electride can be used as a hole-blocking layer by arranging the C12A7 electride on a side opposite to the hole transport layer 114 with the light emitting layer 112 interposed therebetween. That is, arranging the electron injection layer 110 formed of the C12A7 electride between the electron transport layer 106 and the light emitting layer 112 suppresses the holes injected into the light emitting layer 112 penetrating to the second element 108 side, and the luminous efficiency can be increased. In addition, magnesium-zinc oxide ($Mg_xZn_yO$, e.g., $Mg_{0.3}Zn_{0.70}$), $Zn_{0.75}Si_{0.25}O_x$, $LaMgO_x$, $MgSiO_x$, and the like can also be used as an electron injection layer because they have small work function of 3.1 eV and are highly stable in the atmosphere. They can also be used as good electron injection layers as long as the thickness is within 1 nm to 10 nm as in the C12A7. Since the bandgap of $Zn_{0.7}Mg_{0.3}O_x$ or $Zn_{0.75}Si_{0.25}O_x$ is as large as 3.9 eV to 4.1 eV, hole injection from the light emitting layer 112 can be prevented. A ternary metal oxide semiconductor material in which $Zn_{0.7}Mg_{0.3}O_x$ and $Zn_{0.75}Si_{0.25}O_x$ are mixed in the range of 1:4 to 1:10 can also be used as the electron injection layer. Since the electron injection layer is formed by a sputter deposition method, cross-talk with adjacent pixels can be prevented by adjusting the oxygen partial pressure of the mixed gases of Ar and $O_2$ so that the specific resistance is $10^7$ Ω·cm ore more when the thickness is 10 nm.

2-7. Light Emitting Layer

The light emitting layer 112 is formed using an electroluminescence material. For example, a fluorescent compound material that emits fluorescence, a phosphorescent compound material that emits phosphorescence, or a thermally activated delayed fluorescence material (TADF) can be used as the electroluminescence material.

For example, N,N'-bis[4-(9H-carbazol-9-yl)phenyl]-N,N'-diphenylstilbene-4,4'-diamine (YGA2S), 4-(9H-carbazol-9-yl)-4'-(10-phenyl-9-anthryl)triphenylamine (YGAPA), or the like can be used as a blue light emitting material. N-(9,10-diphenyl-2-anthryl) N, 9-diphenyl-9H-carbazole-3-amine (2PCAPA), N-[9,10-bis(1,1'-biphenyl-2-yl)-2-anthryl]-N, 9-diphenyl-9H-carbazole-3-amine (2PCABPhA), N-(9,10-diphenyl-2-anthryl) N,N',N'-triphenyl-1,4-phenylenediamine (2DPAPA), N-[9,10-bis(1,1'-biphenyl-2-yl)-2-anthryl]-N,N',N'-triphenyl-1,4-phenylenediamine (2DPABPhA), N-[9,10-bis(1,1'-biphenyl-2-yl)]-N-[4-(9H-carbazole-9-yl)phenyl]-N-phenylanthracene-2-amine (2YGABPhA), N,N,9-triphenylanthracene-9-amine (DPhAPhA), or the like can be used as a green light emitting material. N,N,N',N'-tetrakis(4-methylphenyl)tetracene-5,11-diamine (p-mPhTD), 7,13-diphenyl-N,N,N',N'-tetrakis(4-methylphenyl) acenaphtho[1,2-a]fluoranthene-3,10-diamine (p-mPhAFD), or the like can be used as a red light emitting material. In addition, a phosphorescent material such as bis[2-(2'-benzo[4,5-α]thienyl)pyridinato-N, C3']iridium(III) acetylacetonate ($Ir(btp)_2(acac)$) can be used.

In addition, various known materials such as Quantum dot (QD), a perovskite-based inorganic light emitting material, and a perovskite-based inorganic-organic hybrid light emitting material can be used as the light emitting layer 112. The light emitting layer 112 can be produced by a vapor deposition method, a transcription method, a spin coating method, a spray coating method, a printing method (ink jet printing method, a gravure printing method), or the like. The thickness of the light emitting layer 112 may be appropriately selected, for example, it is arranged in a range of 10 nm to 100 nm.

In FIG. 1 and FIG. 2, although an example in which the light emitting layer 112 is separated for each EL element is shown, in the case where the plurality of EL elements is arranged on the same plane, the light emitting layer 112 may be arranged so as to be contiguous over a plurality of light emitting elements. Although an electron-blocking layer may be formed on the entire surface between the light emitting layer 112 and the hole transport layer 114, it is omitted in FIG. 1 and FIG. 2.

2-8. Hole Transport Layer

The hole transport layer 114 is formed using a hole transporting material. The hole transport layer 114 may be, for example, an arylamine compound, an amine compound containing a carbazole group, and an amine compound containing a fluorene derivative, or the like. The hole transport layer 114 may be an organic material such as 4,4'-bis[N-(naphthyl)-N-phenyl-amino]biphenyl(α-NPD), N,N'-bis(3-methylphenyl)-(1,1'-biphenyl)-4,4'-diamine (TPD), 2-TNATA, 4',4'4'"-tris(N-(3-methylphenyl)N-phenylamino)triphenylamine (MTDATA), 4,4'-N,N'-dicarbazole biphenyl(CBP), 4,4'-bis[N-(9,9-dimethylfluoren-2-yl)-N-phenylamino]biphenyl(DFLDPBi), 4,4'-bis[N-(spiro-9, 9'-bifluoren-2-yl)-N-phenylamino]biphenyl(BSPB), spiro-NPD, spiro-TPD, spiro-TAD, TNB, and the like.

The hole transport layer 114 is formed by a general film forming method such as a vacuum-deposition method, a coating method or the like. The hole transport layer 114 is manufactured with a thickness of 10 nm to 500 nm.

2-9. Hole Injection Layer

The hole injection layer 116 includes a material with high hole-injection properties with respect to an organic layer. A metal oxide such as molybdenum oxide, vanadium oxide, ruthenium oxide, tungsten oxide, or manganese oxide can be used as the material with high hole-injection properties. In addition, an organic compound such as phthalocyanine ($H_2Pc$), copper (II) phthalocyanine (abbreviation: CuPc), vanadyl phthalocyanine (VOPc), 4,4',4"-tris(N, N-diphenylamino)triphenylamine (TDATA), 4,4',4"-tris[N-(3-methylphenyl)-N-phenylamino]triphenylamine (MTDATA), 4,4'-bis[N-(4-diphenylaminophenyl)-N-phenylamino]biphenyl (DPAB), 4,4'-bis(N-{4-[N'-(3-methylphenyl)-N'-phenylamino]phenyl}-N-phenylamino) biphenyl(DNTPD), 1,3,5-tris[N-(4-diphenylaminophenyl)-N-phenylamino]benzene (DPA3B), 3-[N-(9-phenylcarbazol-3-yl)-N-phenylamino]-9-phenylcarbazole (PCzPCA1), 3,6-bis[N-(9-phenylcarbazol-3-yl)-N-phenylamino]-9-phenylcarbazole (PCzPCA2), 3-[N-(1-naphthyl)-N-(9-phenylcarbazol-3-yl)amino]-9-phenylcarbazole (PCzPCN1), and 2,3,6,7,10,11-hexacyano-1,4,5,8,9,12-hexaazatriphenylene (HAT-CN) and the like can be used.

The hole injection layer 116 is formed by a general film forming method such as a vacuum-deposition method, a coating method or the like. The hole injection layer 116 is manufactured with a thickness of 1 nm to 100 nm.

2-10. Third Electrode (Anode)

The third electrode 118 is made of a metal, an alloy, or a conductive compound having a large work function (specifically, 4.0 eV or more). For example, indium tin oxide (ITO), indium zinc oxide (IZO), tungsten oxide, and indium oxide (IWZO) containing zinc oxide are used as the third electrode 118. The third electrode 118 using these the conductive metal oxide materials is used is manufactured by a vacuum-deposition method or a sputtering method.

As described with reference to FIG. 1, in the case of the bottom-emission type EL element 200*a*, since the third electrode 118 is located back surface of the emission surface, it is preferred to have a light-reflecting surface. In this case, the third electrode 118 is preferably formed by stacking a metal film on a transparent conductive film. On the other hand, as described with reference to FIG. 2, in the top-emission type EL element 200*b*, the third electrode 118 can be formed using a transparent conductive film as described above.

2-11. Wiring

A high conductive metal material such as aluminum (Al) or copper (Cu) is used as the wiring 111. For example, the wiring 111 is made using an aluminum alloy, a copper alloy, or a silver alloy. An aluminum-neodymium alloy (Al—Nd), an aluminum-titanium alloy (Al—Ti), an aluminum-silicon alloy (Al—Si), an aluminum-neodymium-nickel alloy (Al—Nd—Ni), an aluminum-carbon-nickel alloy (Al—C—Ni), a copper-nickel alloy (Cu—Ni), or the like can be used as the aluminum alloy. The wiring resistance can be reduced while having heat resistance by using such a metal material. In addition, a three-layer stacked structure electrode, such as Mo/Al/Mo, Mo/Cu/Mo, is also useful. That is, a three-layer stacked structure in which the above-described metal material is sandwiched by an antioxidant layer containing molybdenum (Mo), zirconium (Zr), titanium (Ti), or an alloy material thereof can also be applied.

3. Operation of EL Element

An operation of the EL element according to the present embodiment will be described with reference to FIG. 3, FIG. 4, and FIG. 5. The EL element 200 shown in this section has a schematic configuration.

3-1. Light Emitting and Non-Light Emitting Operations

Figure 3:
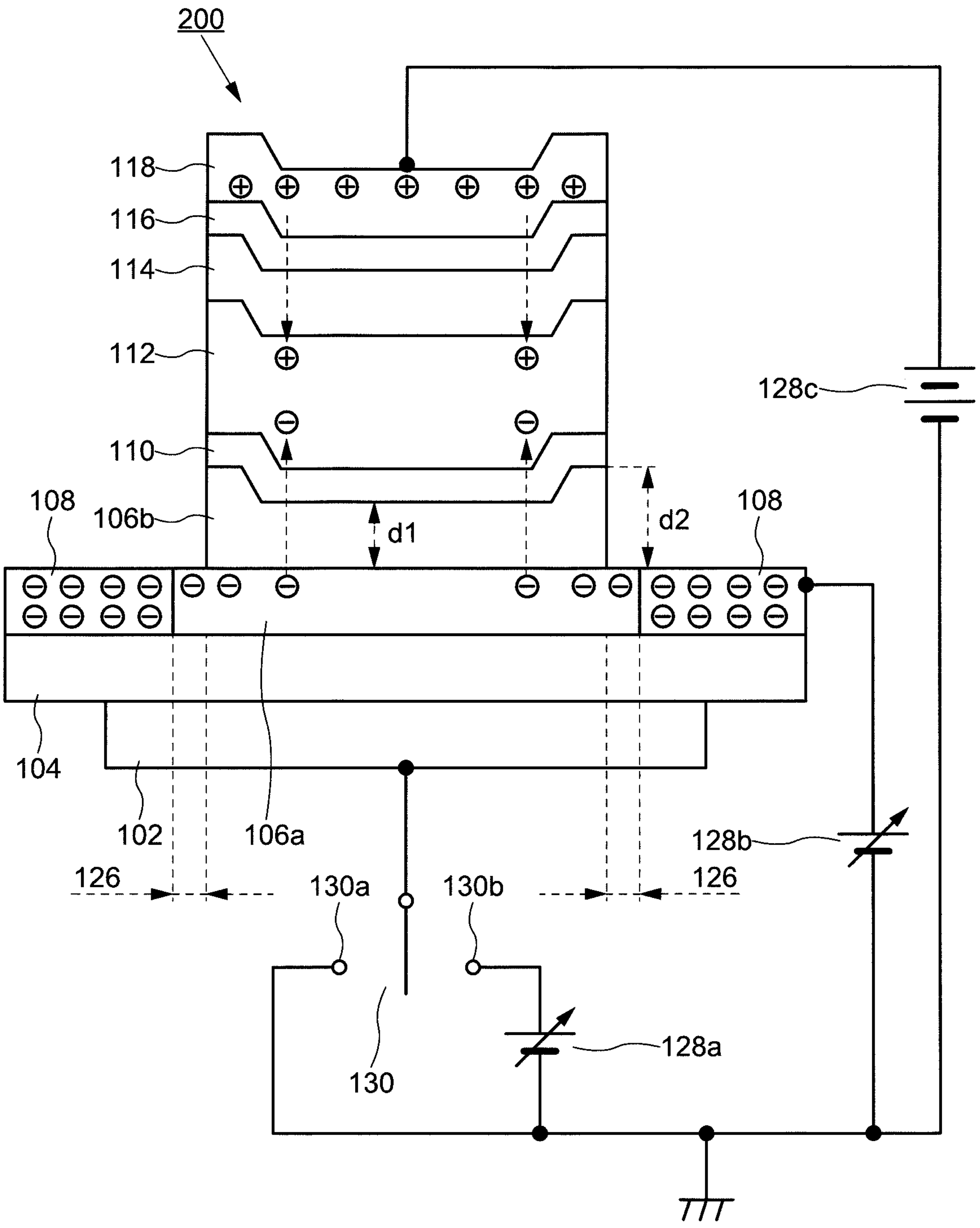
FIG. 3 is a diagram showing an operation of an EL element according to an embodiment of the present invention.

FIG. 3 schematically shows a configuration of the EL element 200 according to the present embodiment. FIG. 3 shows a structure in which the second electrode 108, the electron transport layer 106, the electron injection layer 110, the light emitting layer 112, the hole transport layer 114, the hole injection layer 116, the third electrode 118, the first insulating layer 104, and the first electrode 102 are arranged as members constituting the EL element 200.

The EL element 200 is a type of light emitting diode and emits light by flowing a forward current between the third electrode (anode) 118 and the second electrode (cathode) 108. FIG. 3 shows an embodiment in which a third power 128*c* is connected between the third electrode 118 and the ground, a second power source 128*b* is connected between the second electrode 108 and the ground, a second switch 130*b* is connected in series between the first electrode 102 and the first power source 128*a*, and a first switch 130*a* is connected between the first electrode 102 and the ground. FIG. 3 shows a state in which the first switch 130*a* and the second switch 130*b* of the switch 130 are off and no bias is applied to the first electrode 102.

That is, FIG. 3 shows a state in which the first switch 130*a* for controlling the conduction state between the first electrode 102 and the earth (ground) is off, and the second switch 130*b* for controlling the connection between the first electrode 102 and the first power source 128*a* is off. In this state, since the EL element 200 is biased in the forward direction, if the bias voltage is a light emission start voltage or higher, holes are injected from the third electrode 118, and electrons are injected from the second electrode 108. In the EL element 200, a positive voltage is applied between the third electrode 118 and the second electrode 108 by the third power 128*c*. The emission intensity can be controlled by the magnitude of the forward current flowing through the EL element 200.

However, in a configuration in which the electron transport layer 106 and the third electrode 118 are arranged on the first insulating layer 104 so as to face each other with the light emitting layer 112 interposed therebetween, and the second electrode 108 is connected at the peripheral portion of the first electron transport layer 106*a*, it is not possible to uniformly emit light in the light emitting area (area where the electron transport layer 106, the electron injection layer 110, the light emitting layer 112, and the third electrode 118 overlap). In this case, the electric field generated between the third electrode 118 and the second electrode 108 is not uniform in the light emitting area, and the electric field is concentrated on the end portions of the second insulating layer 120 and the second electrode 108. In the state where both of the first switch 130*a* and the second switch 130*b* are off, carriers (electrons) injected from the second electrode 108 are not uniformly distributed in the plane of the first electron transport layer 106*a* but are injected into the end portion of the second electron transport layer 106*b*. In the second electron transport layer 106*b* according to the present embodiment, since the thickness at the end portion is larger than the thickness at the central portion, the electric field concentration at the end portion of the second electron transport layer 106*b* is moderated. Therefore, the offset area 126 can be shortened, and accordingly, an area of the light emitting area can be increased.

However, in FIG. 3, since the first switch 130*a* and the second switch 130*b* are off, no voltage is applied to the first electrode 102 from the second power source 128*b*. The carriers (electrons) injected from the second electrode 108 to the first electron transport layer 106*a* are not affected by the first electrode 102 and therefore do not spread to the center area of the first electron transport layer 106*a*. That is, the carriers (electrons) injected into the peripheral portion of the first electron transport layer 106*a* are not drifted due to the fact that no voltage is applied to the first electrode 102, and therefore do not spread over the entire center area of the first electron transport layer 106*a*. Therefore, in the biased state shown in FIG. 3, the central portion of the light emitting area of the EL element 200 is dark, and only the peripheral portion thereof emits light brightly.

Figure 4:
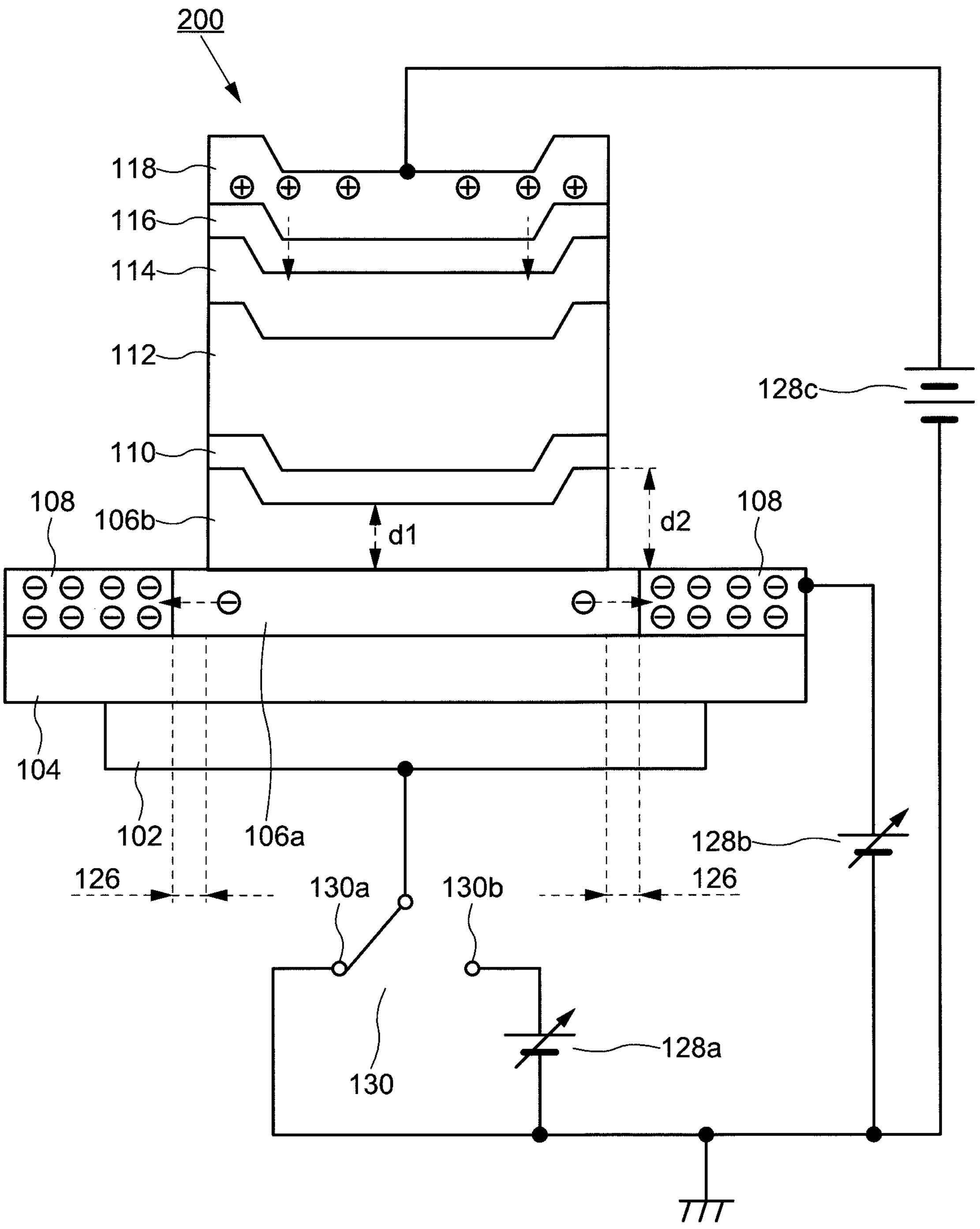
FIG. 4 is a diagram showing an operation of an EL element according to an embodiment of the present invention.

FIG. 4 shows a state in which the first switch 130*a* is turned on and the potential of the first electrode 102 becomes the ground potential in the switch 130. In this state, no carriers (electrons) are present in the first electron transport layer 106*a*, and the first electron transport layer 106*a* is in an insulating state. As a result, no current flows through the EL element 200, and no light is emitted (non-light emitting state). This is because the first electrode 102 operates as the bottom gate, so that the first electron transport layer 106*a* of the offset area 126 becomes a depletion layer and no current flows.

Figure 5:
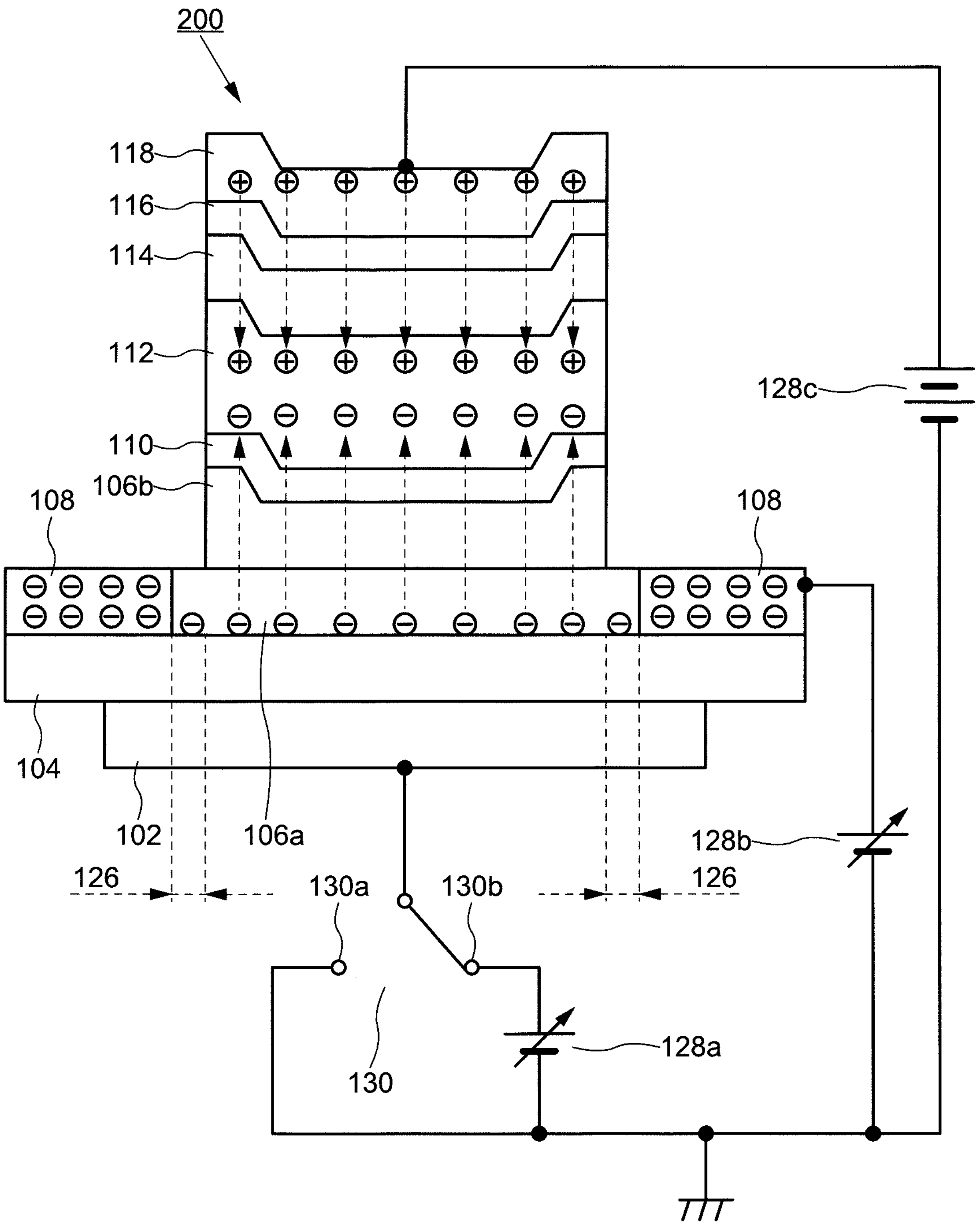
FIG. 5 is a diagram showing an operation of an EL element according to an embodiment of the present invention.

As shown in FIG. 5, in the case where a forward bias is applied between the third electrode 118 and the second electrode 108 of the EL element 200 and the second switching 130*b* is turned on, an electric field formed by the first electrode 102 acts on the first electron transport layer 106*a*. Since a positive voltage is applied to the first electrode 102, carriers (electrons) injected from the second electrode 108 to the first electron transport layer 106*a* are drifted to the center area of the first electron transport layer 106*a*. Thereby, carriers (electrons) are transported from the peripheral portion of the first electron transport layer 106*a* to the central area of the first electron transport layer 106*a*. The electric field generated by the positive-voltage-applied first electrode 102 acts to spread carriers (electrons) injected from the second electrode 108 over the entire surface of the first electron transport layer 106*a*.

Since the EL element 200 is biased in the forward direction, carriers (electrons) transported to the central area of the first electron transport layer 106*a* move from the first electron transport layer 106*a* toward the light emitting layer 112. The carriers (holes) injected from the third electrode 118 and the carriers (electrons) injected from the second electrode 108 recombine in the light emitting layer 112 to generate excitons, and photons are emitted and observed as light emission when the excitons in the excited state transition to the ground state.

In the biased state shown in FIG. 5, the amount of carriers (electrons) injected into the first electron transport layer 106*a* can be controlled by the voltage of the second electrode 108. Increasing the voltage of the second electrode 108 makes it possible to increase the amount of carriers (electrons) injected into the first electron transport layer 106*a*. The amount of carriers (electrons) injected into the light emitting layer 112 from the first electron transport layer 106*a* may be controlled by the voltage of the first electrode 102. Increasing the voltage of the first electrode 102 makes it possible to draw a large amount of carriers (electrons) injected from the second electrode 108 into the central area of the first electron transport layer 106*a*, and the amount of carriers injected into the light emitting layer 112 can be increased.

In order for the light emitting layer 112 to emit light substantially uniformly over the entire surface, electrons flowing in the second electron transport layer 106*b* preferably form a space-charge limited current. Therefore, the second electron transport layer 106*b* is preferably in an amorphous state, a nano-sized microcrystalline state, or a mixed state thereof. The first electron transport layer 106*a* preferably contains nano-sized microcrystals and is a dense film.

As described above, the EL element 200 according to the present embodiment has the first electrode 102 in addition to the third electrode 118 and the second electrode 108, so that the density of carriers injected into the light emitting layer 112 can be controlled.

Figure 17A:
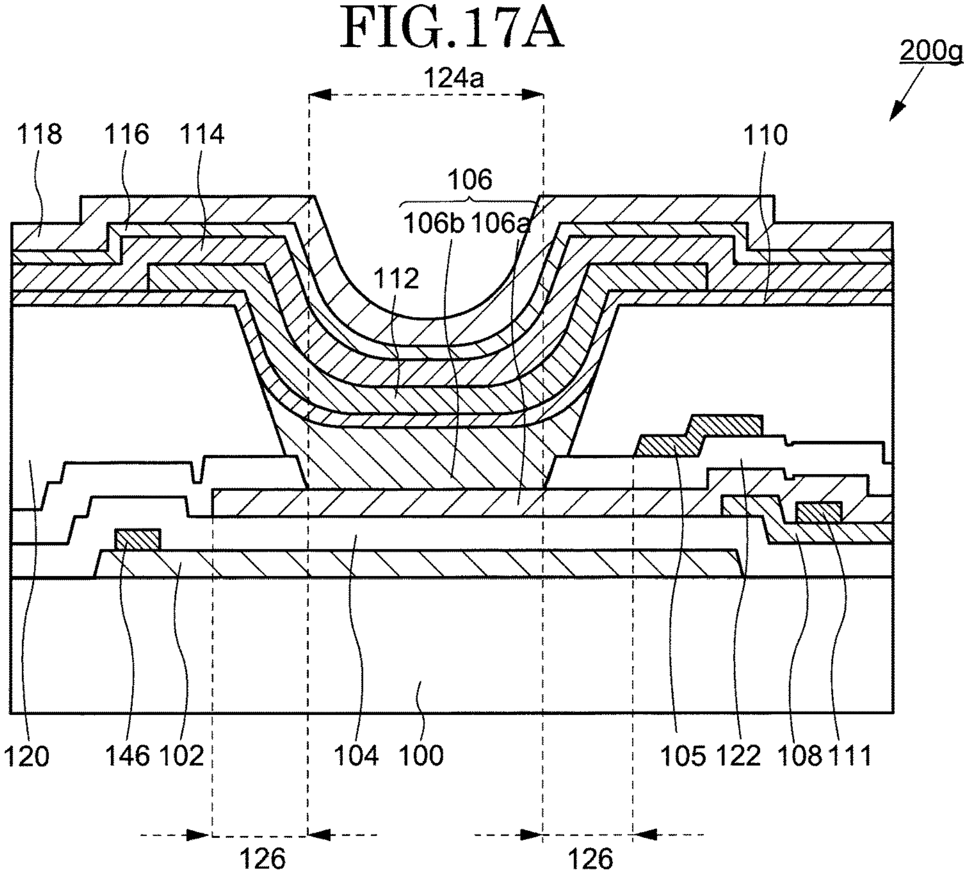
FIG. 17A is a cross-sectional view showing a structure of an EL element according to an embodiment of the present invention.
Figure 17B:
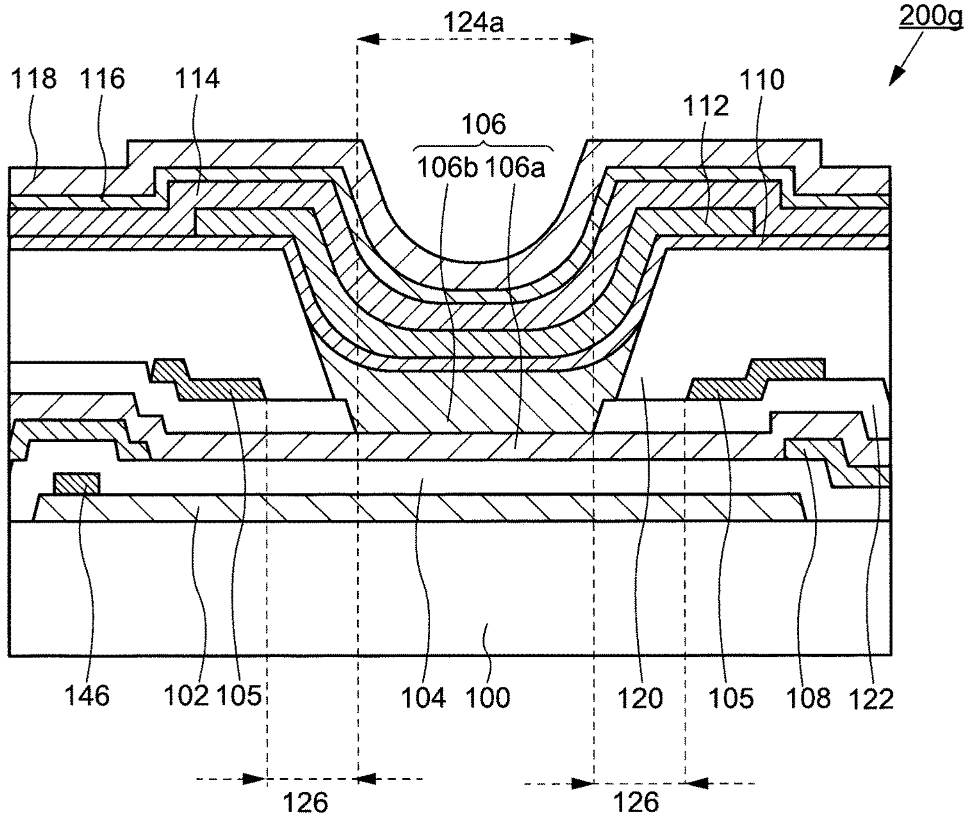
FIG. 17B is a cross-sectional view showing a structure of an EL element according to an embodiment of the present invention.

Further, the second electron transport layer 106*b* according to the present embodiment has a larger thickness at the end portion than at the central portion. Therefore, the electric field can be suppressed from concentrating at the end portion of the second electron transport layer 106*b*, and the withstand voltage can be improved. Further, in order to suppress leakage from the side wall of the second electron transport layer 106*b* and improve reliability, a third insulating layer 122 may be stacked on the lower layer of the second insulating layer 120 as shown in FIGS. 17A and 17B.

Although FIG. 5 shows an example in which the first electrode 102 is arranged on the second electrode 108 side, the first electrode 102 may be arranged on the third electrode 118 side. In addition to the first electrode 102, an electrode that controls the injection amount of carriers (holes) may be further arranged on the third electrode 118 side.

3-2. Career Balance Control

In order for the EL element to emit light, holes need to be injected from the anode and electrons need to be injected from the cathode. In order to increase the current efficiency (luminous efficiency) of the EL element, it is necessary to balance the amount of electrons transported from the anode to the light emitting layer and the amount of positive holes transported from the cathode to the light emitting layer (hereinafter, also referred to as "carrier balance"). The EL element can improve the current efficiency by balancing the carriers.

However, in the conventional EL element, since the electronic mobility is lower than the hole mobility of the light emitting layer, the carrier balance is lost, and the luminous efficiency is lowered. In addition, the EL element has a problem in that, when the carrier balance is lost and the number of holes is excessively large in the light emitting layer, holes are accumulated at the interface between the light emitting layer and the electron transport layer, which causes the degradation of the current efficiency (luminous efficiency). Therefore, attempts have been made to balance the holes injected into the light emitting layer with electrons by adjusting the materials and thicknesses of the hole transport layer and the electron transport layer. However, even if the element structure itself of the EL element is adjusted, it is not possible to follow the temporal change or the thermal change of the light emission property.

Figure 32:
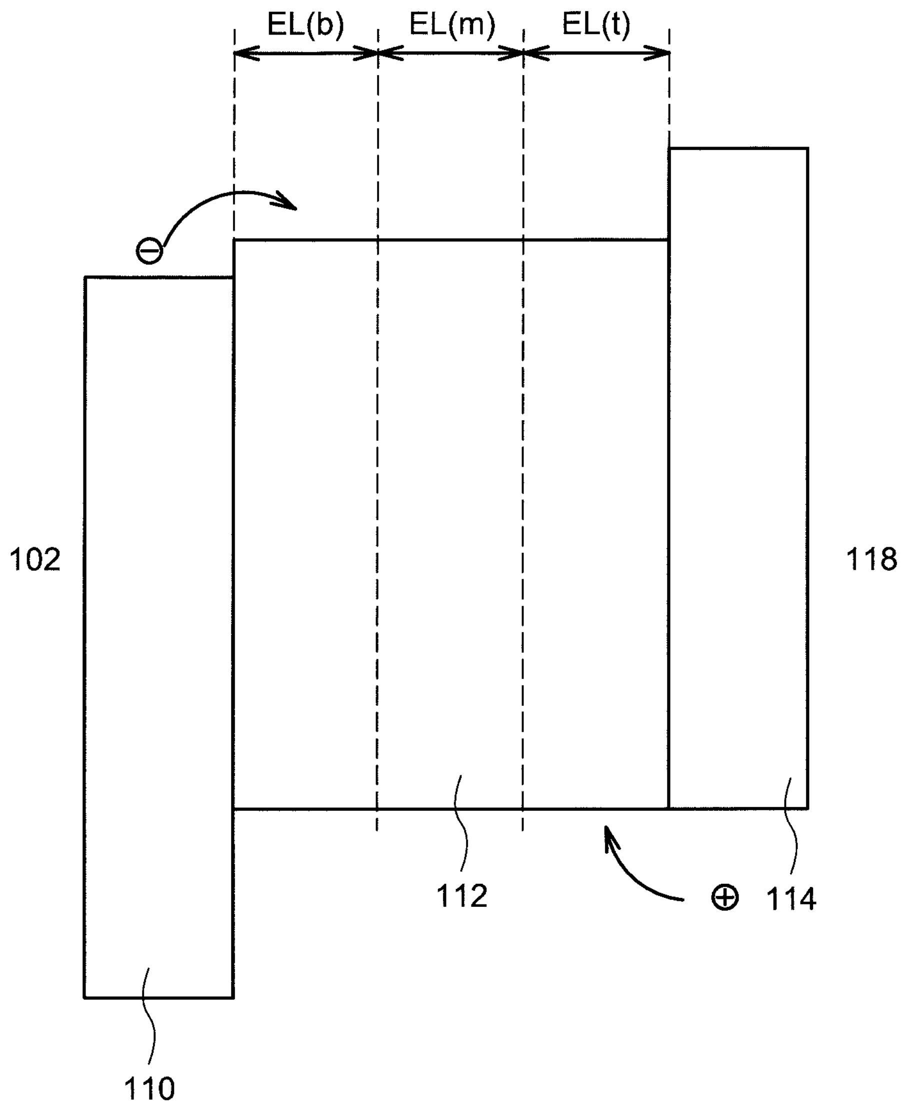
FIG. 32 is a band diagram of an inverted structure EL element according to an embodiment of the present invention.

In contrast, in the EL element 200 according to the embodiment of the present invention, the carrier balance can be controlled by the first electrodes 102. That is, the carrier balance can be controlled by controlling the transport amount of carriers (electrons) to the light emitting layer 112 by the first electrode 102 arranged on the electron transport layer 106 side. That is, the number of holes and electrons in the light emitting layer 112 can be controlled to be the same by increasing the amount of electrons transported by the first electrode 102 so that the amount of electrons transported from the second electrode 108 to the light emitting layer 112 is not insufficient with respect to the amount of positive holes transported from the third electrode 118 to the light emitting layer 112. In other words, as shown in FIG. 32, the EL element 200 according to the present embodiment is capable of keeping the carrier balance in the light emitting layer 112 constant by increasing the electron current by the first electrode 102 so that the magnitude of the electron current injected from the electron injection layer 110 to the light emitting layer 112 is the same with respect to the hole current injected from the hole transport layer 114 to the light emitting layer 112.

Figure 6:
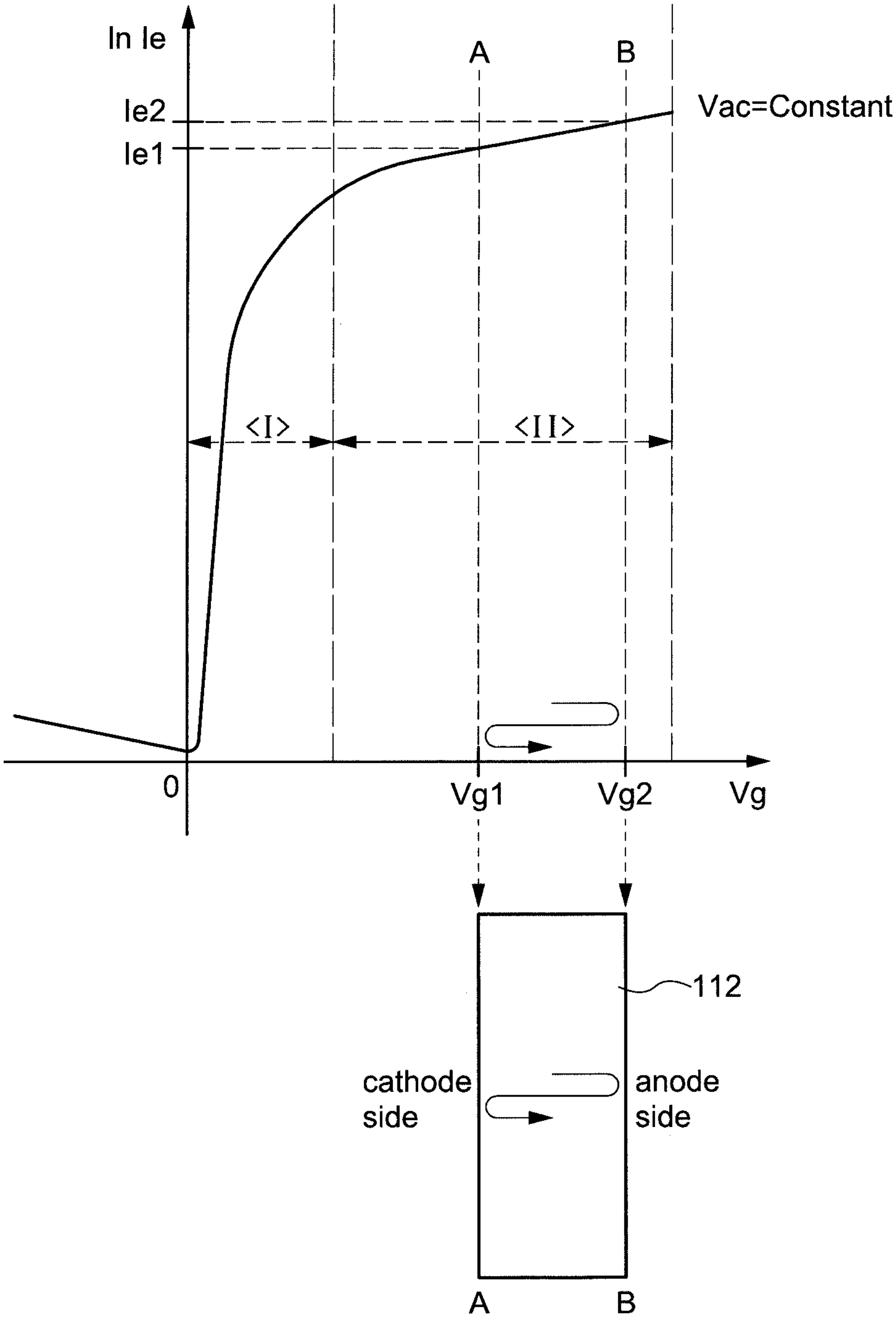
FIG. 6 is a diagram showing an example of an operation property of an EL element according to an embodiment of the present invention.

FIG. 6 is a diagram schematically showing a relation between currents (Ie) flowing between the third electrode 118 and the second electrode 108 when a voltage (Vac) applied between the third electrode 118 and the second electrode 108 of the EL element 200 is constant and a voltage (Vg) applied to the first electrode 102 is changed. As shown in FIG. 6, in the case where the voltage (Vg) applied to the first electrode 102 is OV, the electronic current (Ie) is small, and light emission over the entire surface of EL element 200 is not observed. When the voltage of the first electrode 102 is increased from this condition, carriers (electrons) injected from the second electrode 108 into the electron transport layer 106 become electron currents (Ie) and flow from the first electron transport layer 106*a* toward the light emitting layer 112. In this case, the electronic current (Ie) increases exponentially as the forward current of the diode ("I area" shown in FIG. 6).

In the case where the voltage (Vg) applied to the first electrode 102 is further increased, the increasing amount of the electronic current (Ie) with respect to the change amount of the voltage (Vg) tends to saturate, and the slope of the curve of Ie vs Vg property becomes gentle ("II area" shown in FIG. 6). In the case where the magnitude of the voltage (Vg) applied to the first electrode 102 at the area B is varied between the first voltage (Vg1) and the second voltage (Vg2), the electronic current (Ie) varies between the first current (Ie1) and the second current (Ie2). The area where the voltage (Vg) of the first electrode 102 varies from the first voltage (Vg1) to the second voltage (Vg2) is an area where the electronic current (Ie) does not change abruptly, and it an area where the emission intensity of the EL element 200 is saturating.

Figure 34A:
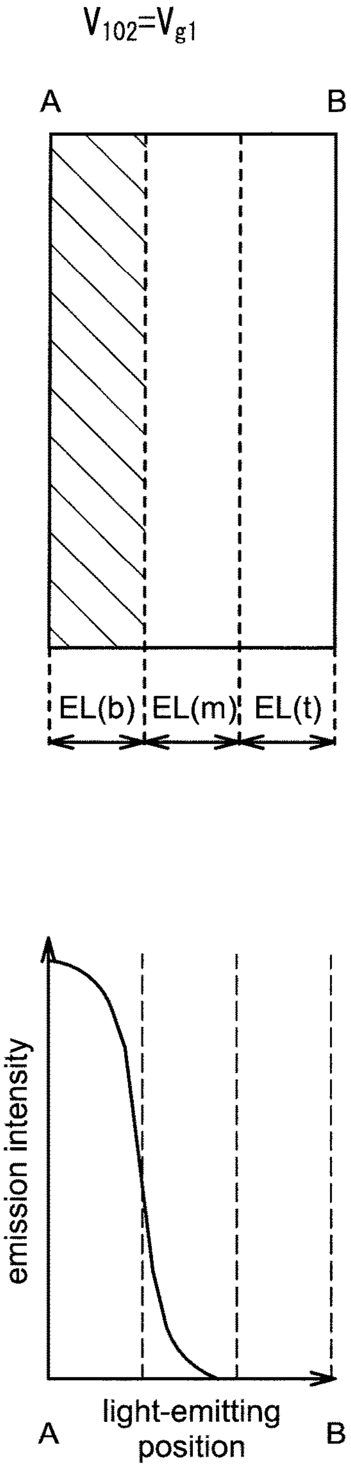
FIG. 34A is a diagram showing a relationship between the emission intensity and a voltage applied to an electrode for controlling the amount of carrier injection of an EL element according to an embodiment of the present invention.
Figure 34B:
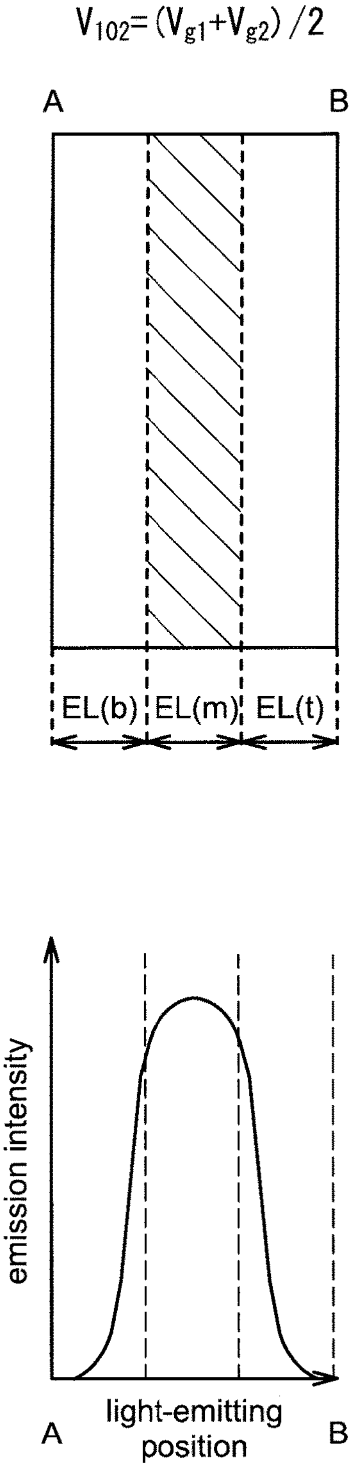
FIG. 34B is a diagram showing a relationship between the emission intensity and a voltage applied to an electrode for controlling the amount of carrier injection of an EL element according to an embodiment of the present invention.
Figure 34C:
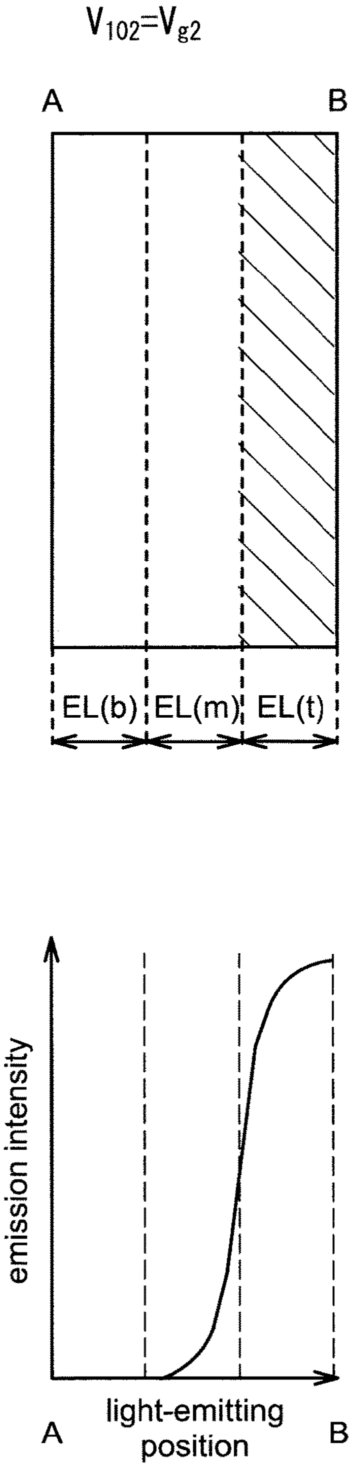
FIG. 34C is a diagram showing a relationship between the emission intensity and a voltage applied to an electrode for controlling the amount of carrier injection of an EL element according to an embodiment of the present invention.

A change in the electron current (Ie) means an increase or decrease in the amount of holes and electrons injected into the light emitting layer 112. In the case where the voltage (Vg) of the first electrode 102 is changed between the first voltage (Vg1) and the second voltage (Vg2), the amount of electrons injected into the light emitting layer 112 is changed. That is, changing the voltage (Vg) of the first electrode 102 makes it possible to control the carrier balance between the electrons and the holes in the light emitting layer 112. As shown in FIG. 34A to 34C, changing the amount of electrons injected into the light emitting layer 112 makes it possible to shift the center position (the position of the light emitting area in the thickness direction of the light emitting layer 112) of the area to which the electrons and the holes are recombined. For example, in FIG. 34A, in the case where the first electrode 102 is at the first voltage (V102=Vg1), the electronic current becomes relatively smaller than the hole current, and the position of the light emitting area in the light emitting layer 112 becomes the cathode side (EL (b), the "A" side shown in FIG. 6). On the other hand, in FIG. 34C, in the case where the first electrode 102 is at the second voltage (V102=Vg2), the electronic current becomes relatively larger than the hole current, and the position of the light emitting area in the light emitting layer 112 is shifted to the anode side (EL (t), the "B" side shown in FIG. 6). In FIG. 34B, in the case where the first electrode 102 is at the half of the first voltage plus the second voltage (V102=(Vg1+Vg2)/2), the electronic current and the hole current become equal, and the position of the light emitting area in the light emitting layer 112 is shifted to the central portion (EL (m)).

In this way, the EL element 200 can control the position of the light emitting area in the light emitting layer 112 in the thickness direction by the voltage of the first electrode 102. For example, in the case where the voltage of the first electrode 102 is changed between the first voltage (Vg1) and the second voltage (Vg2), the position of the light emitting area in the light emitting layer 112 can be swung between the cathode side A and the anode side B. The entire light emitting layer 112 can be utilized as a light emitting area by controlling the voltage of the first electrode 102. As a result, the entire area of the light emitting layer 112 can be used as a light emitting area, so that the lifetime of the brightness degradation (for example, the time for the initial brightness drops to 70%) can be extended. The voltage of the first electrode 102 varies between Vg1 and Vg2 shown in FIG. 6, and the intensity of the brightness can be controlled by the potential difference (voltage) between the second electrode 108 and the third electrode 118.

As described above, in the EL element according to the present embodiment, the electron transport layer is formed of the oxide semiconductor layer, the first electrode for controlling the amount of carrier injection is arranged on the electron transport layer with the insulating layer interposed therebetween, and the first electrode is arranged opposite to the third electrode 118 which is the anode, whereby the electron injection amount into the light emitting layer can be controlled. The EL element according to the present embodiment can control the carrier balance between the electrons and the holes in the light emitting layer by the action of the first electrode that controls the amount of carrier injection. As a result, the current efficiency of the EL element can be increased, and the lifetime can be extended.

Figure 33A:
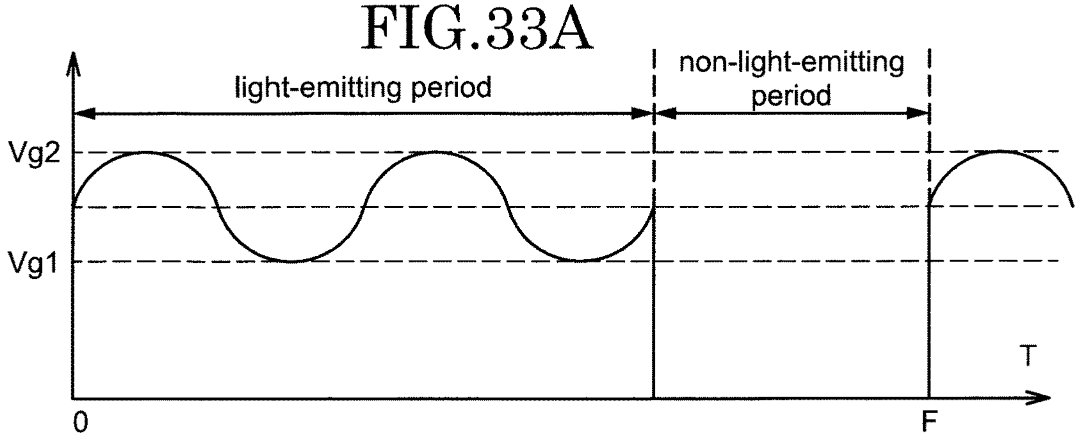
FIG. 33A is a diagram showing a voltage waveform applied to an electrode that control the amount of carrier injection of an EL element according to an embodiment of the present invention.
Figure 33B:
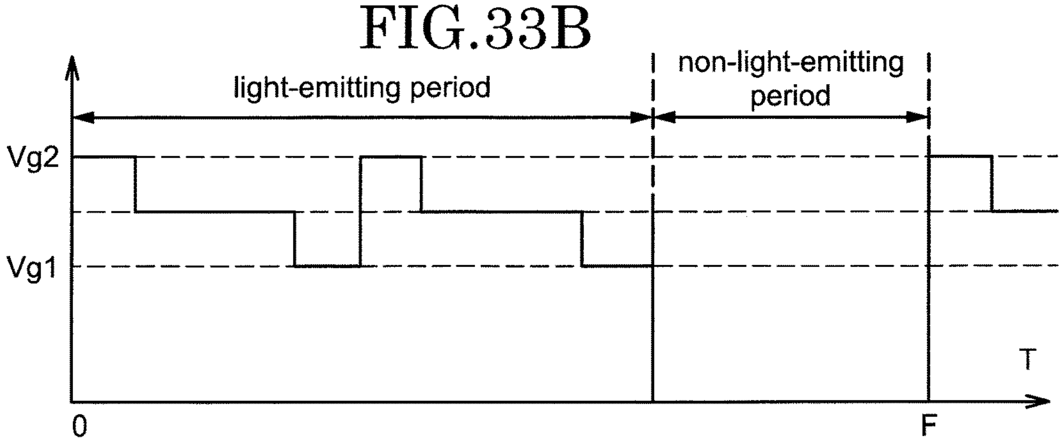
FIG. 33B is a diagram showing a voltage waveform applied to an electrode that control the amount of carrier injection of an EL element according to an embodiment of the present invention.
Figure 33C:
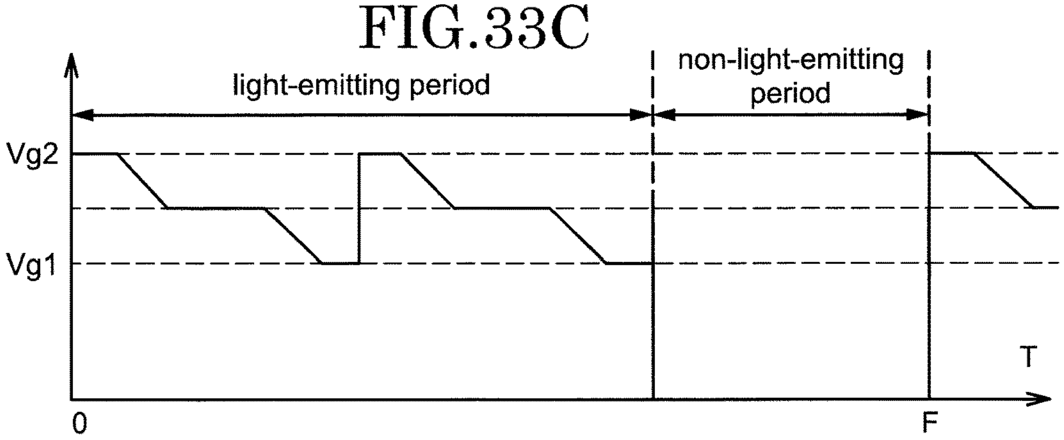
FIG. 33C is a diagram showing a voltage waveform applied to an electrode that control the amount of carrier injection of an EL element according to an embodiment of the present invention.
Figure 33D:
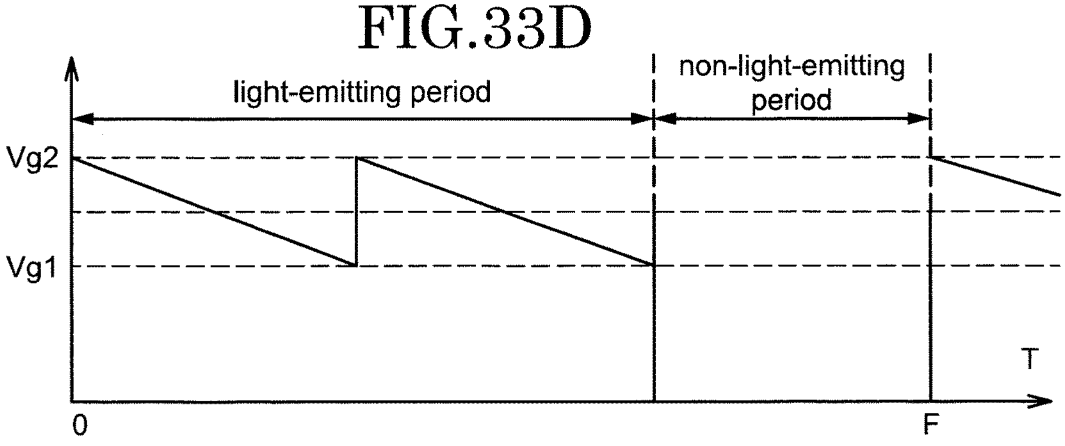
FIG. 33D is a diagram showing a voltage waveform applied to an electrode that control the amount of carrier injection of an EL element according to an embodiment of the present invention.

In the conventional EL element structure, the entire thickness of the light emitting layer is not uniformly deteriorated, and the light emitting layer is unevenly deteriorated, so that it is difficult to suppress the brightness deterioration, and therefore the lifetime of the EL element cannot be extended. However, in the EL element 200 according to the embodiment of the present invention, the entire light emitting layer 112 can be made to be a light emitting area by controlling the voltage of the first electrode 102, whereby the entire thickness of the light emitting layer 112 can uniformly deteriorate, and therefore the lifetime for brightness degradation can be extended. As a result, even if the thickness of the light emitting layer 112 is increased from the conventional thickness (e.g., 30 nm) to 45 nm to 90 nm that is 1.5 times to 3.0 times, the entire area in the thickness direction of the light emitting layer 112 can be emitted, so that the lifetime of the EL element 200 can be further increased. As shown in FIG. 33A to 33D, although the waveform of the voltage V102 applied to the first electrode 102 may be (A) a sinusoidal waveform, (B) a rectangular stepped waveform, (C) a trapezoidal stepped waveform, or (D) a triangular waveform, the best waveform can be selected according to the circuit system. There is no limit on how many times to repeat in one field period. In order to maximize the light emission lifetime, the emission time ratio of the central light emitting area may be increased. A rectangular stepped wave or a trapezoidal stepped wave in FIG. 33B or 33C is preferable as the voltage waveform.

4. Method of Manufacturing EL Element

An example of a method of manufacturing an EL element according to an embodiment of the present invention will be described with reference to FIG. 7A to 7C, FIG. 8A to 8C, and FIG. 9A to 9C. In the following, a method of manufacturing the bottom-emission type EL element 200*a* shown in FIG. 1 will be described.

Figure 7A:
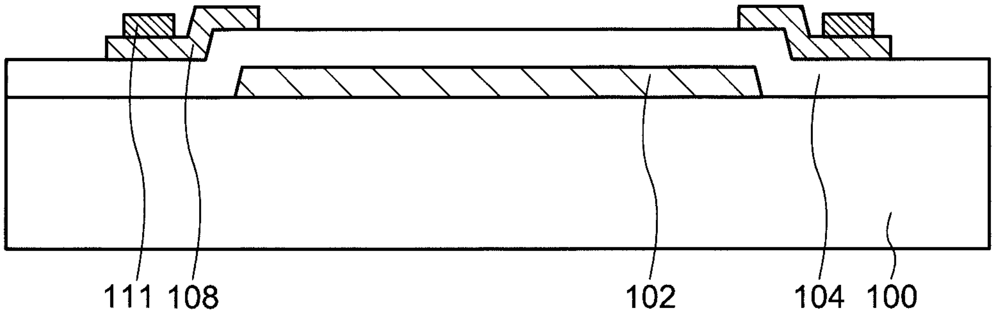
FIG. 7A is a diagram showing a method of manufacturing an EL element according to an embodiment of the present invention.

FIG. 7A shows a step of forming the first electrode 102, the first insulating layer 104, the second electrode 108, and the wiring 111 on the substrate 100. For example, a transparent insulating substrate is used as the substrate 100. A quartz substrate and alkali-free glass substrate exemplified by aluminosilicate glass and aluminoborosilicate glass are used as the transparent insulating substrate. In addition, a resin substrate such as polyimide, para-aramid, or polyethylene naphthalate (PEN) can be used as the transparent insulating substrate.

The first electrode 102 is formed of a transparent conductive film such as indium-tin-oxide (ITO) or indium-zinc-oxide (IZO). The transparent conductive film is formed with a thickness of 30 nm to 200 nm using a sputtering method. The first electrode 102 is formed by forming a resist mask by a photolithography process and performing etching with respect to the transparent conductive film formed on the first surface of the substrate 100. The first electrode 102 is preferably formed to have a tapered end surface in a cross-sectional view.

The first insulating layer 104 is formed of an inorganic transparent insulating film such as a silicon oxide film, a silicon nitride film, or a silicon oxynitride film. The inorganic transparent insulating film is formed by a plasma CVD (Chemical Vapor Deposition) method or a sputtering method. The first insulating layer 104 is formed to have a thickness of about 100 nm to 500 nm. The first insulating layer 104 is formed so as to bury the first electrode 102. In this case, since the end surface of the first electrode 102 is formed in a tapered shape, the first electrode 102 including the stepped portion can be surely covered.

The second electrode 108 is formed by sputtering a film of a metal oxide material, a metal nitride material, a metal oxynitride material, or a refractory metal silicide oxide material having conductivity. For example, the second conductive film 107 forming the second electrode 108 is made of a conductive metal oxide film with a thickness of 30 nm to 200 nm. In addition, a third conductive film 109 forming the wiring 111 is formed by sputtering a film of a metal material or an alloy material. The third conductive film 109 forming the wiring 111 is made of a metal film with a thickness of 200 nm to 2000 nm in order to achieve low resistance.

Figure 8A:
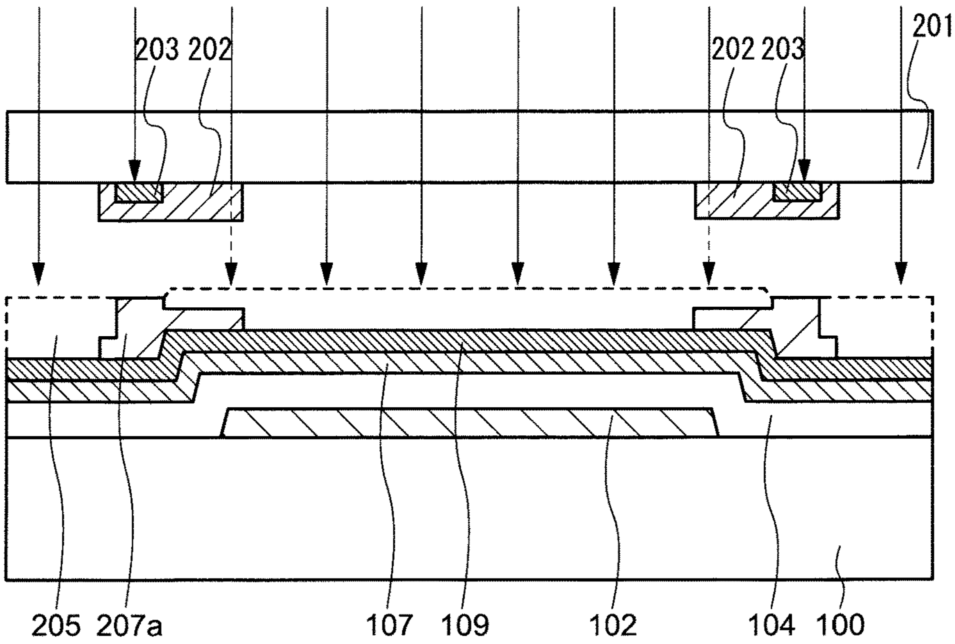
FIG. 8A is a diagram showing a method of manufacturing an EL element according to an embodiment of the present invention.
Figure 8B:
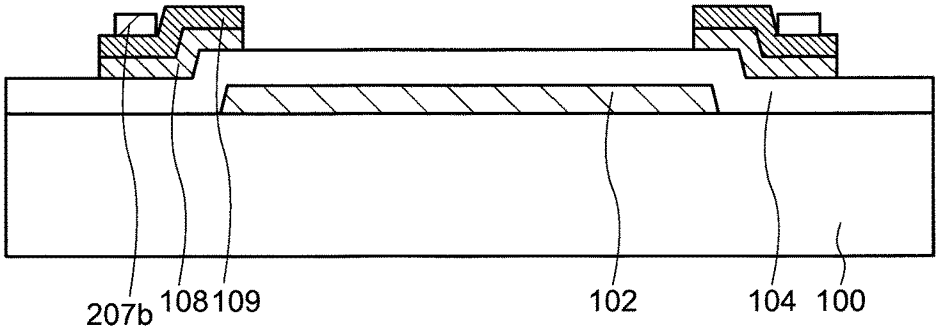
FIG. 8B is a diagram showing a method of manufacturing an EL element according to an embodiment of the present invention.
Figure 8C:
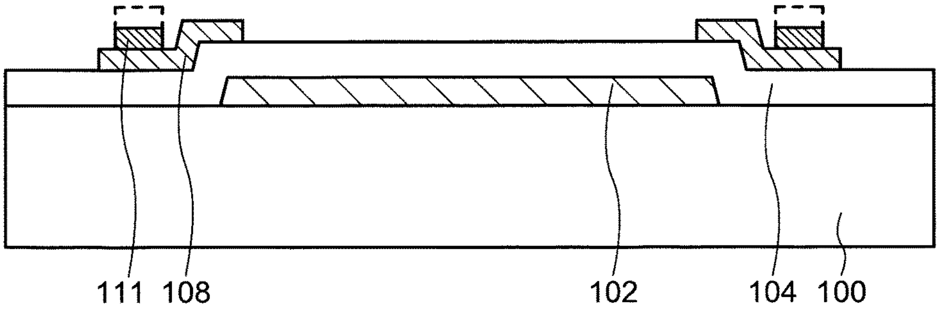
FIG. 8C is a diagram showing a method of manufacturing an EL element according to an embodiment of the present invention.

FIG. 8A to 8C shows a lithography process for forming the second electrode 108 and the wiring 111. In this case, a multi-tone exposure method (halftone exposure method) is applied, and patterns of the second electrodes 108 and the wiring 111 are formed by a single photomask.

As shown in FIG. 8A, a positive photoresist film 205 is formed on the third conductive film 109. A multi-tone mask 201 is used to expose the photoresist film 205. In the multi-tone mask 201, although a gray tone mask in which a slit having a resolution equal to or lower than that of an exposure machine is arranged and an intermediate exposure is realized by blocking a part of light by the slit, and a halftone mask in which an intermediate exposure is realized by using a semi-transmissive film are known as a multi-tone mask pattern, both multi-tone masks 201 can be used in the present embodiment. Exposure through the light-transmitting area, a semi-transmitting area 202, and a non-transmitting area 203 of the multi-tone mask 201 forms three types of portions on the photoresist film 205, i.e., an exposed portion, an intermediate exposed portion, and an unexposed portion.

After that, as shown in FIG. 8A, the photoresist film 205 is developed to form a resist mask 207*a* with areas of different thicknesses. FIG. 8A shows an embodiment in which the resist mask 207*a* has a thicker film thickness in a portion corresponding to the region where the wiring 111 is formed, and a relatively thinner film thickness in a portion corresponding to the region where the second electrode 108 is formed.

The third conductive film 109 and the second conductive film 107 are etched using the resist mask 207*a*. Although the etching conditions are not limited, for example, the third conductive film 109 formed of a metal material is subjected to wet etching using a mixed acid etchant, and the second conductive film 107 formed of a metal oxide material or the like is subjected to dry etching using a chlorine-based gas or wet etching using an oxalic acid-based gas. At this step, the second electrode 108 is formed. After this etching, an area with thin thickness of the resist mask 207*a* is removed by an ashing process to expose the surface of the third conductive film 109. FIG. 8B shows a resist mask 207*b* after the ashing process is performed. The resist mask 207*b* remains on the third conductive film 109.

Next, the exposed third conductive film 109 is etched. This etching is performed, for example, by wet etching using a mixed acid etchant. If the second conductive film 107 formed of a metal oxide or the like contains tin (Sn) in an amount of 10 atm % or more, the second conductive film 107 is less likely to be etched by a mixed acid etchant, so that the selectivity can be relatively high. Therefore, the shape of the second electrode 108 in the lower layer is maintained. FIG. 8C shows a step that the third conductive film 109 is etched to form the wiring 111. After the third conductive film 109 is etched, the resist mask 207*b* is removed by a resist stripping solution or ashing.

The surface of the second electrode 108 that has already been formed is exposed to the oxygen plasma by the resist stripping solution or ashing treatment. However, tin (Sn), zinc (Zn), indium (In), gallium (Ga), tungsten (W), titanium (Ti), tantalum (Ta), hafnium (Hf), and zirconium (Zr), which are contained as components of the second electrode 108, do not generate defects that trap carriers (electrons) even when they become oxides and become an n-type oxide semiconductor without expressing the role of a carrier (electron) killer. Therefore, even when exposed to an oxygen-plasma, a good ohmic contact can be formed with the first electron transport layer 106*a* formed in a later process.

Figure 7B:
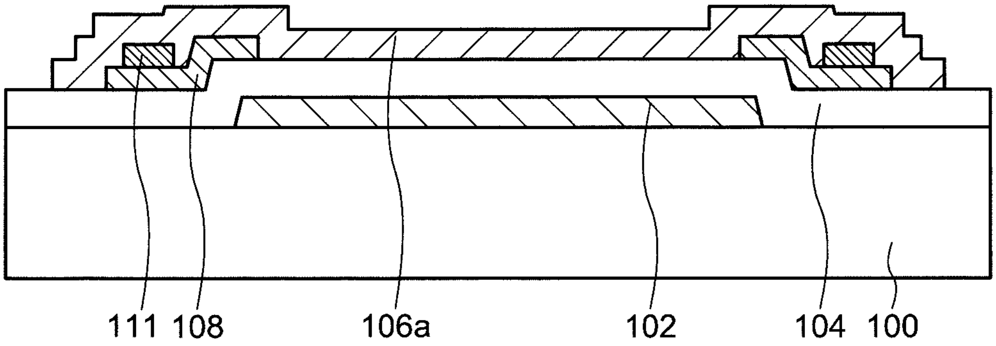
FIG. 7B is a diagram showing a method of manufacturing an EL element according to an embodiment of the present invention.

FIG. 7B shows a step of forming the first electron transport layer 106*a*. The first electron transport layer 106*a* is formed on substantially the entire surface of the substrate 100 so as to cover the second electrode 108 and the wiring 111. The first electron transport layer 106*a* can be produced by a sputtering method using a sputtering target obtained by sintering a metal oxide, an atomic layer deposition (ALD) method, or a mist CVD (Mist Chemical Vapor Deposition) method. The first electron transport layer 106*a* is formed with a thickness of 10 nm to 200 nm, for example, a thickness of 30 nm to 50 nm.

Although the first electron transport layer 106*a* is formed of a metal oxide material, as described above, the first electron transport layer 106*a* is preferably formed of a tin (Sn)-based oxide semiconductor ($InGaSnO_x$, $InWSnO_x$, $InSiSnO_x$, $InGaSnSmO_x$) with high electron mobility and high PBTS (Positive Bias temperature Stress) reliability evaluation. Also, if tin (Sn) is contained in the tin (Sn)-based oxide semiconductor in an amount of 10 atm % or more, even if zinc (Zn) is contained, the compositional change of zinc (Zn) in the process becomes small, and therefore, the inclusion of zinc (Zn) is not completely denied.

Figure 7C:
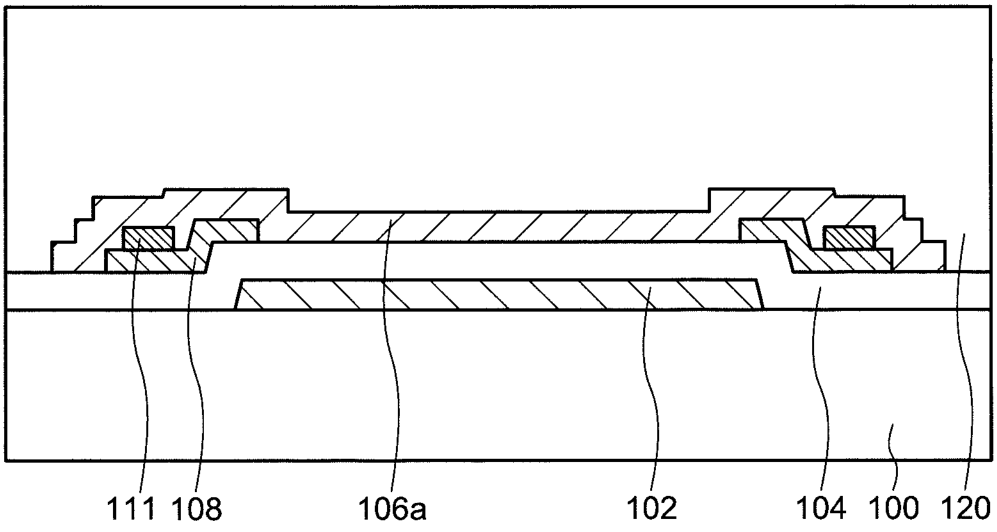
FIG. 7C is a diagram showing a method of manufacturing an EL element according to an embodiment of the present invention.

FIG. 7C shows a step of forming the second insulating layer 120 on the first electron transport layer 106*a*. For example, the second insulating layer 120 is formed using a straight-chain fluorine organic material. A high liquid-repellent surface with poor wettability is formed by forming the second insulating layer 120 using a straight-chain fluorine organic material. In addition, the second insulating layer 120 may be formed of an organic insulating material such as polyimide, acryl, or epoxy siloxane. In this case, the upper surface of the second insulating layer 120 may be improved in water repellency by, for example, a fluorine plasma treatment. The second insulating layer 120 is formed with a thickness of 100 nm to 5000 nm. For example, in the case where the flattening process is performed, it is preferred to be formed with a thickness of 2000 nm to 5000 nm. As a result, a high liquid-repellent surface with poor wettability is formed on the second insulating layer 120.

Figure 9A:
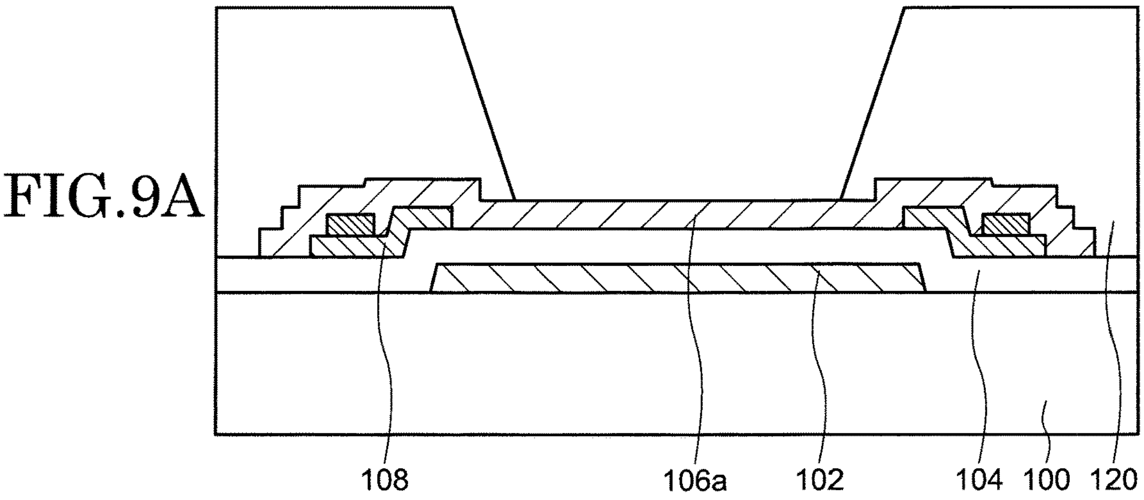
FIG. 9A is a diagram showing a method of manufacturing an EL element according to an embodiment of the present invention.

FIG. 9A shows a step of forming the opening 124 in the second insulating layer 120. The opening 124 may be formed by etching the second insulating layer 120. In the case where the second insulating layer 120 is formed of a photosensitive organic resin material, the opening 124 can be formed by exposure using a photomask and development. In any cases, in order to form the EL element 200*a*, the opening 124 is preferably processed so that the inner wall surface is tapered shape. As a result, the upper surface of the second insulating layer 120 with high liquid repellency is removed from the opening 124, and a side surface with a high wettability and high lyophilic is formed.

Figure 9B:
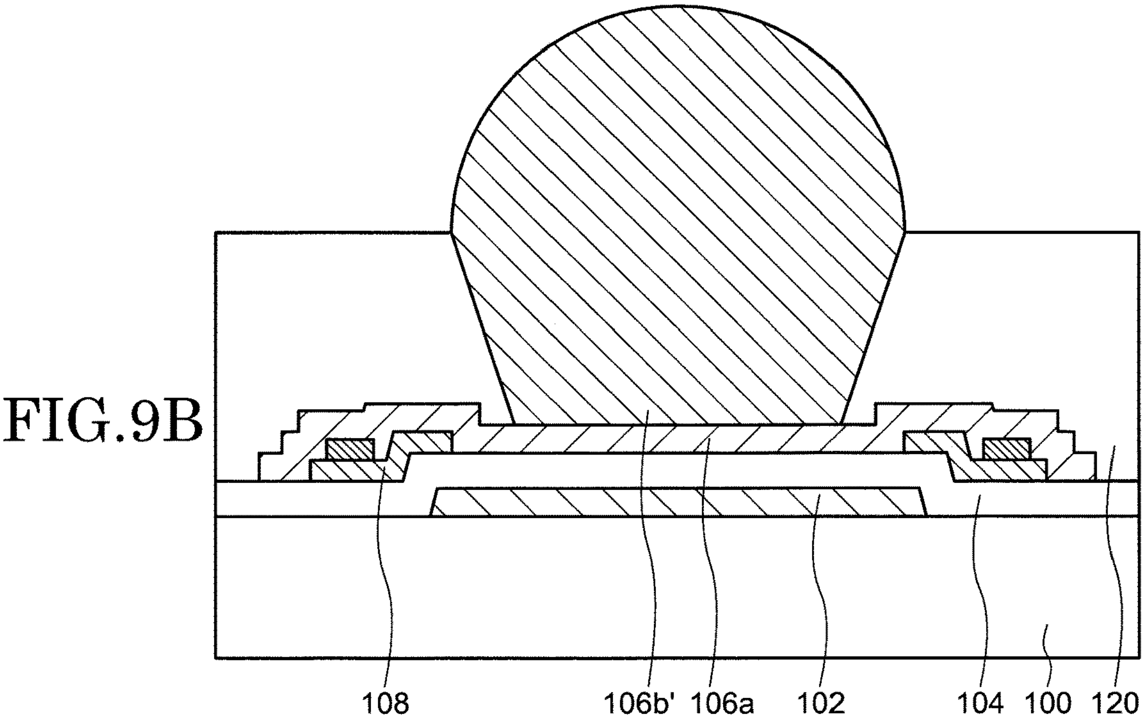
FIG. 9B is a diagram showing a method of manufacturing an EL element according to an embodiment of the present invention.
Figure 9C:
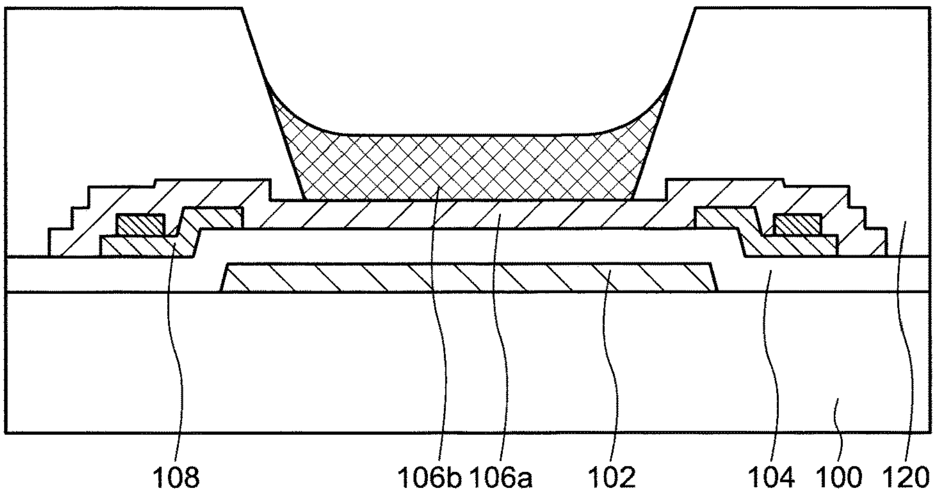
FIG. 9C is a diagram showing a method of manufacturing an EL element according to an embodiment of the present invention.

FIG. 9B and FIG. 9C show steps of forming the second electron transport layer 106*b*. The second electron transport layer 106*b* according to the present embodiment is prepared by a coating method using a composition containing a metal salt, a first amide, and a solvent as a metal oxide material 106*b*'. The metal oxide material 106*b*' of the second electron transport layer 106*b* can be applied by using any of methods such as spin coating, dip coating, ink jet coating, flexographic printing, roll coating, die coating, transfer printing, spraying, and slit coating.

As described above, the metal-oxide-material 106*b*' preferably contains a zinc (Zn)-based oxide semiconductor ($ZnSiO_x$, $ZnMgO_x$, $InZnSiO_x$, $InZnGeO_x$, $InZnMgO_x$, $InZnMgGaO_x$, $InZnGaO_x$, $InGaSnZnO_x$ or the like) that is difficult to crystallize in large particle size and easy to form an amorphous film or a nano-microcrystalline film. That is, the metal oxide material 106*b*' preferably contains zinc oxide and at least one selected from silicon oxide, germanium oxide, magnesium oxide, indium oxide, tin oxide, and gallium oxide. The carrier concentration of the oxide can be adjusted by doping divalent Zn or Mg, trivalent In or Ga or tetravalent Sn.

Figure 31:
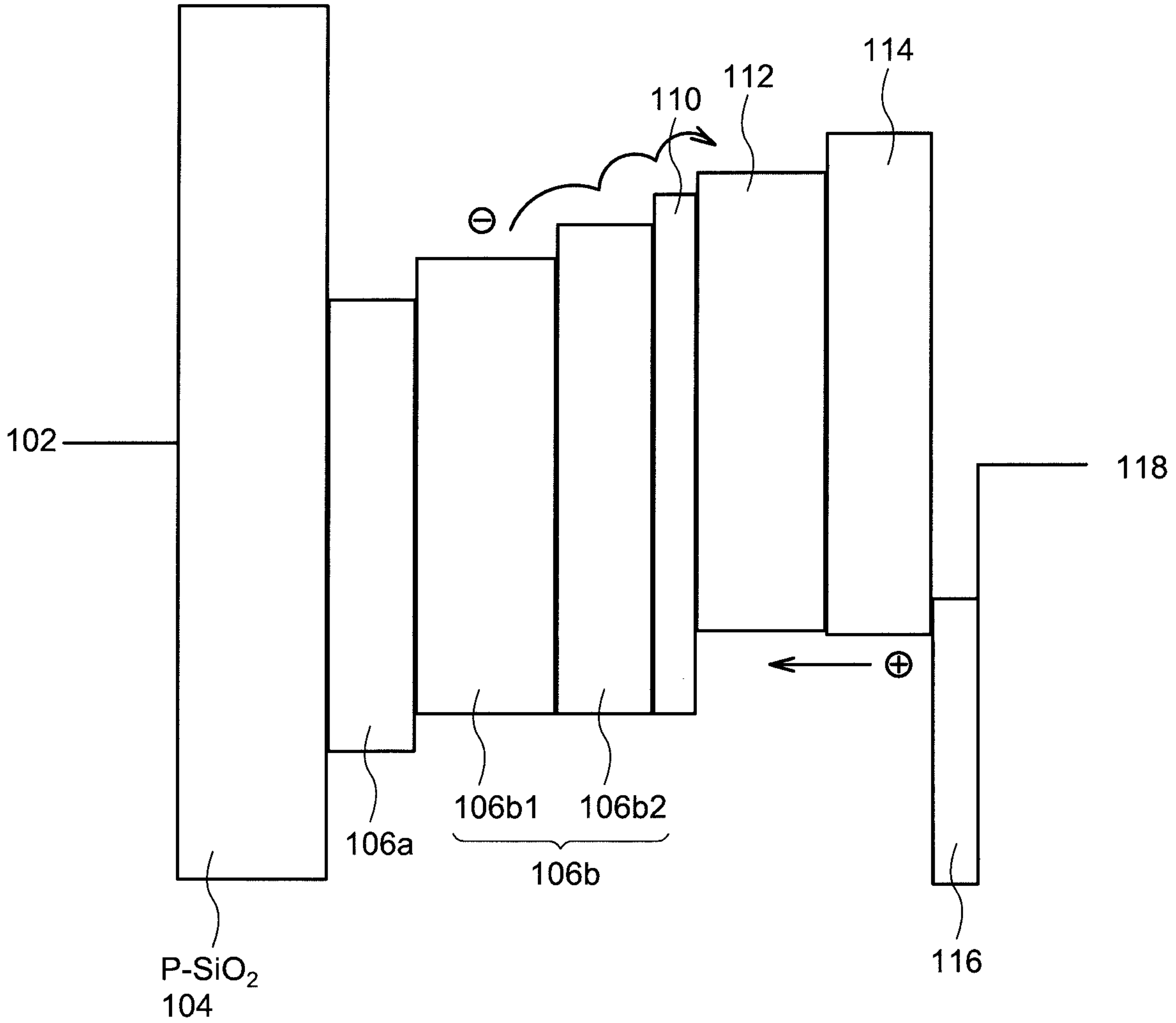
FIG. 31 is a band diagram of an inverted structure EL element according to an embodiment of the present invention.

Adjusting the ratio (B/(A+B)) between the number (A) of indium ions and the sum (B) of the number of magnesium ions and the number of zinc ions in the metal oxide material 106*b*' as a coating liquid for metal oxide thin film formation makes it possible to change the carrier concentration n and the carrier mobility $\mu$, and control the specific resistance value $\rho$ ($\Omega\cdot$cm) of the second electron transport layer 106*b*. Adjusting the value of B/(A+B) in the range of 0.35 to 0.65 makes it possible to control the specific resistance value of the second electron transport layer 106*b* in the range of $10^2$ $\Omega\cdot$cm to $10^6$ $\Omega\cdot$cm. More preferably, the specific resistance value of the second electron transport layer 106*b* is controlled in a range of $10^3$ $\Omega\cdot$cm to $10^5$ $\Omega\cdot$cm. In the case where the thickness of the second electron transport layer 106*b* is as thin as 200 nm, the specific resistance value is preferably adjusted to about $10^5$ $\Omega\cdot$cm, and in the case where the thickness of the second electron transport layer 106*b* is as thick as 2000 nm, the specific resistance value is preferably adjusted to about $10^3$ Ω·cm. In order to improve the yield, the thickness of the second electron transport layer **106*b* is preferably increased. In the case where the thickness of the second electron transport layer 106*b* is the range of 500 nm to 1000 nm, it is possible to suppress the upper and lower shorting caused by the particles. In the case where the thickness of the second electron transport layer 106*b* is in the range of 500 nm to 1000 nm, the specific resistance value of the second electron transport layer 106*b* is about $10^4$ Ω·cm, and the voltage required for light emission can be sufficiently reduced. As shown in FIG. 31, the function of the second electron transport layer 106*b* can be improved by multilayering the second electron transport layer 106*b* into two or more layers, enlarging the bandgap in a stepwise manner, and reducing the work function. The bandgap of the second electron transport layer 106*b* is preferably at least 3.0 eV or more, and preferably 3.4 eV or more. The value of the work function of the second electron transport layer 106*b*** is also able to carry out good electron transport by selecting the material so that the value of the work function gradually decreases from 3.8 eV to 3.3 eV as the value approaches the light emitting layer. As a result, the applied voltage for emitting light can be reduced, and heat generation can be suppressed, thereby achieving a longer life.

In addition, the metal salt contained in the metal oxide **106*b*'** is preferably an inorganic acid salt of the above-mentioned metal. For example, at least one selected from the group consisting of nitrate, sulfate, phosphate, carbonate, bicarbonate, borate, hydrochloride, and hydrofluoric acid can be used as the inorganic acid salt. In addition, hydrochloride and nitrate are preferable as the inorganic acid salt in order to perform the heat treatment after the coating at a lower temperature.

Examples of the first amide contained in the metal oxide material **106*b*'** include compounds represented by Chemical Formula (1) below.

[Chemical Formula 1]

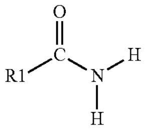

(1)

(In Formula (I), R1 represents a hydrogen atom, a branched or straight-chain alkyl group having 1 to 6 carbon atoms, an oxygen atom in which a hydrogen atom or a branched or straight-chain alkyl group having 1 to 6 carbon atoms is bonded, or a nitrogen atom in which a hydrogen atom, an oxygen atom, or a branched or straight-chain alkyl group having 1 to 6 carbon atoms are bonded.)

Also, the oxygen atom in which a hydrogen atom or a branched or straight-chain alkyl group having 1 to 6 carbon atoms is bonded is-OH or —$OR^2$ ($R^2$ is a branched or straight-chain alkyl group having 1 to 6 carbon atoms). In addition, the nitrogen atom in which a hydrogen atom, an oxygen atom, or a branched or straight-chain alkyl group having 1 to 6 carbon atoms is bonded is, for example, —$NH_2$, —$NHR_3$ or —$NR^4R^5$ (R3, $R^4$, and $R^5$ are each independently being a branched or straight-chain alkyl group having 1 to 6 carbon atoms).

Specific examples of the first amide include acetamide, acetylurea, acrylamide, adipamide, acetaldehyde semicarbazone, azodicarbonamide, 4-amino-2,3,5,6-tetrafluorobenzamido, β-alaninamide hydrochloride, L-alaninamide hydrochloride, benzamide, benzylurea, biurea, biuret, butylamide, 3-bromopropionamide, butylurea, 3,5-bis(trifluoromethyl)benzamide, tert-butyl carbamate, hexanamide, ammonium carbamate, ethyl carbamate, 2-chloroacetamide, 2-chloroethylurea, crotonamide, 2-cyanoacetamide, butyl carbamate, isopropyl carbamate, methyl carbamate, cyanoacetylurea, cyclopropanecarboxamide, cyclohexylurea, 2,2-dichloroacetamide, dicyandiamidine phosphate, guanylurea sulfate, 1,1-dimethylurea, 2,2-dimethoxypropionamide, ethyl urea, fluoroacetamide, formamide, fumaramide, glycinamide hydrochloride, hydroxyurea, hydantoic acid, 2-hydroxyethylurea, heptafluorobutyramide, 2-hydroxyisobutyramide, isobutyramide, lactamide, malonamide, malonamide, 1-methylurea, nitrourea, oxamic acid, oxamic acid ethyl, oxamide, oxamic acid hydrazide, oxamic acid butyl, phenylurea, phthalamide, propionic acid amide, pivalamide, pentafluorobenzamide, pentafluoropropionamide, semicarbazide hydrochloride, succin acid amide, trichloroacetamide, trifluoroacetamide, urea nitrate, urea, and valeramide. Among them, formamide, urea, and ammonium carbamate are preferable. These may be used in one kind or in a combination of two or more kinds.

The solvent contained in the metal oxide material **106*b*'** is intended mainly water. That is, it means that 50 mass % or more of the solvent is water. It is only necessary to use water as the main component, and the solvent may be water only, or a mixed solvent of water and an organic solvent may be used. Specific examples of the organic solvents other than water include ethylene glycol monomethyl ether, propylene glycol monomethyl ether, propylene glycol monomethyl ether acetate, propylene glycol monopropyl ether, methyl ethyl ketone, ethyl lactate, cyclohexanone, γ-butyrolactone, N-methyl pyrrolidone, formamide, N, N-dimethylformamide, N, N-dimethylacetamide, N-methyl-2-2-pyrrolidone, N-methyl caprolactam, dimethyl sulfoxide, tetramethyl urea, pyridine, dimethyl sulfone, hexamethyl sulfoxide, methanol, ethanol, 1-propanol, isopropanol, n-butanol, 2-butanol, tert-butanol, 1-pentanol, 2-pentanol, 3-pentanol, n-hexanol, cyclohexanol, 2-methyl-2-butanol, 3-methyl-2-butanol, 2-methyl-1-butanol, 3-methyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2,2-dimethyl-3-pentanol, 2,3-dimethyl-3-pentanol, 2,4-dimethyl-3-pentanol, 4,4-dimethyl-2-pentanol, 3-ethyl-3-pentanol, 1-heptanol, 2-heptanol, 3-heptanol, 2-methyl-2-hexanol, 2-methyl-3-hexanol, 5-methyl-1-hexanol, 5-methyl-2-hexanol, 2-ethyl-1-hexanol, 4-methyl-3-heptanol, 6-methyl-2-heptanol, 1-octanol, 2-octanol, 3-octanol, 2-propyl-1-pentanol, 2,4,4-trimethyl-1-pentanol, 2,6-dimethyl-4-heptanol, 3-ethyl-2,2-dimethyl-pentanol, 1-nonanol, 2-nonanol, 3,5,5-trimethyl-1-hexanol, 1-decanol, 2-decanol, 4-decanol, 3,7-dimethyl-1-octanol, and 3,7-dimethyl-3-octanol. Two or more of these organic solvents may be used in combination.

In the present embodiment, although ethylene glycol monomethyl ether (boiling point 124° C.) and propylene glycol monomethyl ether (boiling point 120° C.) are listed as the solvent contained in the metal oxide material **106*b*' forming the second electron transport layer 106*b***, pinholes may occur or roughness of unevenness on the surface of the film may increase depending on coating conditions, drying conditions, and burning conditions. This is due to the low boiling point. On the other hand, using a high boiling solvent such as ethylene glycol (boiling point 198° C.) makes it possible to less likely to occur pinholes and reduces the roughness of the unevenness on the surface of the film.

However, in this case, it is easy to remain in the film after burning, and a film with good electron mobility cannot be obtained.

For this reason, the compound represented by Chemical Formula (2) is preferable as the solvent contained in the metal oxide material 106*b*' forming the second electron transport layer 106*b*.

[Chemical formula 2]

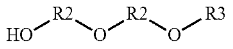

(2)

(In the formula, R2 represents a straight-chain or branched alkylene group having 2 to 3 carbon atoms, and R3 represents a straight-chain or branched alkyl group having 1 to 3 carbon atoms.)

Preferred examples of the solvent represented by Chemical Formula (2) include dipropylene glycol monomethyl ether, dipropylene glycol monoethyl ether, and dipropylene glycol monopropyl ether. Among them, dipropylene glycol monomethyl ether (boiling point: 188° C.) is particularly preferable as the solvent according to the present embodiment.

The content of the first amide in the metal oxide material 106*b*' is 0.1 to 80 mass %, preferably 5 to 50 mass % with respect to the metal salt. The solid content concentration in the metal oxide material 106*b*' is 0.1 mass % or more, preferably 0.3 mass % or more, and more preferably 0.5 mass % or more. In addition, the solid content concentration in the metal oxide material 106*b*' is 30.0 mass % or less, preferably 20.0 mass % or less, and more preferably 15.0 mass % or less. Here, the solid content concentration is the total concentration of the metal salt and the first amide.

The metal oxide material 106*b*' according to the present embodiment is preferably acidic. In addition, pH of the metal oxide material 106*b*' is preferably 1 to 3. At least one selected from the group consisting of nitric acid, sulfuric acid, phosphoric acid, carbonic acid, boric acid, hydrochloric acid and hydrofluoric acid can be used to make pH acidic. For this reason, the first electron transport layer 106*a* of the present embodiment is a tin (Sn)-based oxide semiconductor having excellent acid resistance. If the content of tin (Sn) is 10 atm % or more, the first electron transport layer 106*a* is not corroded by the acid liquid. Further, the content of tin (Sn) in the first electron transport layer 106*a* is preferably 20 atm % or more in view of electron mobility and PBTS reliability.

In the case where the temperature at which the second electron transport layer 106*b* is formed is reduced to 200° C. or lower, it is preferred to use a metal oxide semiconductor film-forming composition in which an organic group 2 metal compound represented by the following Chemical Formula (3) and an organic group 3 metal compound represented by the following Chemical Formula (4) are dissolved in an organic solvent.

[Chemical Formula 3]

R4—M1—R4 (3)

(In the formula, R4 represents an alkyl group. M1 represents a group 2 metal element.)

[Chemical Formula 4]

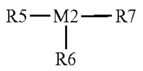

(4)

(In the formula, R5, R6, and R7 independently represent a hydrogen or alkyl-group. M2 represents a group 3 metal element.)

Examples of the organic group 2 metal compound represented by Chemical Formula (3) include diethylzinc and dibutyl magnesium. The bandgap can be controlled in a range of 3.2 eV to 3.6 eV by adding 0 wt % to 40 wt % of dibutyl magnesium or diethylzinc. Adding dibutyl magnesium or diethylzinc makes it possible to control the work function in a range of 3.2 eV to 3.8 eV.

Diethylzinc and dibutyl magnesium are ignitable in the atmosphere and must be stored and used with great care. For this reason, without diluting the above materials, it is difficult to apply them by a flexographic printing method, an inkjet printing method, a slit coating method, or the like in an atmosphere where water ($H_2O$) is usually present. Diethylzinc and dibutyl magnesium can be dissolved in an organic solvent to reduce the risk of ignition and the like. However, in order to form a thin film using a coating solution in which diethylzinc or dibutyl magnesium is dissolved while reacting with an alcohol-based organic solvent, a high-temperature heat treatment at 400° C. or higher is required. In order to realize low-temperature heat treatment at 200° C. or lower, diisopropyl ether has been proposed as an ether-based solvent. However, the boiling point of diisopropyl ether is as low as 69° C. and clogging of the inkjet head is likely to occur when the inkjet coating method is used. In addition, since the flash point is as low as −28° C., it is difficult to ensure safety when used in a mass production factory.

In the present embodiment, it is preferred to use an ether-based solvent with a boiling point in the range of 162° C. to 189° C. and a flash point of 56° C. or higher. Specific examples thereof include diethylene glycol dimethyl ether, dipropylene glycol dimethyl ether, diethylene glycol ethyl methyl ether, and diethylene glycol diethyl ether. Among them, dipropylene glycol dimethyl ether and diethylene glycol diethyl ether with low surface tension is preferred in consideration of applicability.

In the case where diethylzinc or dibutyl magnesium is added to enlarge the bandgap and reduce the work function, the specific resistance value of the formed film is 106 Ω·cm or more. The specific resistance of the second electron transport layer 106*b* according to the present embodiment is preferably controlled within a range of $10^3$ Ω·cm to 105 Ω·cm. Therefore, the specific resistance value can be adjusted to the above-described range by doping a small amount of the organic group 3 metal compound represented by Chemical Formula (4).

Examples of the organic group 3 metal compound represented by Chemical Formula (4) include triethylaluminum, trimethylgallium, and trimethylindium. Using triethylaluminum, trimethylgallium, trimethylindium, or the like makes it possible to control the specific resistance value of the second electron transport layer 106*b*. The amount of doping can be adjusted in the molar ratio of $10^{-8}$ to $10^{-4}$ with respect to diethylzinc. In the case where the thickness of the second electron transport layer 106*b* is as thin as 200 nm, the doping amount is preferably adjusted to about $10^{-8}$ to $10^{-6}$, and in the case where the thickness of the second electron transport layer 106*b* is as thick as 2000 nm, the doping amount is preferably adjusted to about $10^{-5}$ to $10^{-4}$. The doping material may be one described above or a mixture of two or more kinds. In the case where the second electron transport layer 106*b* is as thick as 700 nm to 2000 nm, it is essential that the second electron transport layer 106*b* has a multi-layer structure of two or more layers as shown in FIG. 31, and that the bandgap of the layer adjacent to the light emitting layer is increased and the work function is reduced.

FIG. 9B shows a step of applying the metal oxide material 106*b*' to the substrate. The metal oxide 106*b*' is applied to the opening 124 of the second insulating layer 120. The upper surface of the metal oxide material 106*b*' is formed higher than the upper surface of the second insulating layer 120 in the opening 124 of the second insulating layer 120. The metal oxide material 106*b*' containing the solvent can be formed into a convex shape in which the thickness at the center portion of the opening 124 is larger than that at the end portion due to the surface tension of the metal oxide material 106*b*'. Since the second insulating layer 120 has the upper surface with high liquid repellency and the side surface of the opening 124 with high lyophilic, it is possible to efficiently arrange a sufficiently large amount of the metal oxide material 106*b*' at a desired position in the opening 124.

FIG. 9C shows a step of heat-treating the metal oxide material 106*b*'. The applied metal oxide 106*b*' can be heat-treated at a low temperature, for example, at 150° C. or higher and lower than 300° C. to produce a flat and dense amorphous metal oxide semiconductor layer. The temperature at which the metal oxide material 106*b*' is heat-treated is more preferably 150° C. or higher and 275° C. or lower. The heat treatment time is not particularly limited, it may be, for example, 10 minutes to 2 hours. Also, in order to remove the residual solvent before the heat treatment step, it is preferred to perform a drying step as a pretreatment at 50° C. or higher and lower than 150° C. Performing the heat treatment in this manner makes it possible to form the amorphous metal oxide semiconductor layer at lower temperatures than the conventional method, and the reliability of the EL element 200 can be improved.

The second electron transport layer 106*b* is formed with a thickness of 50 nm to 2000 nm, for example, a thickness of 200 nm to 1000 nm. The second electron transport layer 106*b* is formed such that the upper surface of the second electron transport layer 106*b* is lower than the upper surface of the second insulating layer 120 by heat-treating the metal oxide material 106*b*' containing the solvent so that the solvent volatilizes and the volume shrinks. The second electron transport layer 106*b* may be formed in a single concave surface shape having a larger thickness at the end portion of the opening 124 than that at the central portion due to friction caused by shrinkage of the metal oxide material 106*b*' containing the solvent while contacting the side surface of the opening 124 and interfacial tension between the metal oxide material 106*b*' and the second insulating layer 120. In this way, the upper surface of the second electron transport layer 106*b* can be formed with a less uneven structure. The second electron transport layer 106*b* has a larger thickness at the end portion than that at the central portion of the opening 124, so that the electric field can be suppressed from concentrating at the end portions of the third electrode 118 and the second electrode 108, and therefore, the withstand voltage can be improved. In addition, the upper surface of the second electron transport layer 106*b* has one consecutive concave surface shape, so that a corner portion formed by the side surface and the bottom surface of the opening 124 is buffered. Therefore, adhesion at the opening of the electron injection layer 110, the light emitting layer 112, the hole transport layer 114, the hole injection layer 116, and the third electrode 118 formed on the second electron transport layer 106*b* can be improved.

Thereafter, the electron injection layer 110, the light emitting layer 112, the hole transport layer 114, the hole injection layer 116, and the third electrode 118 are formed, whereby the EL element 200*a* shown in FIG. 1 is manufactured. The electron injection layer 110 can be formed by a sputtering method using a sputtering target such as the C12A7 electride, $Mg_{0.3}Zn_{0.7}O_x$, $Zn_{0.75}Si_{0.25}O_x$, $LaMgO_x$, or $MgSiO_x$. The electron injection layer 110 is formed on substantially the entire surface of the substrate 100 so as to cover the opening 124. The light emitting layer 112 is formed by a vacuum-deposition method or a printing method. As shown in FIG. 1 and FIG. 2, the light emitting layer 112 may be formed separately for the EL element or may be formed contiguously over a plurality of EL elements formed in the same plane. The hole transport layer 114 and the hole injection layer 116 are formed by a vacuum-deposition method or a coating method. The thickness of the hole transport layer 114 is preferably 200 nm or more in order to reduce surface plasmon loss. Since the EL element 200*a* is of the bottom-emission type, the third electrode 118 is formed by a sputtering method such that a metal film such as aluminum (Al) is stacked on a transparent conductive film such as indium-tin-oxide (ITO).

As described above, according to the present embodiment, the EL element 200 can be formed by stacking thin films. Although the EL element 200 according to the present embodiment has the inverted stacked structure in which films are stacked from the cathode side, it has a structure in which the electron transport layer 106 and the electron injection layer 110 are formed of a metal oxide so as not to be damaged in the manufacturing process. In particular, forming the second electron transport layer 106*b* by a coating method makes it possible to increase the thickness of the film, and therefore, it is possible to make the EL element 200 less likely to be short-circuited. In addition, forming a good ohmic contact with the electron transport layer 106 without using an alkali metal in the second electrode 108 makes it possible to reduce the burden on the manufacturing process, and therefore, a chemically stable structure as an element can be obtained. In particular, it can also ensure sufficient reliability even in a thin film sealing method used for a flexible EL panel.

Second Embodiment

In the present embodiment, an example of a display device (EL display device) in which pixels are formed by the EL element according to an embodiment of the present invention is described.

Figure 10:
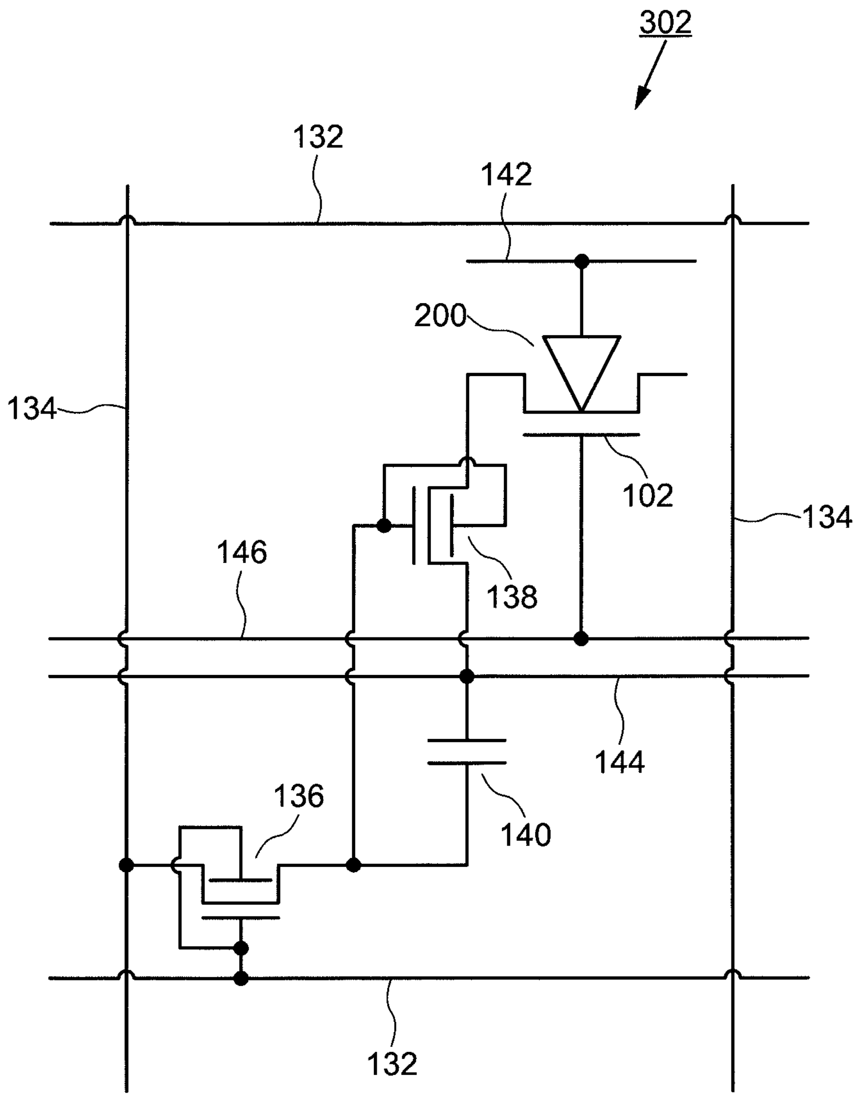
FIG. 10 is a diagram showing an example of an equivalent circuit of a pixel of a display device including an EL element according to an embodiment of the present invention.

FIG. 10 shows an example of an equivalent circuit of a pixel 302 arranged in the display device according to the present embodiment. The pixel 302 includes a select transistor 136, a drive transistor 138, and a capacitive element 140 in addition to the EL element 200. In the select transistor 136, a gate is electrically connected to scan signal line 132, a source is electrically connected to a data signal line 134, and a drain is electrically connected to a gate of the drive transistor 138. In the drive transistor 138, a source is electrically connected to a common potential line 144 and a drain is electrically connected to the second electrode 108 of the EL element 200. The capacitive element 140 is electrically connected between the gate of the drive transistor 138 and the common potential line 144. In the EL element 200, the first electrode 102 is electrically connected to a signal line for controlling the amount of carrier injection 146, and the third electrode 118 is electrically connected to a power line 142. FIG. 10 shows the case where the select transistor 136 and the drive transistor 138 are of a double-gate type.

In an equivalent circuit of the pixel 302 shown in FIG. 10, a scan signal is supplied to the scan signal line 132, and a data signal (video signal) is supplied to the data signal line 134. A power potential (Vdd) is applied to the power line 142, and a ground potential or a potential (Vss) lower than a ground potential (earth potential) is applied to the common potential line 144. A voltage (Vg) for controlling the amount of carriers injected into the light emitting layer 112 is applied to the signal line for controlling the amount of carrier injection 146, as described with reference to FIG. 6. The voltage (Vg) for controlling the amount of carrier injection may be a constant positive voltage or may be a voltage that varies between predetermined voltages Vg1 and Vg2 as shown in FIG. 6 and FIG. 33A to 33D. A sine waveform, a staircase waveform, a trapezoidal waveform, a triangular waveform, or the like is used as the fluctuating potential waveform. Light emission of the EL element 200 can be stopped by bringing the value of the carrier-amount-control signal voltage (Vg) closer to the ground potential. That is, the light emitting period can also be controlled. That is, the signal line for controlling the amount of carrier injection 146 can function as an enable line for controlling light emission (ON) and non-light emission (OFF) of the EL element 200.

In the pixel 302 shown in FIG. 10, a voltage based on the data signal is applied from the data signal line 134 to the gate of the drive transistor 138 when the select transistor 136 is turned on. The capacitive element 140 holds the source-gate voltage of the drive transistor 138. When the drive transistor 138 is turned on, a current flows into the EL element 200 from the power line 142 to emit light. In the case where a voltage (Vg) for controlling the amount of carrier injection is applied to the first electrode 102, not only the emission intensity of the EL element 200 can be controlled, but also the position of an area (in other words, the light emitting area) at which the electrons and the holes in the light emitting layer 112 recombine with each other can be controlled. That is, the carrier balance in the light emitting layer 112 can be controlled.

According to the present embodiment, the light emission state of the EL element can be controlled by forming the pixel 302 in the EL element arranged with the electrode for controlling the amount of carrier injection (the first electrode 102), arranging the signal line for controlling the amount of carrier injection 146, and connecting to the electrode for controlling the amount of carrier injection (the first electrode 102). That is, the recombination area of the holes and the electrons injected into the light emitting layer 112 can be concentrated on the central portion area of the light emitting layer 112 by controlling the light emission of the EL element not only by the drive transistor 138 but by controlling the amount of electrons injected into the light emitting layer 112 by the electrode for controlling the amount of carrier injection (the first electrode 102). As a result, degradation of the EL element can be suppressed, and the reliability of the EL display device can be improved.

Figure 11:
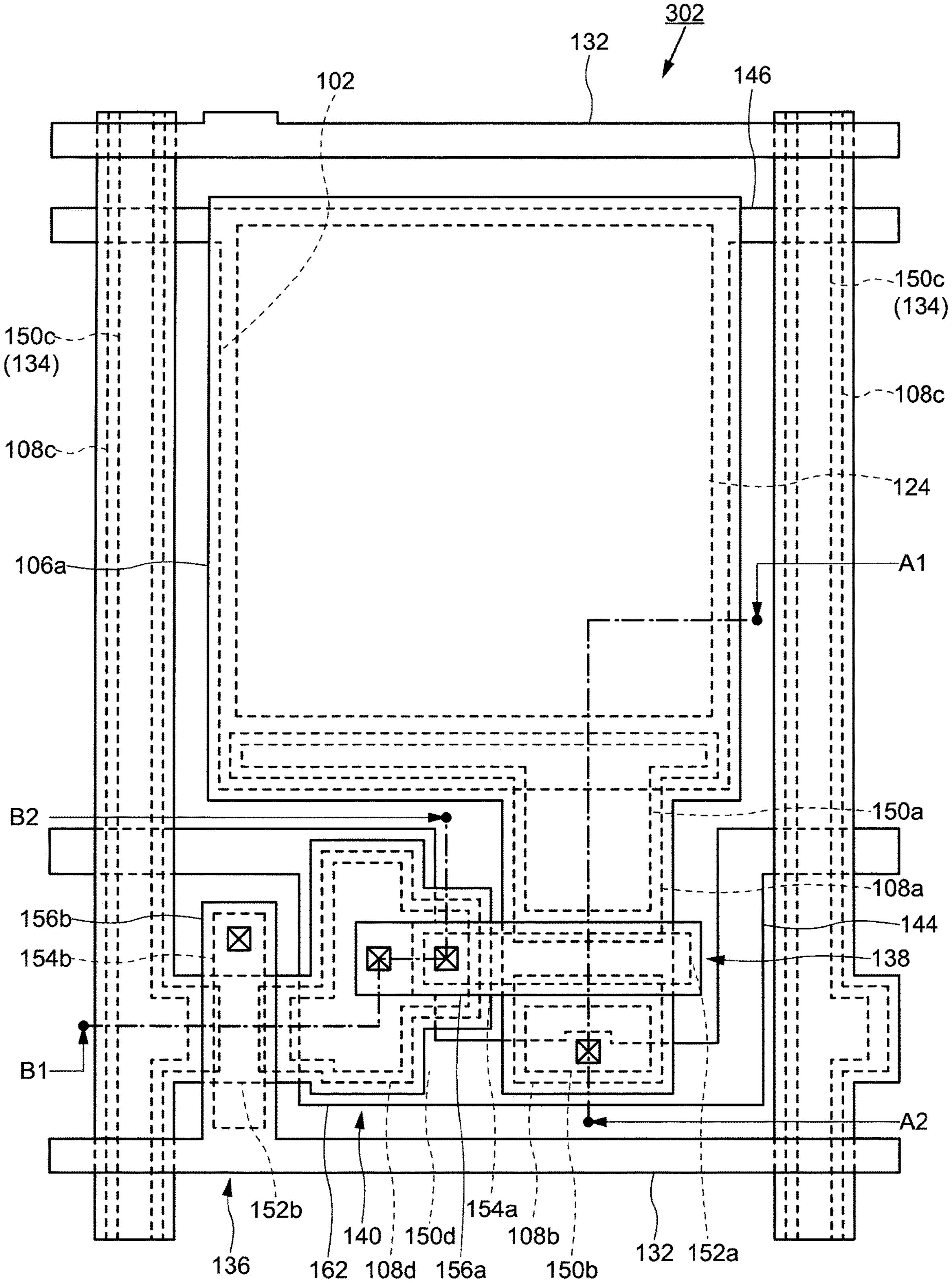
FIG. 11 is a plan view showing a configuration of a pixel of a display device using an EL element according to an embodiment of the present invention.
Figure 12A:
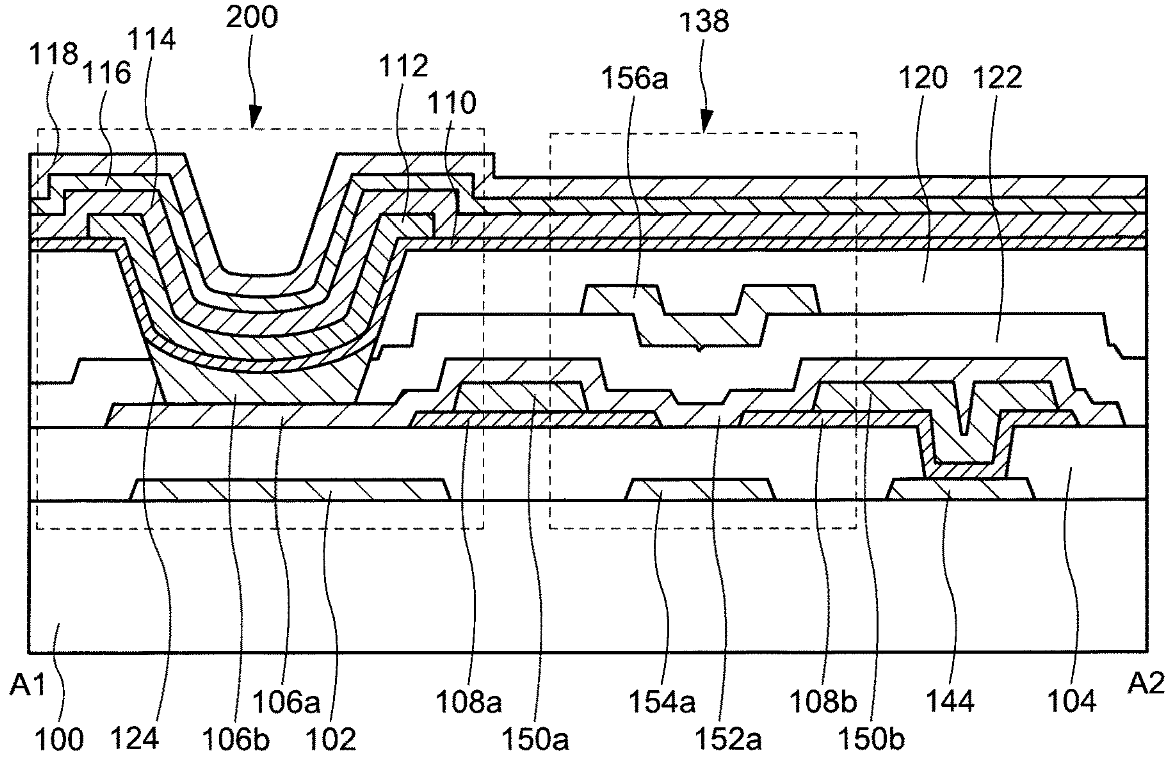
FIG. 12A is a cross-sectional view showing a configuration of a pixel of a display device using an EL element according to an embodiment of the present invention.
Figure 12B:
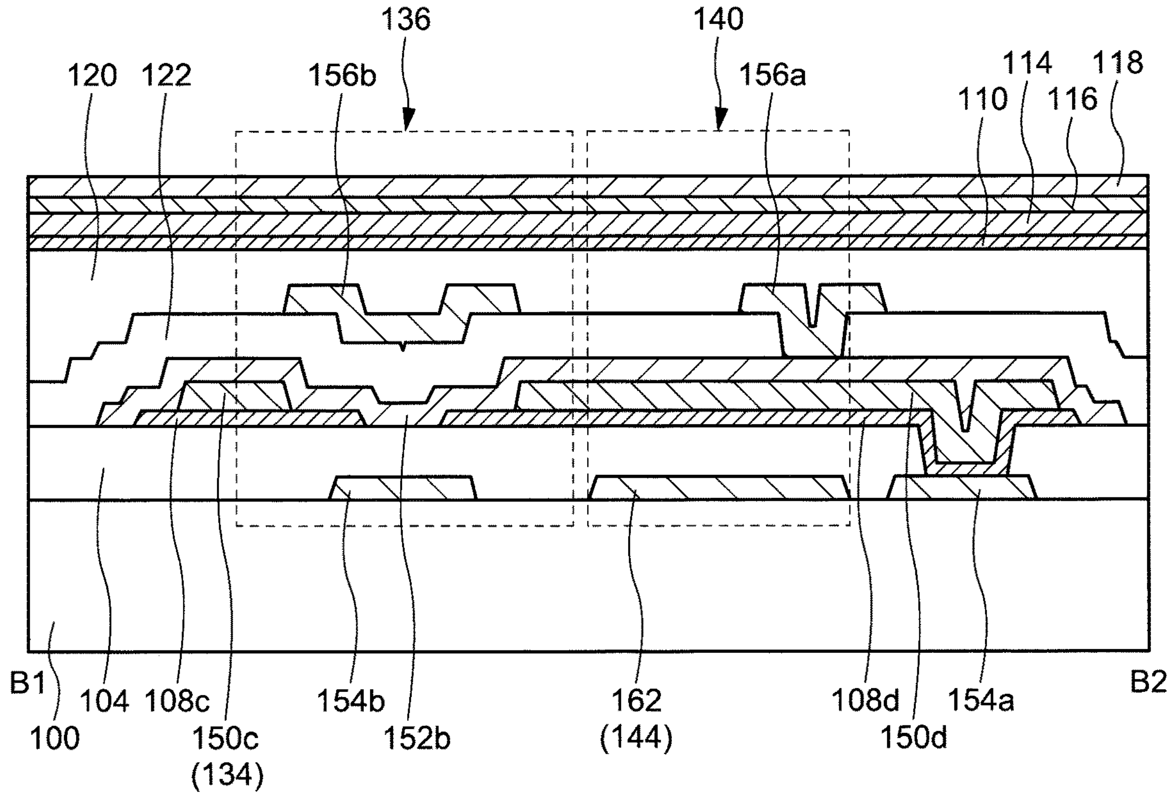
FIG. 12B is a cross-sectional view showing a configuration of a pixel of a display device using an EL element according to an embodiment of the present invention.

FIG. 11 shows a plan view of the pixel 302 of the display device according to the present embodiment. FIG. 12A shows a cross-sectional structure along a line of A1-A2 shown in FIG. 11, and FIG. 12B shows a cross-sectional structure along a line of B1-B2 shown in FIG. 11. In the following description, reference is made to these drawings.

In the pixel 302, the select transistor 136, the drive transistor 138, the capacitive element 140, and the EL element 200 are arranged. In a plan view of the pixel 302 shown in FIG. 11, the arrangement of the first electrode 102, the first electron transport layer 106*a*, and the opening 124 is shown as the components of the EL element 200.

The drive transistor 138 includes a first oxide semiconductor layer 152*a*, a first gate electrode 154*a*, and a second gate electrode 156*a*. The first gate electrode 154*a* and the second gate electrode 156*a* are arranged so as to have an area overlapping with each other with the first oxide semiconductor layer 152*a* interposed therebetween. The first insulating layer 104 is arranged between the first oxide semiconductor layer 152*a* and the substrate 100. The first gate electrode 154*a* is arranged between the first insulating layer 104 and the substrate 100. In addition, the third insulating layer 122 is arranged between the first oxide semiconductor layer 152*a* and the second gate electrode 156*a*. In other words, the first oxide semiconductor layer 152*a* is arranged between the first insulating layer 104 and the third insulating layer 122, and the first insulating layer 104, the first oxide semiconductor layer 152*a*, and the third insulating layer 122 are interposed between the first gate electrode 154*a* and the second gate electrode 156*a*.

In the present embodiment, the drive transistor 138 has a double-gate structure in which the first oxide semiconductor layer 152*a* is sandwiched between the first gate electrode 154*a* and the second gate electrode 156*a*. In the drive transistor 138, a channel area is formed in an area where the first oxide semiconductor layer 152*a* overlaps with one or both of the first gate electrode 154*a* and the second gate electrode 156*a*. In the first oxide semiconductor layer 152*a*, the carrier concentration of the area as the channel area is preferably $1\times10^{14}$ to $5\times10^{18}/cm^3$.

In the drive transistor 138, the second electrode 108*a* and the second electrode 108*b* are arranged between the first oxide semiconductor layer 152*a* and the first insulating layer 104. The second electrode 108*a* and the second electrode 108*b* are arranged apart from each other. The second electrode 108*a* and the second electrode 108*b* are arranged so as to be in contact with the first oxide semiconductor layer 152*a*, thereby functioning as a source area and a drain area. In addition, a conductive layer 150*a* is arranged between the second electrode 108*a* and the first oxide semiconductor layer 152*a*, and a conductive layer 150*b* is arranged between the second electrode 108*b* and the first oxide semiconductor layer 152*a*. The conductive layer 150*a* is arranged inside the second electrode 108*a* which does not reach the end portion, and the conductive layer 150*b* is arranged inside the second electrode 108*b* which does not reach the end portion.

The first gate electrode 154*a* and the second gate electrode 156*a* are arranged so as to overlap with each other at an area where the second electrode 108*a* and the second electrode 108*b* are separated from each other. The second electrode 108*a* and the second electrode 108*b* may be arranged such that a part of area overlaps one or both of the first gate electrode 154*a* and the second gate electrode 156*a*. At least one of the second electrodes 108*a* and 108*b* may be arranged so as to overlap with one or both of the first gate electrode 154*a* and the second gate electrode 156*a* so as to adjacent to the channel area of the first oxide semiconductor layer 152*a*, thereby increasing the drain current of the drive transistor 138. Also, the first gate electrode 154*a* is arranged in the same layer-structure as the common potential line 144.

As shown in FIG. 12B, the select transistor 136 has a structure similar to that of the drive transistor 138. That is, the select transistor 136 includes a second oxide semiconductor layer 152*b*, a first gate electrode 154*b*, and a second gate electrode 156*b*. In addition, a second electrode 108*c* and a conductive layer 150*c*, and the second electrode 108*d* and a conductive layer 150*d* are included in contact with the second oxide semiconductor layer 152*b*. The second electrode 108*c* and the second electrode 108*d* are arranged apart from each other. The second electrode 108*c* and the second electrode 108*d* are arranged so as to be in contact with the second oxide semiconductor layer 152*b*, thereby functioning as a source area and a drain area. The conductive layer 150*c* forms the data signal line 134.

The capacitive element 140 is formed in an area where the second 108*d* overlaps with a capacitance electrode 162 via the first insulating layer 104. The capacitance electrode 162 is also formed as the common potential line 144.

Also, in the present embodiment, the oxide semiconductor layer 152 may be made of the same material as the oxide semiconductor material of the first electron transport layer 106*a* described in the first embodiment. In addition, an inorganic insulating material is used as the first insulating layer 104 and the third insulating layer 122. Examples of the inorganic insulating material include silicon oxide, silicon nitride, silicon oxynitride, and aluminum oxide.

The EL element 200 has a similar configuration as that shown in the first embodiment. The EL element 200 is electrically connected to the drive transistor 138. In the EL element 200, an area corresponding to the second electrode 108 is contiguously formed from the drive transistor 138. With such a configuration, the routing of wirings is simplified, and the opening ratio of the pixel 302 (the ratio of the area where the EL element actually emits light with respect to the area occupied by one pixel) can be increased.

Also, in order to increase the opening ratio of the pixel, the electron mobility of the first electron transport layer 106*a* needs to be increased. For example, a pixel pitch in an 85-inch display panel with a resolution of 8K×4K (7680×4320 pixels) is about 244 μm. In this case, when a rectangular pixel is assumed, the length in the longitudinal direction is about 732 μm. When it is assumed that the time from the application of the voltage to the EL element until the light emission is about 4 to 5 μsec, and in the case where an area corresponding to the second electrode 108 is arranged at one end in the longitudinal direction of the rectangular pixel, the carrier (electron) mobility of the first electron transport layer 106*a* is 10 $cm^2$/V·sec or more, preferably 20 $cm^2$/V·sec or more, otherwise it is difficult for carriers (electrons) to reach the other end in the longitudinal direction of the pixel.

Of course, if the area corresponding to the second electrode 108 is arranged so as to surround the four sides of the rectangular pixel, the carrier drifts from the four sides toward the center, so that the carrier (electron) mobility may be about 2.5 $cm^2$/V·sec. However, in this case, the effective light emitting area per pixel is reduced, and the opening rate is lowered.

Under such circumstances, the oxide semiconductor material as exemplified in the present embodiment can realize the required carrier (electron) mobility. On the other hand, the electron transport layers formed of the organic materials as described in Japanese laid-open patent publication No. 2007-149922 and Japanese laid-open patent publication No. 2007-157871 have a carrier (electron) mobility of 2.5 $cm^2$/V·sec or less, and therefore cannot realize a large-screen and high-definition display panel. In the case of a tin (Sn)-based oxide semiconductor TFT, since the electron mobility can be 20 $cm^2$/V·sec or more, the opening rate can be increased even in the bottom-emission type, and the life of the EL element can be prolonged.

As described above, the display device according to the present embodiment can be manufactured through the same manufacturing process as elements such as the drive transistor and the select transistor manufactured using the oxide semiconductor layer by using the oxide semiconductor layer as the electron transport layer for forming the EL element. In addition, in the display device according to the present embodiment, an electrode for controlling the amount of carrier injection is arranged in the EL element, and an electron transport layer with a high carrier (electron) mobility is arranged with respect to the electrode for controlling the amount of carrier injection via an insulating layer, so that the emission intensity in the pixel plane can be made uniform and high definition can be achieved.

FIG. 12A and FIG. 12B show a cross-sectional structure of the pixel 302 shown in FIG. 11. FIG. 12A shows a cross-sectional structure along a line of A1-A2 shown in FIG. 11, and FIG. 12B shows a cross-sectional structure along a line of B1-B2. The EL element 200 is arranged such that the second electrode 108 is in contact with the lower layer of the first electron transport layer 106*a*. In the EL element 200, an area corresponding to the second electrode 108 is contiguously formed from the drive transistor 138. The drive transistor 138 and the select transistor 136 have a bottom contact structure in which the second electrodes 108*a*, 108*b*, 108*c*, and 108*d* are arranged in contact with the lower layer of the first oxide semiconductor layer 152*a* and the second oxide semiconductor layer 152*b* in which the channel is formed. The drive transistor 138 and the select transistor 136 have a double-gate structure in which the first gate electrodes 154*a*, 154*b* and the second gate electrodes 156*a*, 156*b* are arranged so as to sandwich the first oxide semiconductor layer 152*a* and the second oxide semiconductor layer 152*b*.

As shown in FIG. 12A, the first electron transport layer 106*a* of the EL element 200 may be arranged so as to be contiguous with the first oxide semiconductor layer 152*a* of the drive transistor 138. The first electron transport layer 106*a* may be formed of an oxide semiconductor material, so that it can be formed using the same layer as the first electron transport layer 152*a* arranged for the drive transistor 138. Also, the present embodiment is not limited to the structure shown in FIG. 12A, and the first electron transport layer 106*a* and the first oxide semiconductor layer 152*a* may be separated from each other or may be formed of different layers.

Figure 23:
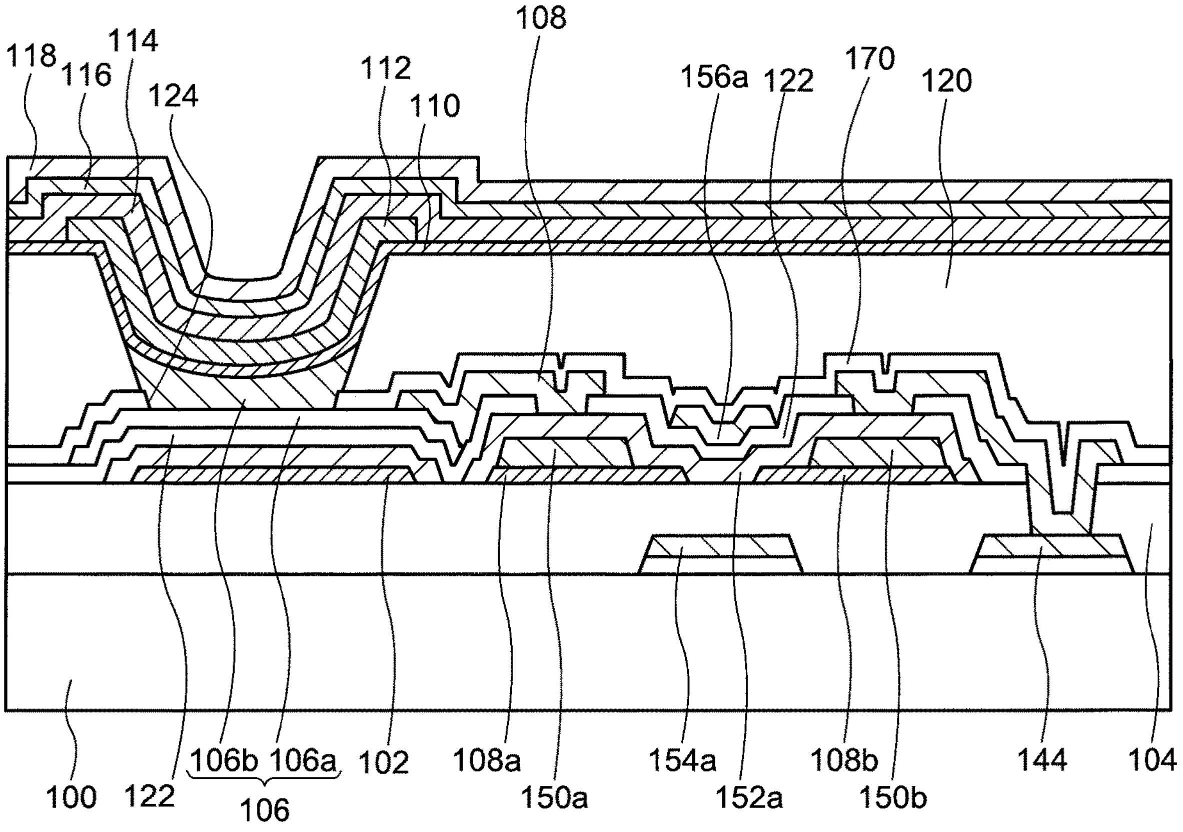
FIG. 23 is a cross-sectional view showing a structure of an EL element according to an embodiment of the present invention.
Figure 24:
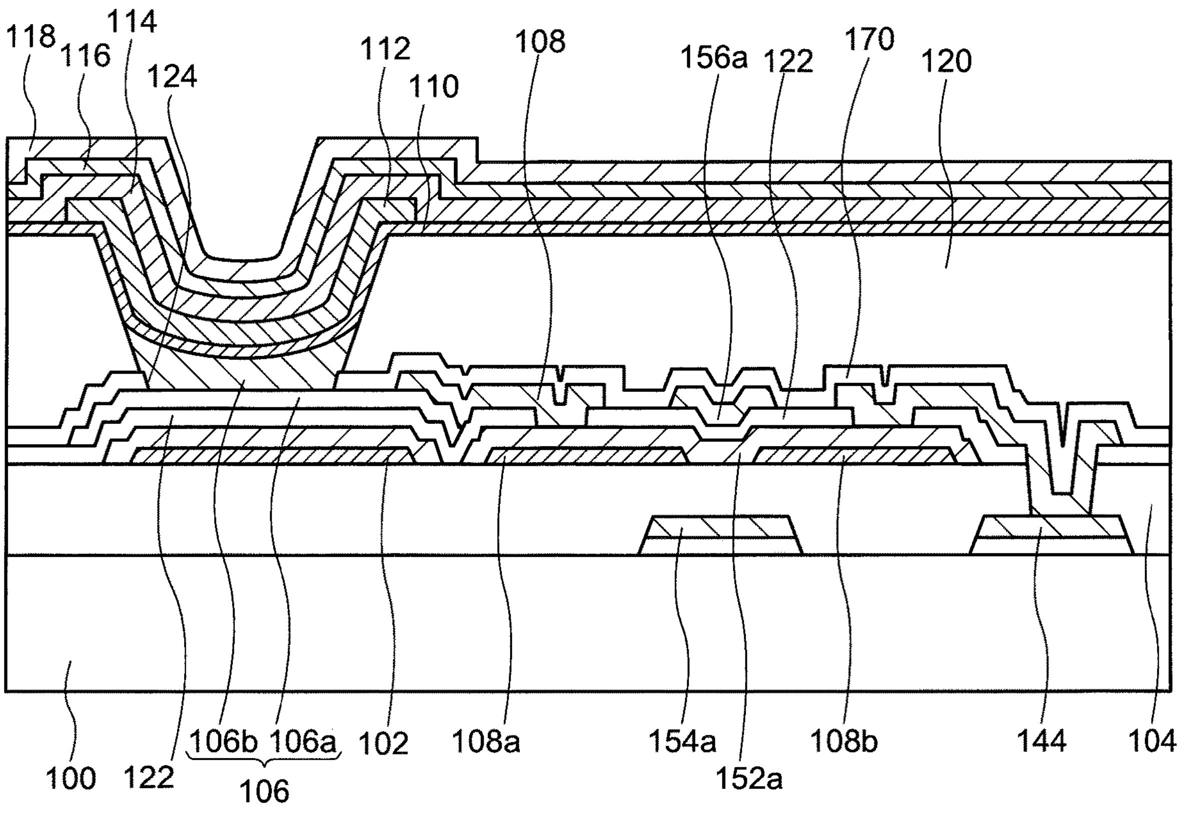
FIG. 24 is a cross-sectional view showing a structure of an EL element according to an embodiment of the present invention.

In cross-sectional view of FIG. 23 and FIG. 24, the first electron transport layer 106*a* and the first oxide semiconductor layer 152*a* are completely separated and formed in different layers. The EL element of FIG. 23 and FIG. 24 is classified into an EL element 200*c* of FIG. 13. The first electrode (electrode for controlling the amount of carrier injection) 102 of the EL element of FIG. 23 and FIG. 24 is formed of the same material in the same layer as the source electrode and drain electrode of the transistor element for driving the EL element. The first electron transport layer 106*a* is formed on the third insulating layer 122. Different materials can be used for the first electron transport layer 106*a* and the first oxide semiconductor layer 152*a* of the transistor element for driving the EL element in the EL element structure of FIG. 23 and FIG. 24, and materials suitable for each of them can be freely selected. Although there is a disadvantage in that the number of photolithography processes is increased by one, there is an advantage in that the performance of the EL element can be improved. In FIG. 23 and FIG. 24, the second electrode (cathode) 108 and the second gate electrode 156*a* of a driving transistor element are formed of the same material and simultaneously in the same layer. Although not shown in this drawing, the data signal line 134 connected to a select transistor element is also formed of the same material and simultaneously in the same layer as the second electrode (cathode) 108 and the second gate electrode 156*a* of the driving transistor element. This is the same structure as a cross-sectional view shown in FIG. 25B.

The drive transistor 138 and the select transistor 136 in FIG. 12A are covered by the third insulating layer 122 and the second insulating layer 120. The opening 124 that penetrates the second insulating layer 120 and the third insulating layer 122 and exposes the first electron transport layer 106*a* is arranged in an area where the EL element 200 is arranged. When the second electron transport layer 106*b* is formed by the coating method, the drive transistor 138 and the select transistor 136 are covered by the second insulating layer 120 and the third insulating layer 122, and therefore, the coating film is prevented from being directly attached. The pixel 302 having such a configuration can prevent degradation in the manufacturing process of the drive transistor 138 and the select transistor 136. When the second electron transport layer 106*b* formed by the coating method is heat-burning, the select transistor 136 and the drive transistor 138 can also be annealed at the same time, and therefore, the cost can be reduced.

As described above, according to the present embodiment, it is possible to obtain a display device including the pixel 302 using the EL element 200 shown in the first embodiment. Further, according to the present embodiment, since the EL element 200 has a configuration in which a short-circuit defect is less likely to occur, it is possible to provide a high-quality display device with few pixel defects.

Third Embodiment

Figure 13:
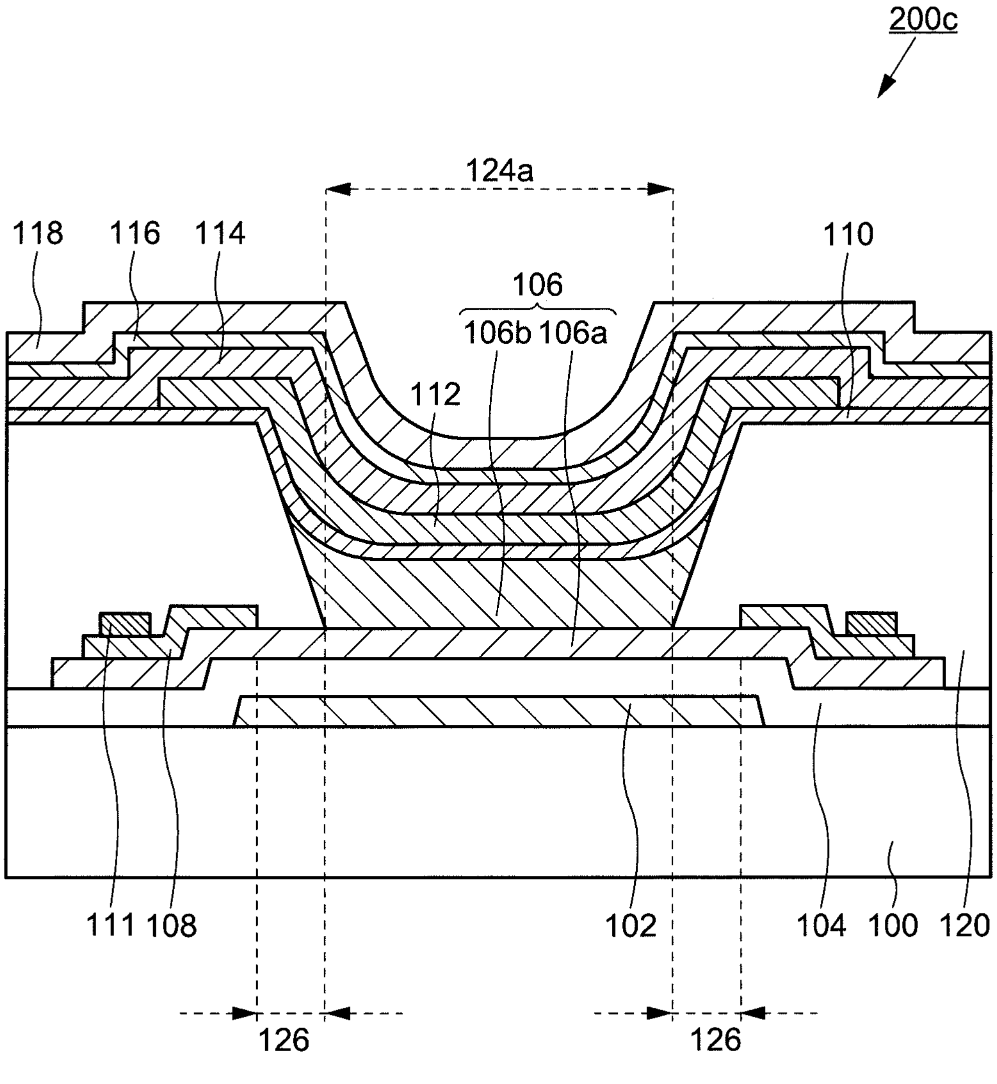
FIG. 13 is a cross-sectional view showing a structure of an EL element according to an embodiment of the present invention.
Figure 14:
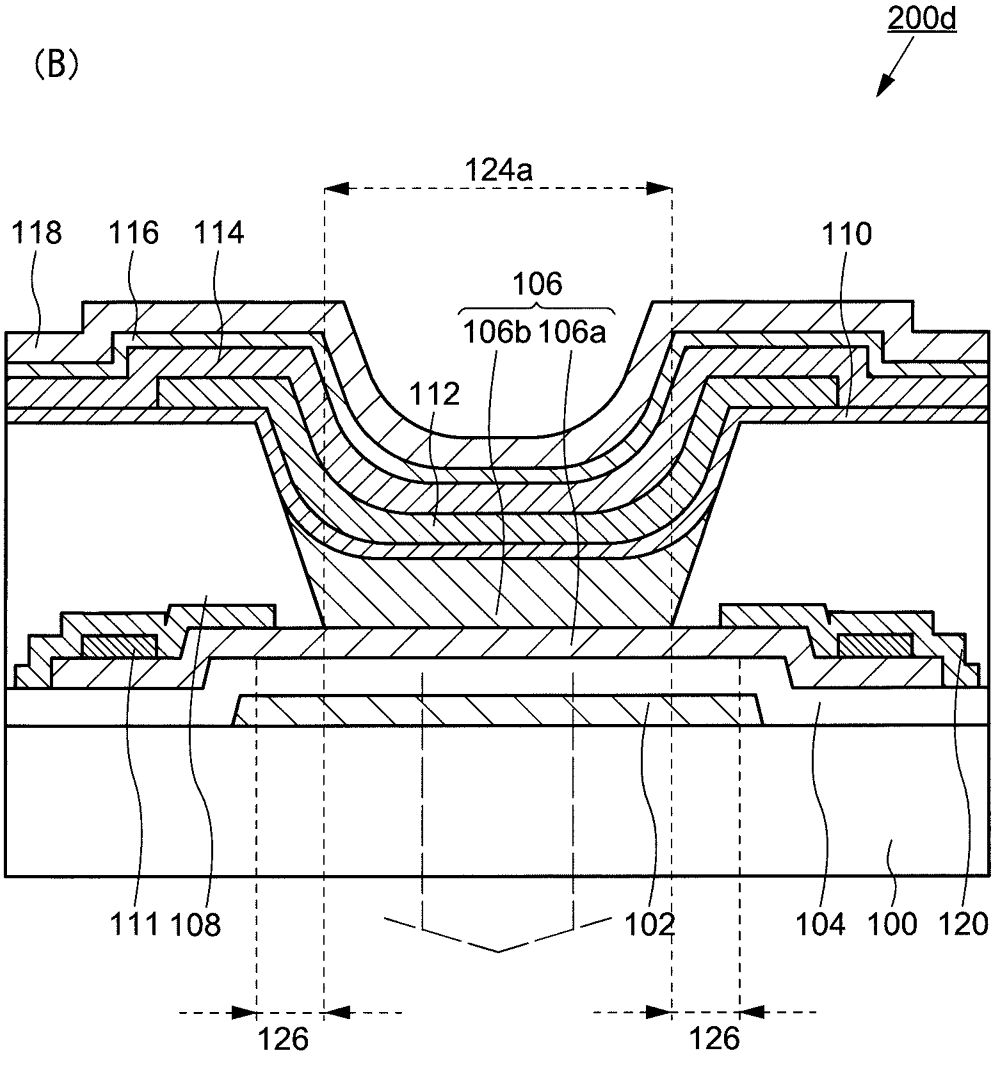
FIG. 14 is a cross-sectional view showing a structure of an EL element according to an embodiment of the present invention.

FIG. 13 and FIG. 14 show EL elements having cathode structures different from the EL element shown in the first embodiment. In the following description, portions different from those of the first embodiment will be described, and description of common portions will be omitted.

FIG. 13 shows a cross-sectional structure of the EL element 200*c* according to another embodiment of the present invention. The EL element 200*c* is different from the EL element described in the first embodiment in that the second electrode 108 is arranged in contact with the upper layer of the first electron transport layer 106*a*. The first electron transport layer 106*a* includes an area that overlaps with the second electron transport layer 106*b*, the electron injection layer 110, the light emitting layer 112, and the third electrode 118 via the opening 124, and further includes, an area that does not overlap with the second electron transport layer 106*b* on the outer side of the area. The second electrode 108 is arranged in an area where the second electron transport layer 106*a* does not overlap with the second electron transport layer 106*b*, that is, in an area between the end portion of the first electron transport layer 106 and the end portion of the second electron transport layer 106*b*. The second electrode 108 is arranged on a surface of the first electron transport layer 106*a* opposite to the side of the first insulating layer 104. Further, the wiring 111 may be arranged in contact with the second electrode 108. The wiring 111 is arranged between the second electrode 108 and the second insulating layer 120. However, the present invention is not limited thereto, and as shown in FIG. 14, the wiring 111 may be arranged between the second electrode 108 and the first electron transport layer 106*a*.

The contact area can be increased by arranging the second electrode 108 in contact with the surface of the first electron transport layer 106*a* of the EL element 200*c*. As a result, the series resistance component of the EL element 200*c* is reduced and the drive voltage can be lowered. In addition, the EL element 200*c* can reduce the current density flowing into the second electrode 108.

In the EL element 200*c*, an area corresponding to the second electrode 108 is contiguously formed from the drive transistor 138. That is, although not shown in the drawings, the drive transistor 138 and the select transistor 136 may have a top-contact structure in which the second electrodes 108*a*, 108*b*, 108*c*, and 108*d* are arranged in contact with the upper layer of the first oxide semiconductor layer 152*a* and the second oxide semiconductor layer 152*b* in which the channels are formed.

The EL element 200*c* and an EL element 200*d* are the same as those of the first embodiment except that the second electrode 108 has the top contact structure. In addition, the EL element 200*c* and the EL element 200*d* can be replaced with the EL element 200 shown in FIG. 12A.

Fourth Embodiment

Figure 15A:
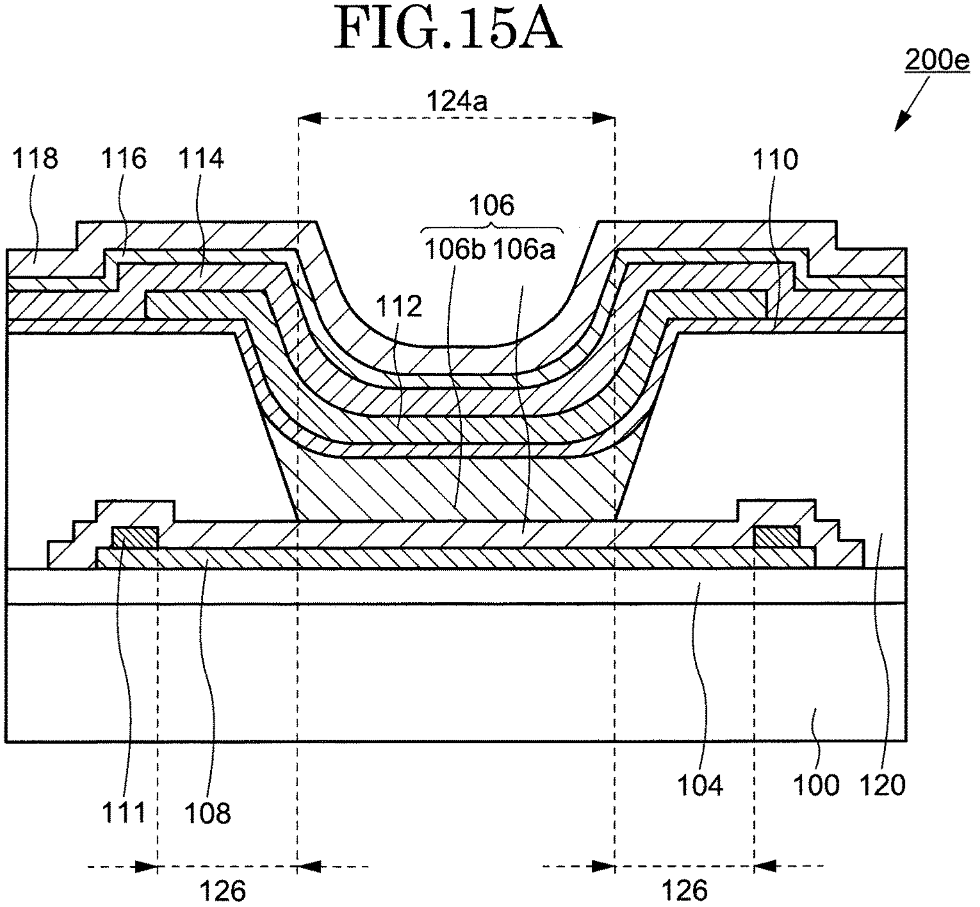
FIG. 15A is a cross-sectional view showing a structure of an EL element according to an embodiment of the present invention.
Figure 15B:
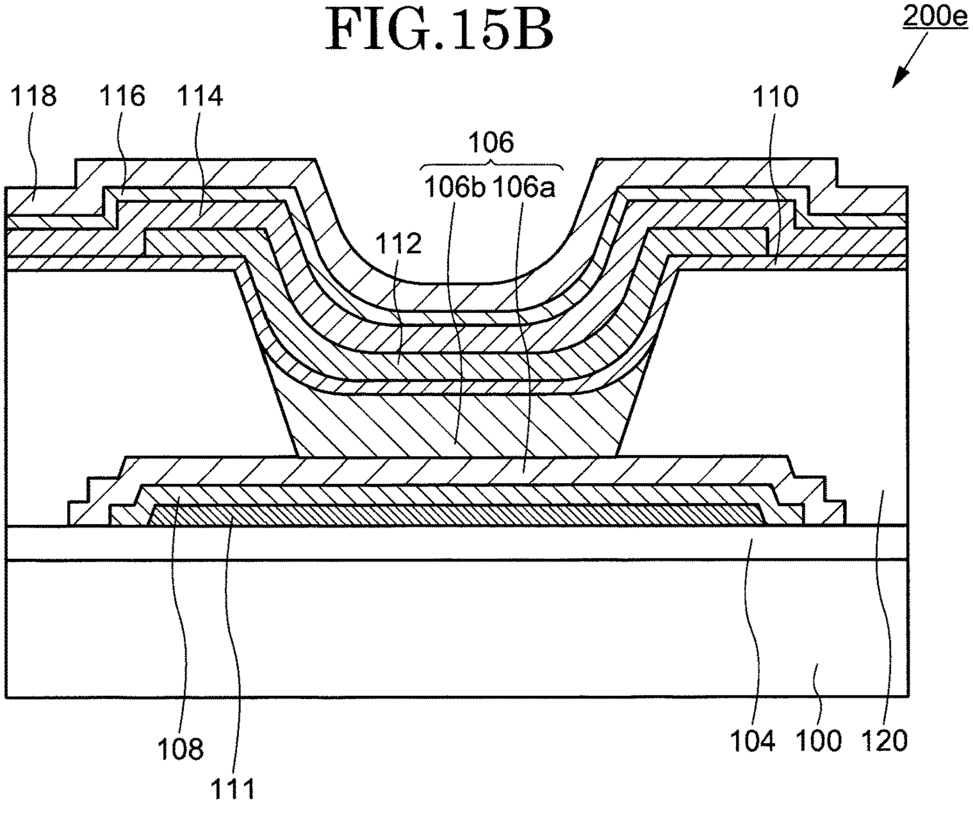
FIG. 15B is a cross-sectional view showing a structure of an EL element according to an embodiment of the present invention.

FIGS. 15A and 15B shows an EL element having no first electrode and having a different cathode configuration from the EL element shown in the first embodiment. In the following description, portions different from those of the first embodiment will be described, and description of common portions will be omitted.

FIG. 15A shows a cross-sectional structure of an EL element 200*e* according to another embodiment of the present invention. The EL element 200*e* is different from the EL element shown in the first embodiment in that the first electrode 102 is not arranged. Although the first electron transport layer 106*a* is arranged on the second electrode 108, the wiring 111 may not be arranged. The first electron transport layer 106*a* is arranged on the lower layer side of the second insulating layer 120 and exposed by the opening 124 of the second insulating layer 120. The second electron transport layer 106*b* is in contact with the first electron transport layer 106*a* in the opening 124. The outer end portion of the first electron transport layer 106*a* is arranged on the outer side of the area 124*a* where the opening 124 of the second insulating layer 120 is arranged. As a result, the first electron transport layer 106*a* includes an area that overlaps with the second electron transport layer 106*b*, the electron injection layer 110, the light emitting layer 112, and the third electrode 118 via the opening 124, and further includes an area that does not overlap with the second electron transport layer 106*b* on the outer side of the area. The end portion of the second electrode 108 is arranged in an area where the first electron transport layer 106*a* does not overlap with the second electron transport layer 106*b*, that is, in an area between the end portion of the first electron transport layer 106*a* and the end portion of the second electron transport layer 106*b*. The wiring 111 may be arranged between the second electrode 108 and the first insulating layer 104. The wiring 111 is arranged in an outer peripheral portion that is apart from the periphery of the area 124*a* where the opening 124 is arranged by the offset area 126.

The contact area can be increased by arranging the first electron transport layer 106*a* in contact with the surface of the second electrode 108 of the EL element 200*e*. As a result, the series resistance component of the EL element 200*e* is reduced and the drive voltage can be lowered. In addition, the EL element 200*e* can reduce the current density flowing into the second electrode 108.

In the EL element 200*e* shown in FIG. 15A, a transparent conductive film formed of indium-tin oxide ($In_2O_3 \cdot SnO_2$: ITO) or the like is used as the second electrode 108. That is, the EL element 200*e* may have a configuration in which the first electron transport layer 106*a* is in direct contact with the second electrode 108 formed of the transparent conductive film. In the EL element 200*e*, even if the second electrode 108 is replaced with a transparent conductive film, since the electron transport layer 106 is made thick by the two-layer stacked structure of the first electron transport layer 106*a* and the second electron transport layer 106*b*, a short circuit can be prevented, and an electrically stable structure can be obtained.

Figure 25A:
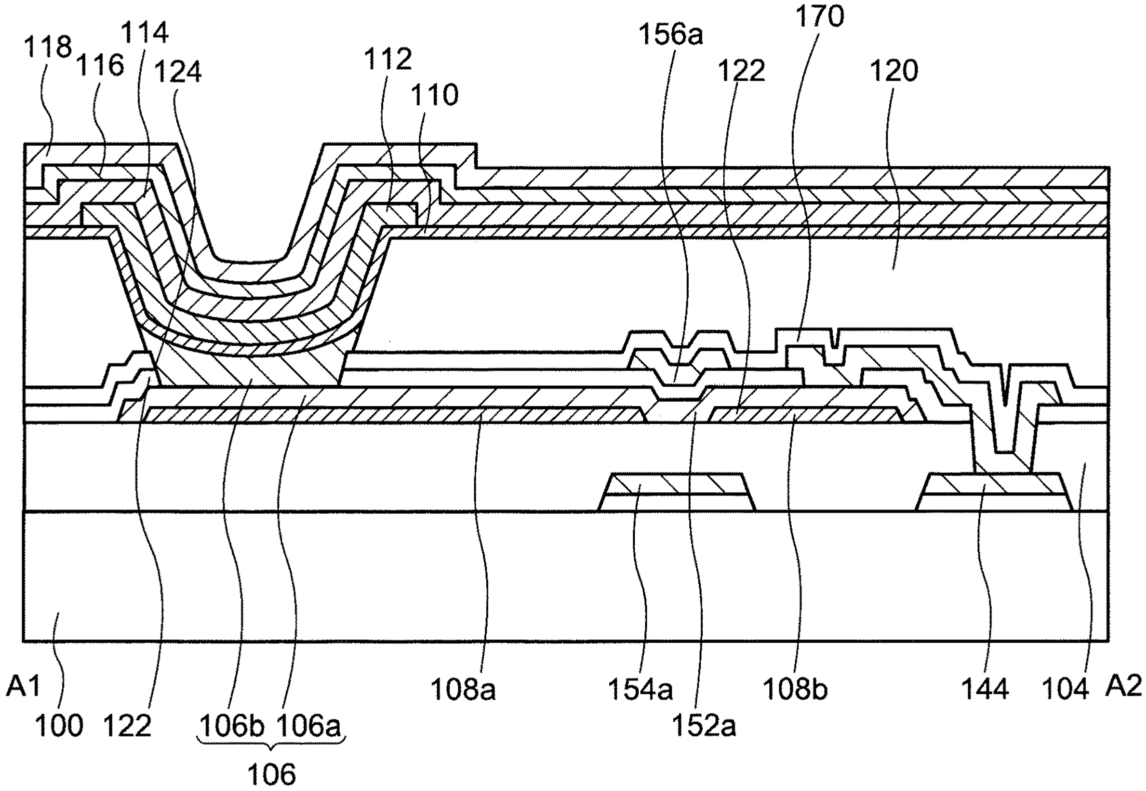
FIG. 25A is a cross-sectional view showing a configuration of a pixel of a display device using an EL element according to an embodiment of the present invention.
Figure 25B:
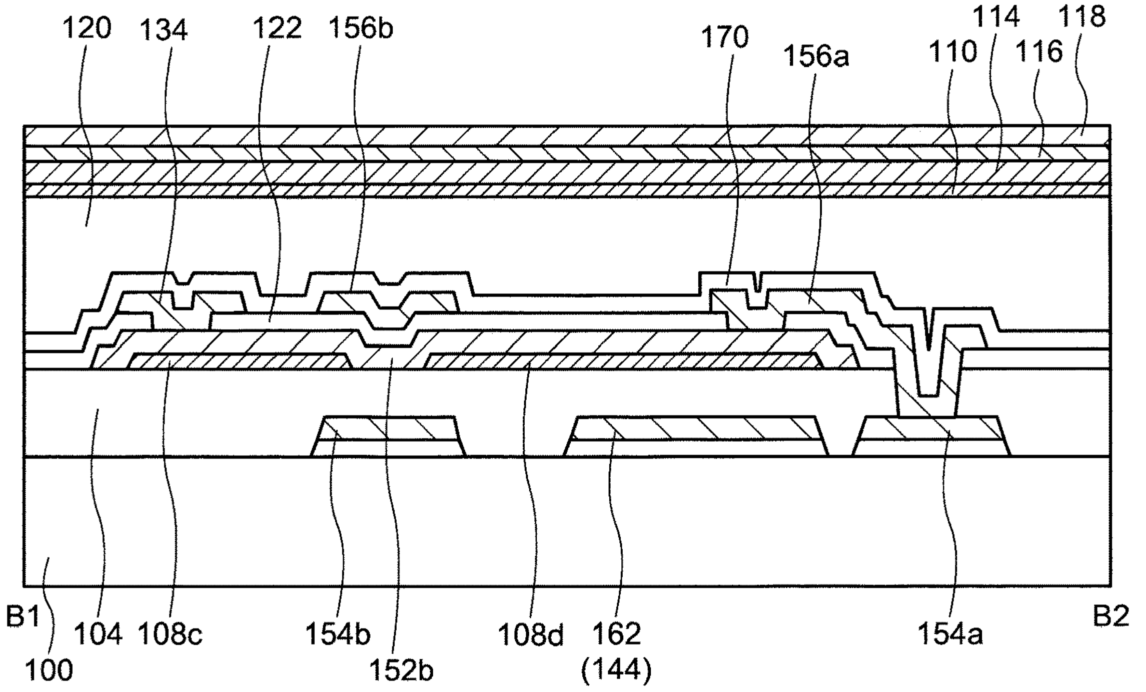
FIG. 25B is a cross-sectional view showing a configuration of a pixel of a display device using an EL element according to an embodiment of the present invention.
Figure 26:
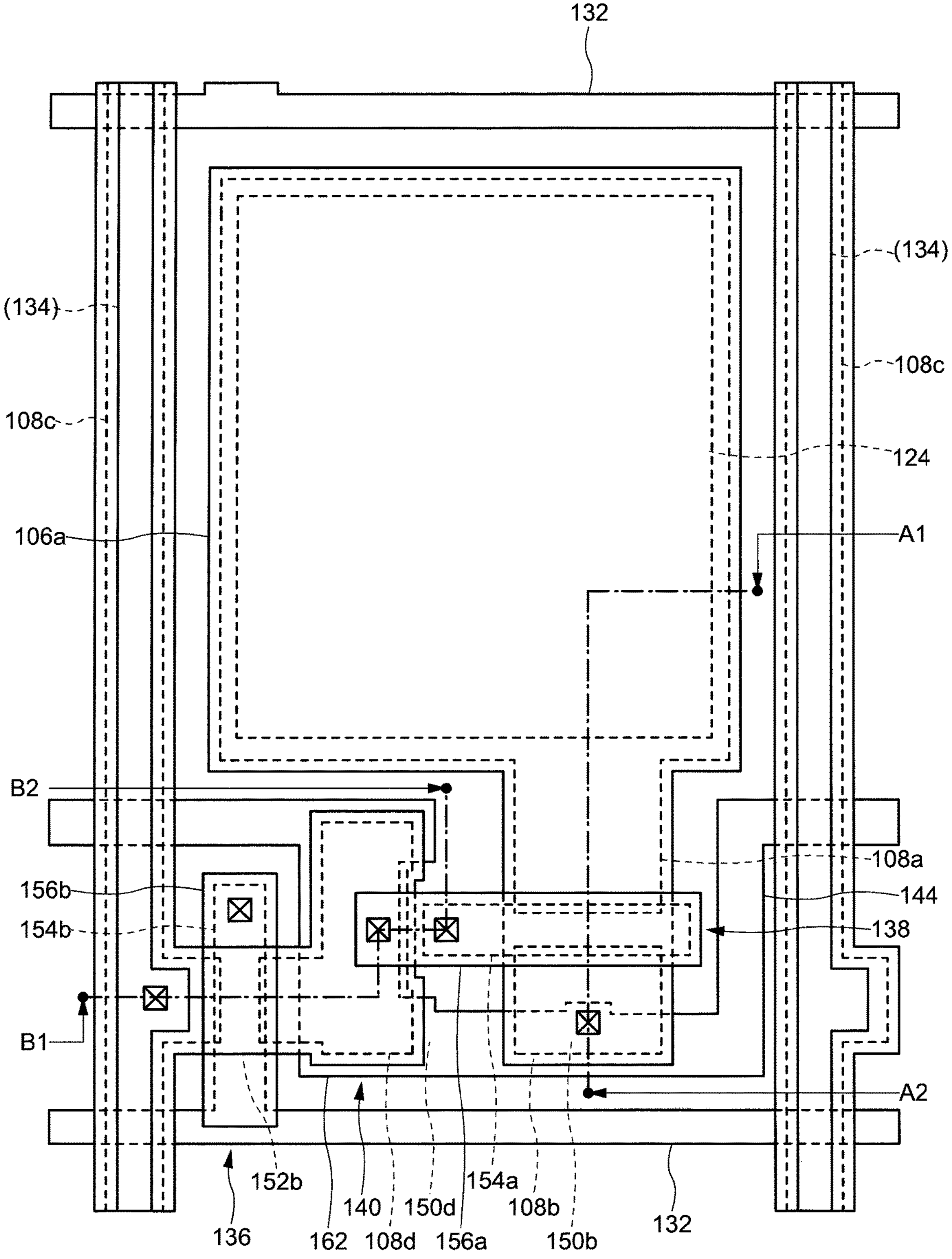
FIG. 26 is a plan view showing a configuration of a pixel of a display device using an EL element according to an embodiment of the present invention.
Figure 27:
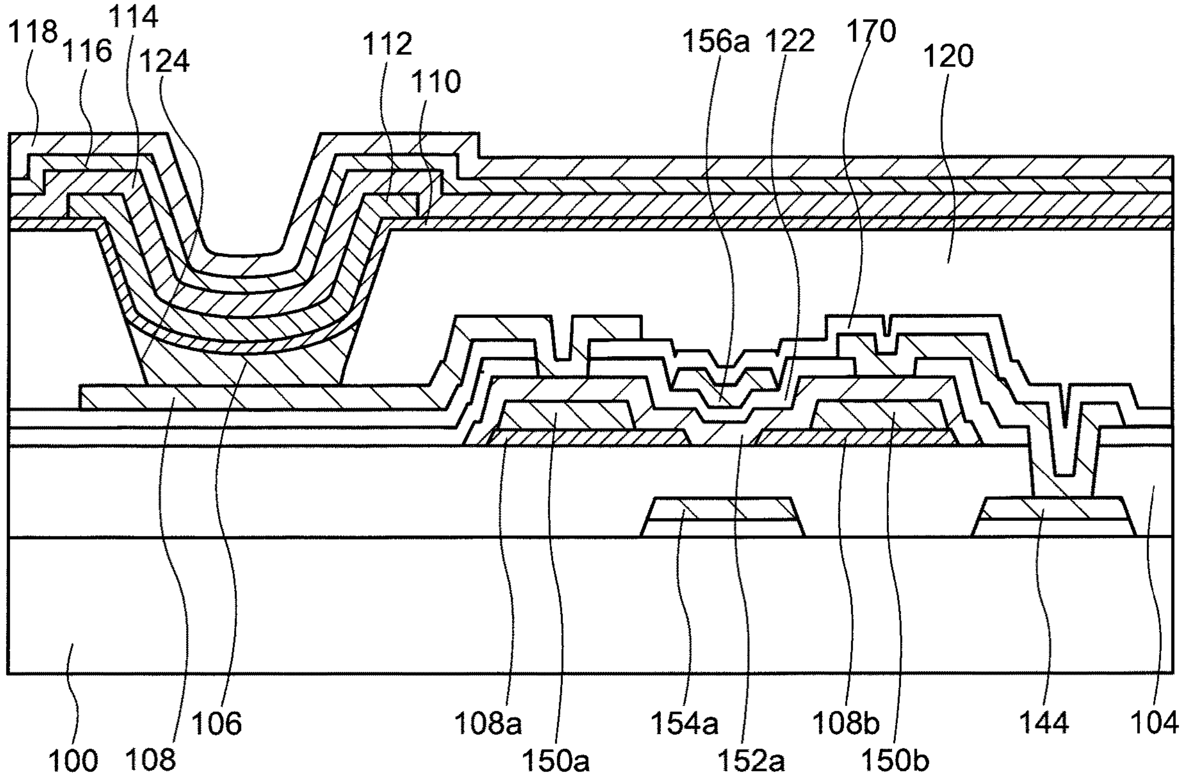
FIG. 27 is a cross-sectional view showing a structure of an EL element according to an embodiment of the present invention.
Figure 28:
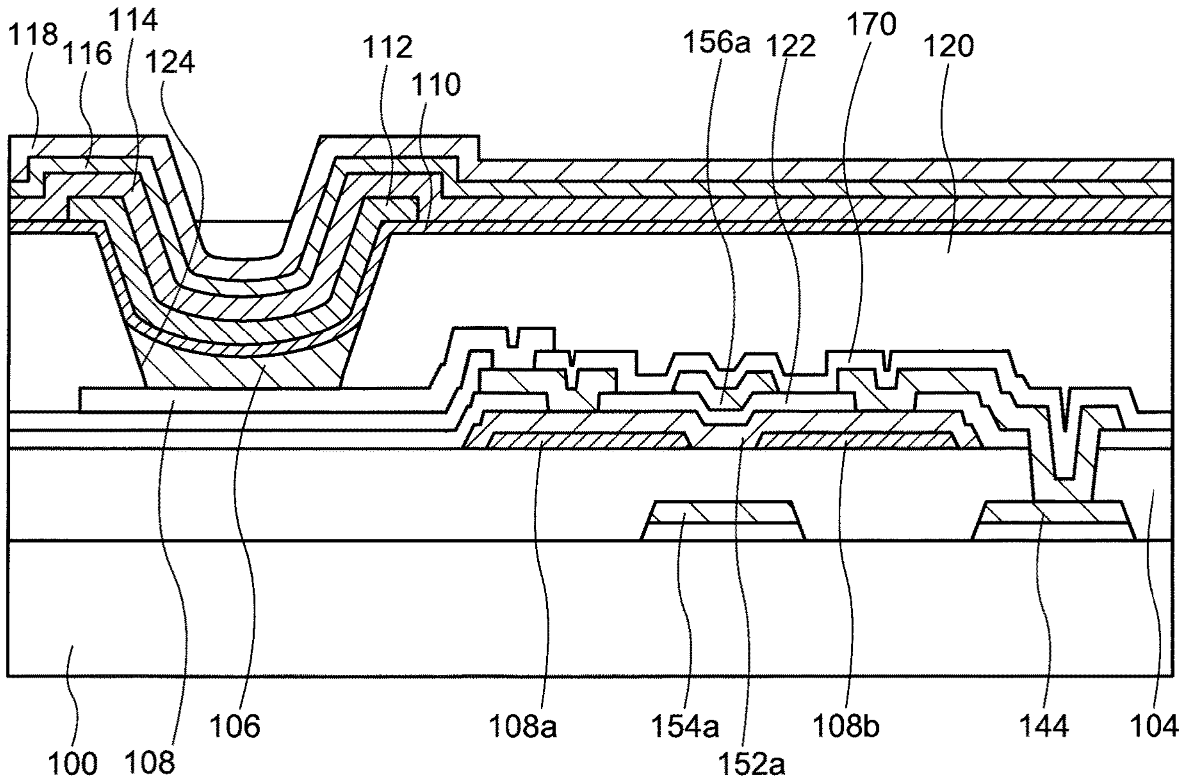
FIG. 28 is a cross-sectional view showing a structure of an EL element according to an embodiment of the present invention.
Figure 29:
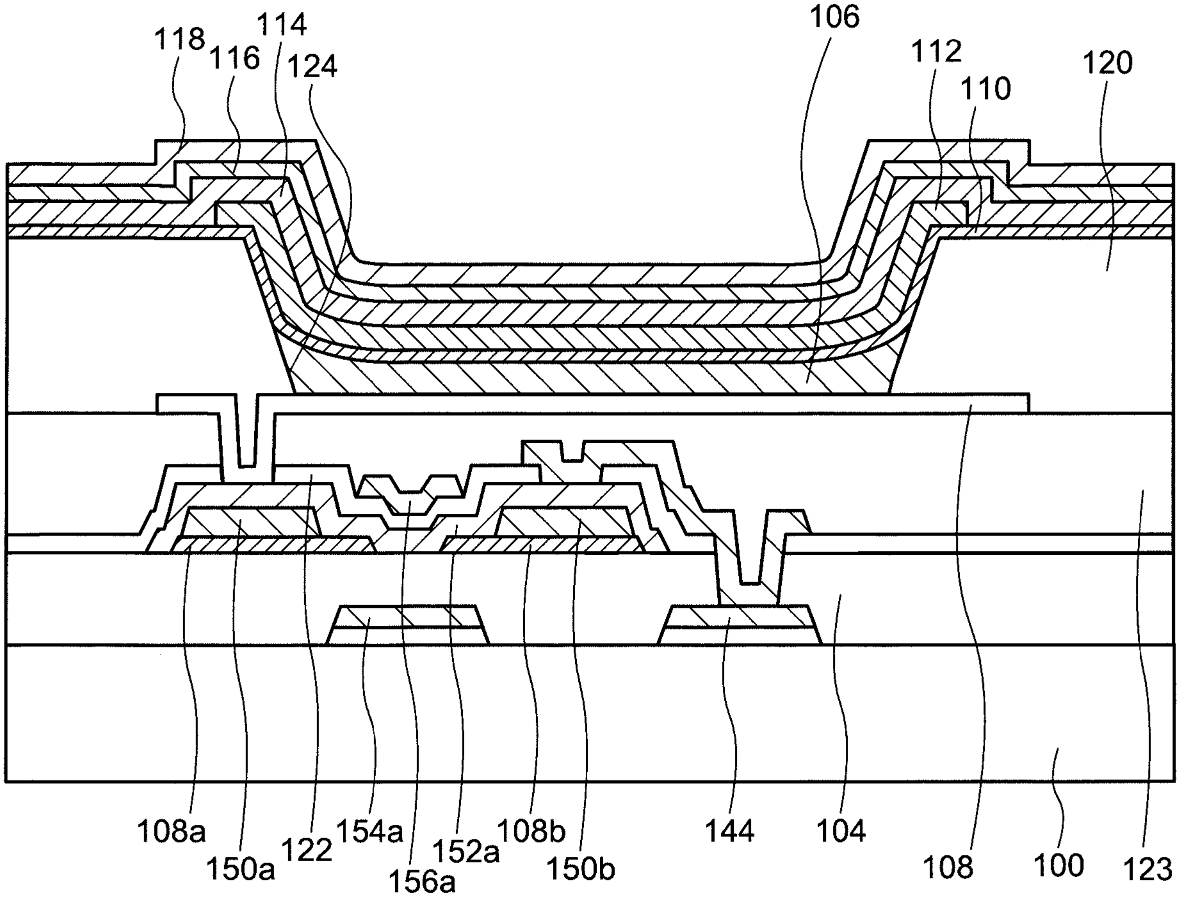
FIG. 29 is a cross-sectional view showing a structure of an EL element according to an embodiment of the present invention.
Figure 30:
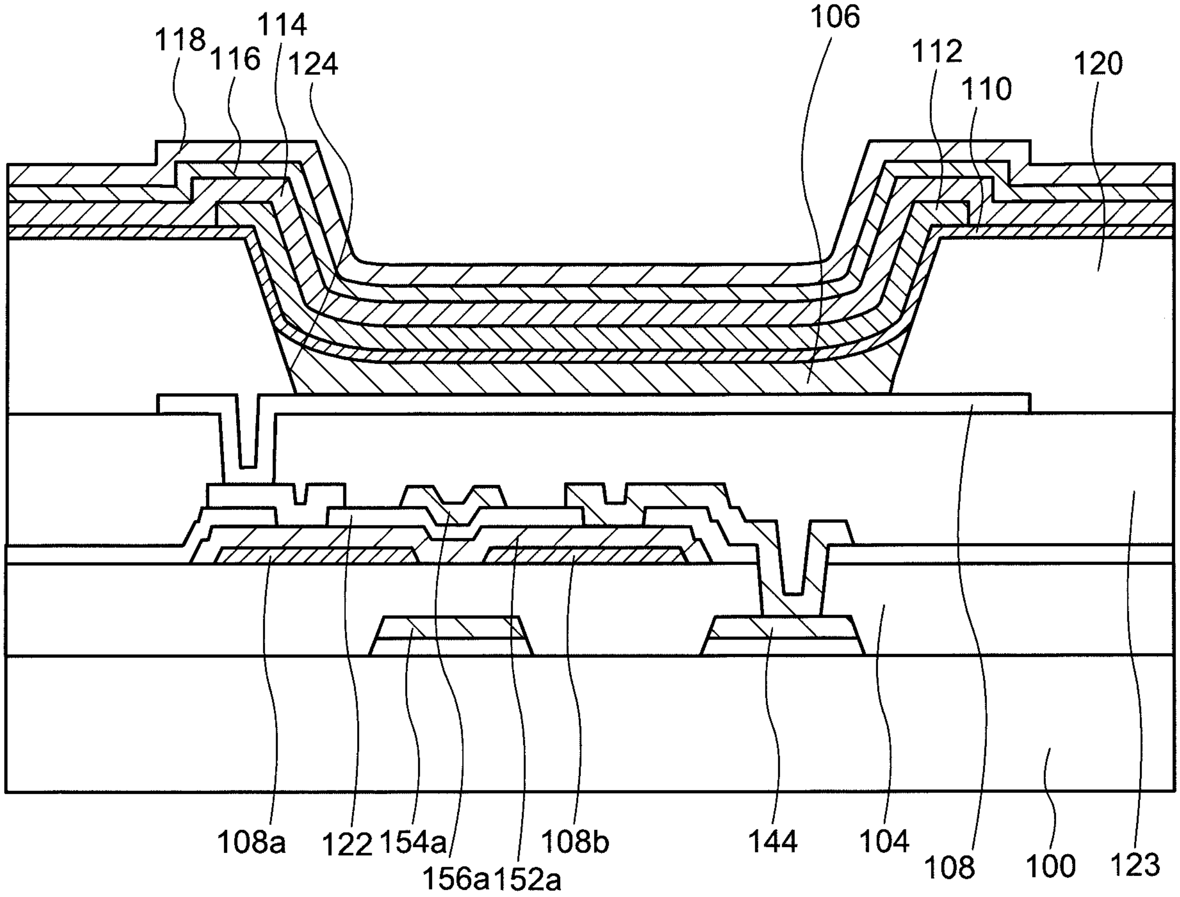
FIG. 30 is a cross-sectional view showing a structure of an EL element according to an embodiment of the present invention.

FIG. 25A and FIG. 25B show a pixel structure cross-sectional view in the case where the EL element 200*e* having the same structure as that of FIG. 15A is used, and FIG. 26 shows a pixel structure plan view. Although a fourth insulating layer (passivation film) 170 is not shown in FIG. 1, FIG. 2, FIG. 12 to FIG. 17, FIG. 20, FIG. 29, and FIG. 30, the fourth insulating layer (passivation film) 170 is preferably formed as shown in FIG. 23 to FIG. 25, FIG. 27, and FIG. 28 in order to improve the long-term reliability of each element. A silicon-nitride film, an alumina film, or the like is used as the fourth insulating layer (passivation film) 170.

Although the bottom-emission type EL element of FIG. 15A is used in FIG. 25A, the top-emission type EL element of FIG. 15B can also be used. The top-emission type EL element can be formed in FIG. 25A by forming the common potential line 144 so as to cover the entire area of the opening 124. As shown in FIG. 25B, the data signal line 134 and the second gate electrode 156 are formed of the same material simultaneously in the same layer.

In the EL element 200*e* shown in FIG. 15B, a top-emission type EL element can also be formed by coating the wiring 111 with the second electrode 108 and the first electron transport layer 106*a*. FIG. 27 to FIG. 30, FIG. 40, and FIG. 41 show cross-sectional views of the EL element in which the second electrode (cathode) 108 of the EL element 200*e* in FIG. 15A is completely separated from the source electrode and drain electrode of the driving transistor element and formed in a different layer. The second electrode (cathode) 108 is formed of the transparent conductive film such as ITO or IZO to form a bottom-emission type EL element, and the second electrode (cathode) 108 is formed of a metal film having a high visible-light reflectance to form a top-emission type EL element.

The EL element 200*e* according to the present embodiment is the same as the EL element 200*a* shown in FIG. 1 except that the first electrode is omitted and the configuration of the second electrode 108 is different, and the same advantageous effects can be obtained. In addition, the EL element 200*e* can be replaced with the EL element 200 shown in FIG. 12A.

Fifth Embodiment

An EL element having a cathode structure different from that of the EL element shown in the first embodiment is shown. In the following description, portions different from those of the first embodiment will be described, and description of common portions will be omitted.

Figure 16:
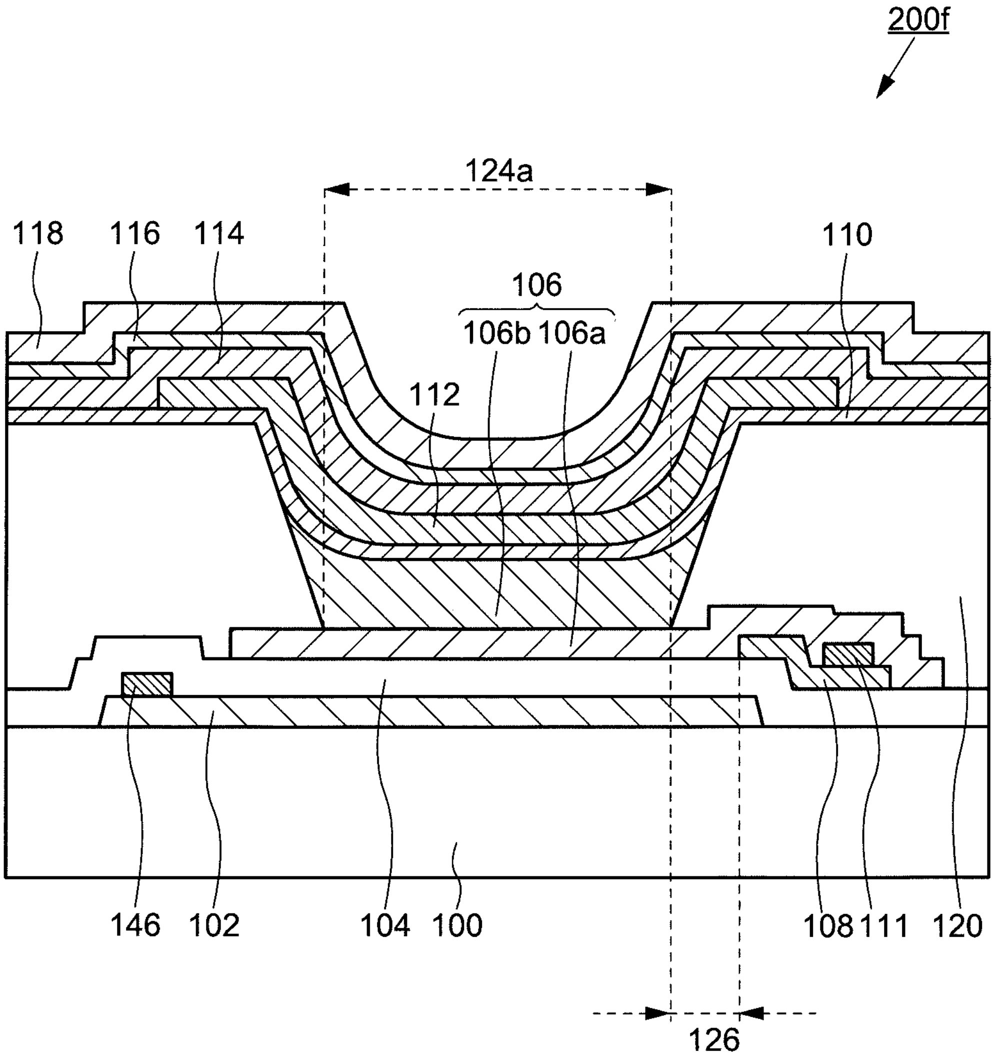
FIG. 16 is a cross-sectional view showing a structure of an EL element according to an embodiment of the present invention.

FIG. 16 shows a cross-sectional view of an EL element 200*f* according to another embodiment of the present invention. The EL element 200*f* is different from the EL element described in the first embodiment in that the second electrode 108 arranged below the first electron transport layer 106*a* is arranged only in a part of area of the peripheral portion of the first electron transport layer 106*a*. The first electron transport layer 106*a* includes an area that overlaps with the second electron transport layer 106*b*, the electron injection layer 110, the light emitting layer 112, and the third electrode 118 via the opening 124, and further includes an area that does not overlap with the second electron transport layer 106*b* at the outer side of the area 124*a* where the opening 124 is arranged. The second electrode 108 is arranged in an area where the second electron transport layer 106*a* does not overlap with the second electron transport layer 106*b*, that is, in an area between the end portion of the first electron transport layer 106*a* and the end portion of the second electron transport layer 106*b*. The second electrode 108 is preferably arranged so as to surround the outer periphery of the first electron transport layer 106*a*. However, as shown in FIG. 16, in the EL element 200*f* according to the present embodiment, the second electrode 108 is arranged only in a part of area of the peripheral portion of the first electron transport layer 106*a*. The second electrode 108 is arranged between the first electron transport layer 106*a* and the first insulating layer 104. Further, the wiring 111 may be arranged in contact with the second electrode 108. The wiring 111 may be arranged between the second electrode 108 and the first electron transport layer 106*a*. As shown in FIG. 16, a wiring 146 may be arranged between the first electrode 102 and the first insulating layer 104. The wiring 146 may be arranged between the substrate 100 and the first electrode 102.

The EL element 200*f* is the same as that of the first embodiment except that the configuration of the second electrode 108 is different, and the same advantageous effects can be obtained. In addition, the EL element 200*f* can be replaced with the EL element 200 shown in FIG. 12A.

Sixth Embodiment

The present embodiment shows an EL element in which the configuration of the cathode is different from that of the EL element shown in the first embodiment. In the following description, portions different from those of the first embodiment will be described, and description of common portions will be omitted.

FIGS. 17A and 17B shows a cross-sectional view of an EL element 200*g* according to the present embodiment. The EL element 200*g* is different from the EL element shown in the first embodiment in that a fourth electrode 105 is further arranged on the first electron transport layer 106*a* via the third insulating layer 122. The first electron transport layer 106*a* includes an area that overlaps with a second electron transport layer 106*b*, the electron injection layer 110, the light emitting layer 112, and the third electrode 118 via the opening 124, and further includes an area that does not overlap with the second electron transport layer 106*b* at the outer side of the area. The second electrode 108 is arranged in an area where the second electron transport layer 106*a* does not overlap with the second electron transport layer 106*b*, that is, in an area between the end portion of the first electron transport layer 106*a* and the end portion of the second electron transport layer 106*b*. The second electrode 108 is arranged between the first electron transport layer 106*a* and the first insulating layer 104. Further, the wiring 111 may be arranged in contact with the second electrode 108. The wiring 111 may be arranged between the second electrode 108 and the first electron transport layer 106*a*. The wiring 146 may be arranged in contact with the first electrode 102. As shown in FIGS. 17A and 17B, the wiring 146 may be arranged between the first electrode 102 and the first insulating layer 104.

The fourth electrode 105 is arranged in an area where the first electron transport layer 106*a* does not overlap with the second electron transport layer 106*b*, that is, in an area between the end portion of the first electron transport layer 106*a* and the end portion of the second electron transport layer 106*b*. The fourth electrode 105 is arranged so as to overlap with the first electrode 102 with the third insulating layer 122, the first electron transport layer 106*a*, and the first insulating layer 104 interposed therebetween. The fourth electrode 105 is arranged between the third insulating layer 122 and the second insulating layer 120 on the first electron transport layer 106*a*. The fourth electrode 105 is electrically connected to the first electrode 102 via a contact hole. With such a configuration, it is possible to prevent the current from concentrating only at the end portion of the second electrode 108, and it is possible to greatly improve the reliability of the element. The fourth electrode 105 is arranged so as to overlap with the third electrode 118 with the second insulating layer 120 interposed therebetween. Since the end portion of the fourth electrode 105 is not exposed to the opening 124 of the second insulating layer 120, it is configured so that an electric field concentration does not occur between the third electrode 118 and the fourth electrode 105 in the light emitting area.

In the EL element 200*g* shown in FIGS. 17A and 17B, the fourth electrode 105 is arranged so as to overlap with the first electrode 102 with the first electron transport layer 106*a* interposed therebetween. The fourth electrode 105 is preferably controlled to have the same potential as the first electrode 102. Since the fourth electrode 105 and the first electrode 102 are controlled to have the same potential, an electric field is applied from both the front and back surfaces of the first electron transport layer 106*a*, and the amount of carriers (electrons) injected into the light emitting layer 112 can be controlled by the same principles as those of the double-gate transistor. The amount of carriers (electrons) transported from the electron transport layer 106 (the first electron transport layer 106*a* and the second electron transport layer 106*b*) to the light emitting layer 112 can be controlled by the electric field strength of the first electrode 102 and the fourth electrode 105. When the voltage applied to the first electrode 102 and the fourth electrode 105 increases, the electric field acting on the first electron transport layer 106*a* also increases. Since the electric field generated by applying a positive voltage to the first electrode 102 and the fourth electrode 105 acts to draw carriers (electrons) from the second electrode 108 to the first electron transport layer 106*a*, the amount of carriers (electrons) transported to the light emitting layer 112 can be further increased. That is, the balance (carrier balance) between the amount of electrons injected from the second electrode 108 and the amount of positive holes injected from the third electrode 118 can be adjusted by controlling the voltage applied to the first electrode 102 and the fourth electrode 105. On the other hand, since the potentials of the first electrode 102 and the fourth electrode 105 become the common potential (Vss), leakage of carriers (electrons) in the first electron transport layer 106*a* can be suppressed, and the first electron transport layer 106*a* becomes an insulating state (depletion state). As a result, no current flows through the EL element 200*g*, and no light is emitted (non-light emitting state).

The EL element 200*g* is the same as that of the first embodiment except that it has the fourth electrode 105, and the same advantageous effects can be obtained. The EL element 200*g* can be replaced with the EL element 200 shown in FIG. 12A.

Seventh Embodiment

An example of the display device (EL display device) in which a pixel is formed by the EL element 200*g* according to the present embodiment will be described. In the following description, portions different from those in the second embodiment will be described, and description of common portions will be omitted.

Figure 18:
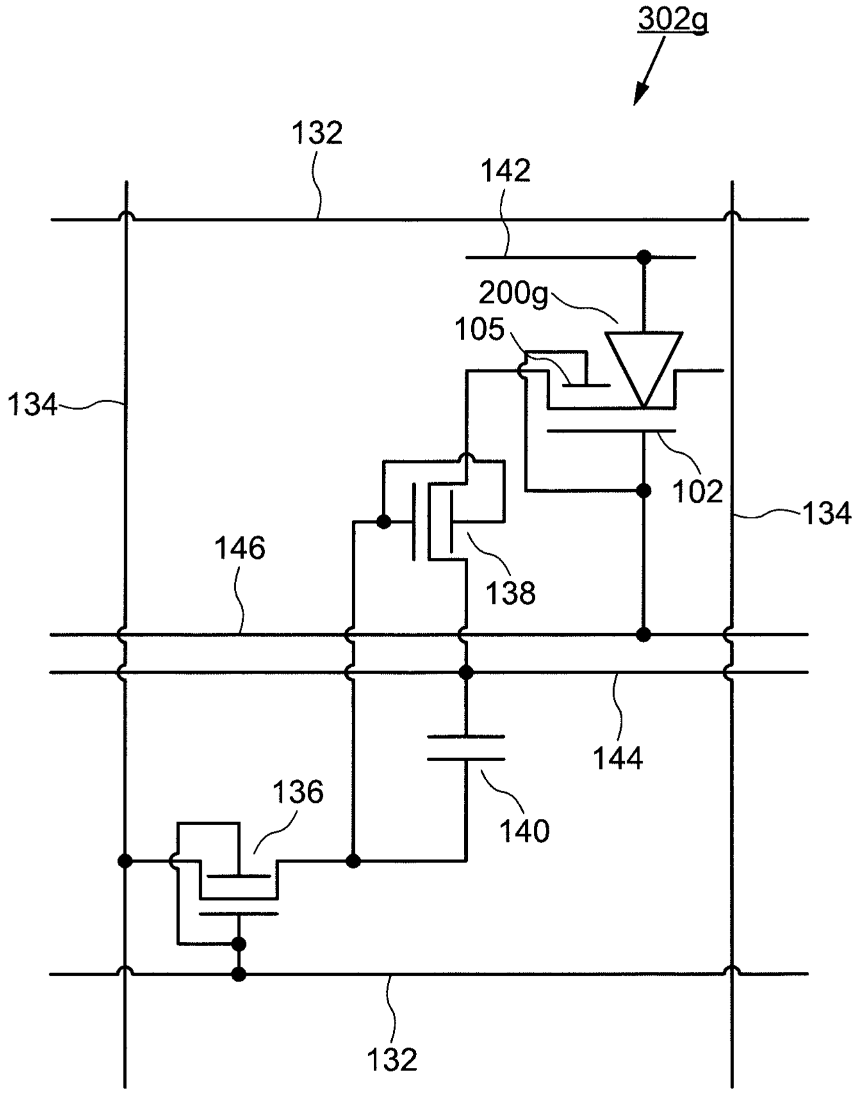
FIG. 18 is a diagram showing an example of an equivalent circuit of a pixel of a display device including an EL element according to an embodiment of the present invention.

FIG. 18 shows an example of an equivalent circuit of a pixel 302*g* arranged in the display device according to the present embodiment. In addition to the EL element 200*g*, the pixel 302*g* includes the select transistor 136, the drive transistor 138, and the capacitive element 140. In the select transistor 136, a gate is electrically connected to the scan signal line 132, a source is electrically connected to the data signal line 134, and a drain is electrically connected to a gate of the drive transistor 138. In the drive transistor 138, a source is electrically connected to the common potential line 144 and a drain is electrically connected to the second electrode 108 of the EL element 200*g*. The capacitive element 140 is electrically connected between the gate of the drive transistor 138 and the common potential line 144. In the EL element 200*g*, the first electrode 102 and the fourth electrode 105 are electrically connected to the signal line for controlling the amount of carrier injection 146, and the third electrode 118 is electrically connected to the power line 142. FIG. 18 shows the case where the EL element 200*g*, the select transistor 136, and the drive transistor 138 are of a double-gate type.

In the pixel 302*g* shown in FIG. 18, when the select transistor 136 is turned on, a voltage based on the data signal is applied from the data signal line 134 to the gate of the drive transistor 138. The capacitive element 140 holds the source-gate voltage of the drive transistor 138. When the drive transistor 138 is turned on, a current flows into the EL element 200*g* from the power line 142 to emit light. In this case, when a voltage (Vg) for controlling the amount of carrier injection is applied to the first electrode 102 and the fourth electrode 105, it is possible not only to control the emission intensity of the EL element 200*g* but also to control the position of the area at which the electrons and the holes in the light emitting layer 112 recombine with each other (in other words, the light emitting area). That is, the carrier balance in the light emitting layer 112 can be controlled.

According to the present embodiment, the light emission state of the EL element can be controlled by forming the pixel 302*g* with the EL element 200*g* in which the electrodes for controlling the amount of carrier injection (the first electrode 102 and the fourth electrode 105) are arranged and arranging the signal line for controlling the amount of carrier injection to connect to the electrodes for controlling the amount of carrier injection (the first electrode 102 and the fourth electrode 105). That is, degradation of the EL element can be suppressed by controlling the amount of electrons injection to the light emitting layer 112 by the electrodes for controlling the amount of carrier injection, rather than controlling the light emission of the EL element only by the drive transistor, and the reliability of the EL display device can be further enhanced.

Figure 19:
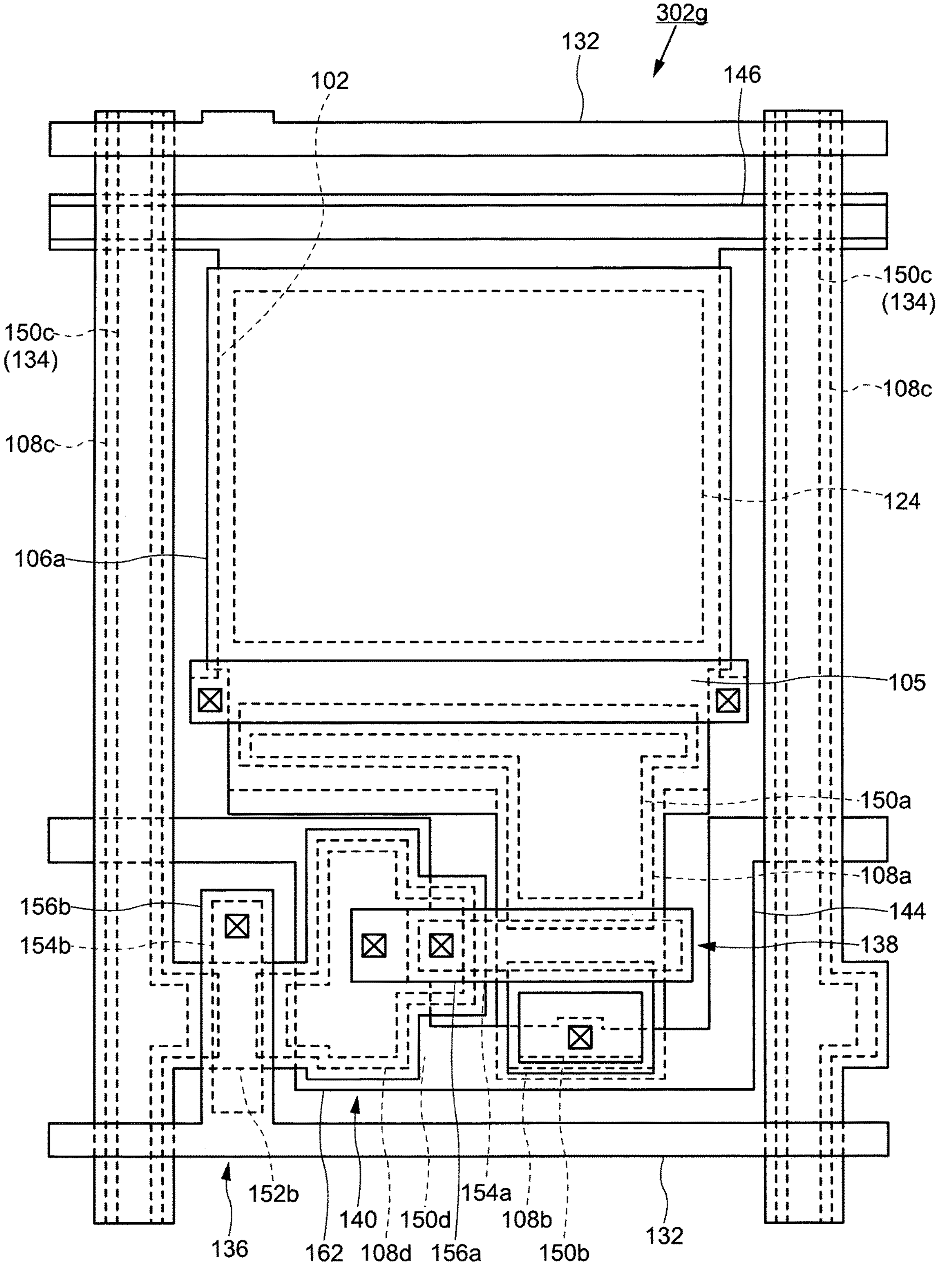
FIG. 19 is a plan view showing a configuration of a pixel of a display device using an EL element according to an embodiment of the present invention.

FIG. 19 shows a plan view of the pixel 302*g* of the display device according to the present embodiment. The select transistor 136, the drive transistor 138, the capacitive element 140, and the EL element 200*g* are arranged in the pixel 302*g*. In a plan view of the pixel 302*g* shown in FIG. 19, the arrangement of the first electrode 102, the fourth electrode 105, the first electron transport layer 106*a*, and the opening 124 is shown as the components of the EL element 200*g*.

The drive transistor 138 includes a first oxide semiconductor layer 152*a*, the first gate electrode 154*a*, and the second gate electrode 156*a*. The first gate electrode 154*a* and the second gate electrode 156*a* are arranged so as to have an area overlapping with each other with the first oxide semiconductor layer 152*a* interposed therebetween. That is, the drive transistor 138 has a double-gate structure in which the first oxide semiconductor layer 152*a* is sandwiched between the first gate electrode 154*a* and the second gate electrode 156*a*.

The select transistor 136 has a structure similar to that of the drive transistor 138. That is, the select transistor 136 includes the second oxide semiconductor layer 152*b*, the first gate electrode 154*b*, and the second gate electrode 156*b*.

The capacitive element 140 is formed in an area where the second electrode 108*d* overlaps with the capacitance electrode 162 via the first insulating layer 104. The capacitance electrode 162 is also formed as the common potential line 144.

The EL element 200*g* has a similar configuration as that of the EL element 200*g* shown in FIGS. 17A and 17B. The EL element 200*g* is electrically connected to the drive transistor 138. In the EL element 200*g*, an area corresponding to the second electrode 108 is contiguously formed from the drive transistor 138. With such a configuration, the routing of wirings is simplified, and the opening ratio of the pixel 302 (the ratio of the area where the EL element actually emits light with respect to the area occupied by one pixel) can be increased.

Also, in the present embodiment, the oxide semiconductor layer 152 may be made of the same material as the oxide semiconductor material of the first electron transport layer 106*a* described in the first embodiment. In addition, inorganic insulating material is used as the first insulating layer 104, the third insulating layer 122, and a fourth insulating layer 119. Silicon oxide, silicon nitride, silicon oxynitride, aluminum oxide, or the like may be used as the inorganic insulating material. The fourth electrode 105 may be made of the same material as that of the second gate electrode 156*a*.

As described above, the display device according to the present embodiment can be manufactured through the same manufacturing process as elements such as the drive transistor and the select transistor manufactured using the oxide semiconductor layer by using the oxide semiconductor layer as the electron transport layer for forming the EL element. In addition, in the display device according to the present embodiment, an electrode for controlling the amount of carrier injection is arranged in the EL element, and an electron transport layer with a high carrier (electron) mobility is arranged with respect to the electrode for controlling the amount of carrier injection via an insulating layer, so that the emission intensity in the pixel plane can be made uniform and high definition can be achieved.

Eighth Embodiment

An example of the display device (EL display device) in which a pixel is formed by an EL element 200*h* according to the present embodiment will be described. In the following description, portions different from those in the second embodiment will be described, and descriptions of common portions will be omitted.

Figure 20A:
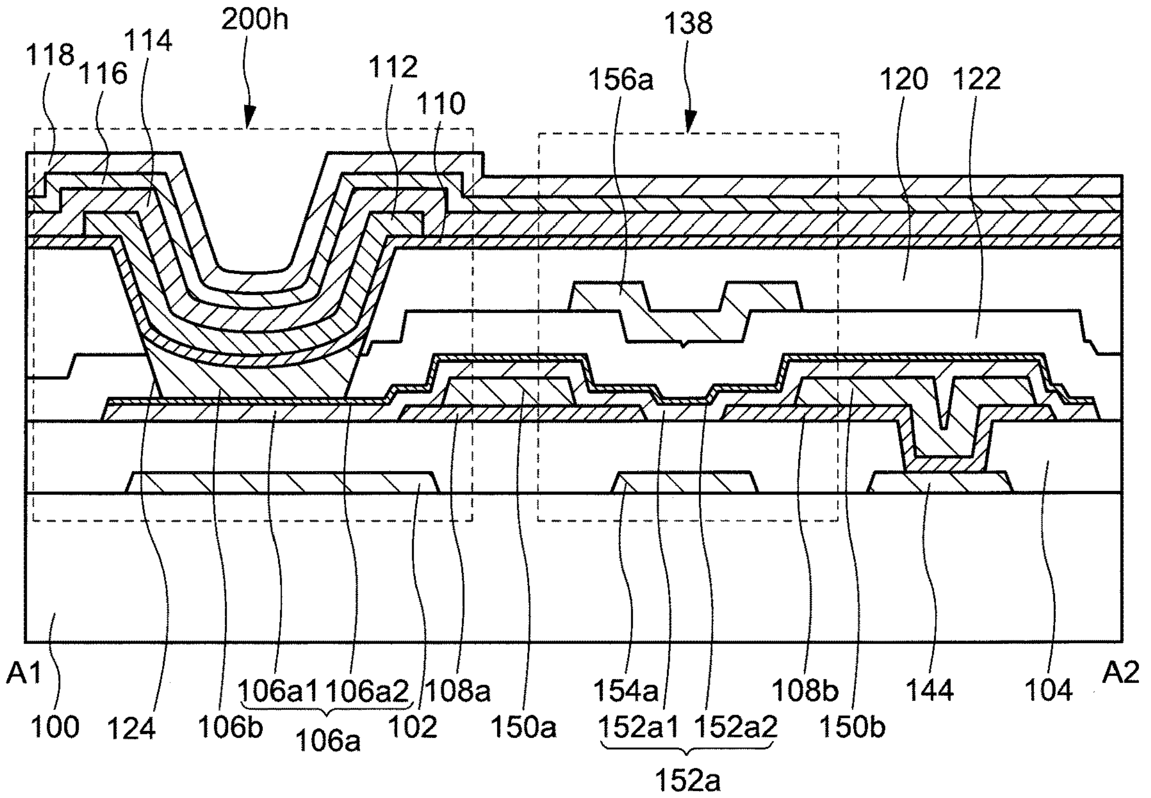
FIG. 20A is a cross-sectional view showing a configuration of a pixel of a display device using an EL element according to an embodiment of the present invention.
Figure 20B:
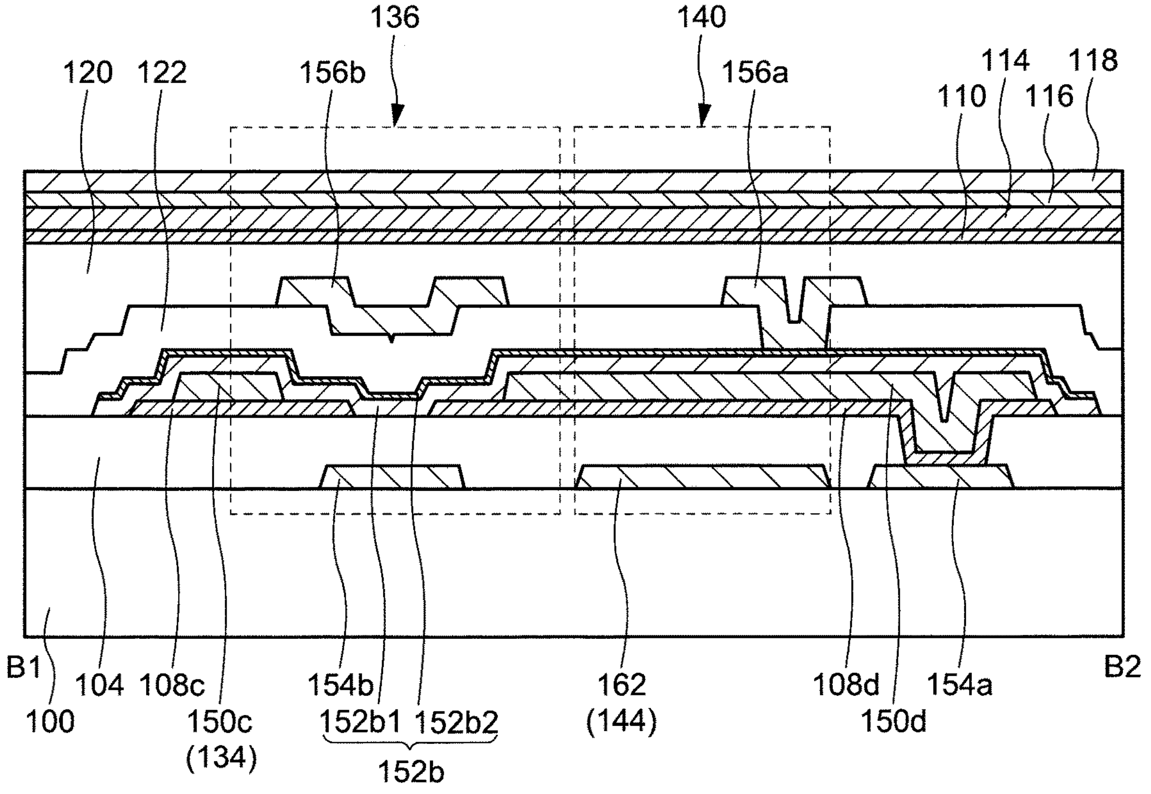
FIG. 20B is a cross-sectional view showing a configuration of a pixel of a display device using an EL element according to an embodiment of the present invention.

FIGS. 20A and 20B shows a cross-sectional view of a display device in which the pixel is formed by the EL element 200*h* according to the present embodiment. The select transistor 136, the drive transistor 138, the capacitive element 140, and the EL element 200*h* are arranged in the pixel 302.

The drive transistor 138 includes the first oxide semiconductor layer 152*a*, the first gate electrode 154*a*, and the second gate electrode 156*a*. The first gate electrode 154*a* and the second gate electrode 156*a* are arranged so as to have an area overlapping with each other with the first oxide semiconductor layer 152*a* interposed therebetween. That is, the drive transistor 138 has a double-gate structure in which the first oxide semiconductor layer 152*a* is sandwiched between the first gate electrode 154*a* and the second gate electrode 156*a*.

The first oxide semiconductor layer 152*a* is a transparent oxide semiconductor containing one or more elements selected from indium (In), zinc (Zn), gallium (Ga), tin (Sn), aluminum (Al), tungsten (W), and silicon (Si). For example, a quaternary oxide material, a ternary oxide material, and a binary oxide material exhibiting semiconducting properties are used as the oxide semiconductor material for forming the first oxide semiconductor layer 152*a*. For example, it is preferred to use $In_2O_3$—$Ga_2O_3$—$SnO_2$—ZnO-based oxide material as the quaternary oxide material, $In_2O_3$—$Ga_2O_3$—$SnO_2$-based oxide material, $In_2O_3$—$Ga_2O_3$—ZnO-based oxide material, $In_2O_3$—$SnO_2$—ZnO-based oxide material, $In_2O_3$—$Al_2O_3$—ZnO-based oxide material, $Ga_2O_3$—$SnO_2$—ZnO-based oxide material, $Ga_2O_3$—$Al_2O_3$—ZnO-based oxide material, and $SnO_2$—$Al_2O_3$—ZnO-based oxide material as the ternary oxide material, and $In_2O_3$—$SnO_2$-based oxide material, $In_2O_3$—ZnO-based oxide material, $SnO_2$—ZnO-base oxide material, $Al_2O_3$—ZnO-based oxide material, $Ga_2O_3$—ZnO-based oxide material, $SnO_2$—$SiO_2$-based oxide material, and $In_2O_3$—$W_2O_3$-based oxide material as the binary oxide material, and it is particularly preferred to use $In_2O_3$—$Ga_2O_3$—$SnO_2$-based oxide material. In addition, the oxide semiconductor may include tantalum (Ta), scandium (Sc), nickel (Ni), lanthanum (La), magnesium (Mg), hafnium (Hf), dithorium (Y), titanium (Ti), and samarium (Sm). For example, the In—Ga—Sn—O-based oxide material described above is an oxide material containing at least In, Ga, and Sn, and the composition ratio thereof is not particularly limited. More preferably, the composition ratio with respect to In, Ga, and Sn of the In—Ga—Sn—O-based oxide material is such that atm % of In is 50 to 80%, atm % of Ga is 10 to 25%, and atm % of Sn is 10 to 30%. In other words, a thin film represented by the chemical formula $InMO_3(ZnO)_m$ ($m>0$) can be used as the first oxide semiconductor layer 152*a*. In this case, M represents one or a plurality of metal elements selected from Sn, Ga, Zn, Sc, La, Y, Ni, Al, Mg, Ti, Ta, W, Hf, and Si. Also, the quaternary oxide material, the ternary oxide material, and the binary oxide material described above are not limited to those in which the contained oxide has a stoichiometric composition and may be composed of an oxide material with a composition deviated from the stoichiometric composition.

In the present embodiment, the first oxide semiconductor layer 152*a* has a structure in which a first area 152*a*1 and a second area 152*a*2 are stacked from the substrate 100 side. In the first oxide semiconductor layer 152*a*, the thickness of the first area 152*a*1 is larger than the thickness of the second area **152*a*2. The thickness of the first area 152*a*1 of the first oxide semiconductor layer 152*a* is preferably 30 nm to 100 nm. The thickness of the second area 152*a*2 of the first oxide semiconductor layer 152*a* is preferably 2 nm to 10 nm. However, the thickness of the first oxide semiconductor layer 152*a* including the first area 152*a*1 and the second area 152*a*2** may be 20 nm to 100 nm, for example, 30 nm to 60 nm.

The first oxide semiconductor layer **152*a* has different carrier concentrations (concentrations of majority carriers) of the first area 152*a*1 and the second area 152*a*2. The carrier concentration of the second area 152*a*2 is smaller than the carrier concentration of the first area 152*a*1. The carrier concentration of the first area 152*a*1 is preferably about $1 \times 10^{15}/cm^3$ to $5 \times 10^{18}/cm^3$, and the carrier concentration of the second area 152*a*2 is preferably about $1 \times 10^{11}/cm^3$ to $1 \times 10^{15}/cm^3$ Correspondingly, the first area 152*a*1 of the first oxide semiconductor layer 152*a* preferably has a specific resistance value of about $10^{-1}$ Ω·cm to $10^3$ Ω·cm. The second area 152*a*2 of the first oxide semiconductor layer 152*a* preferably has a specific resistance value of about $10^4$ Ω·cm to $10^9$ Ω·cm. In addition, the carrier mobility of the second area 152*a*2 of the first oxide semiconductor layer 152*a* is also preferably smaller than the carrier mobility of the first area 152*a*1 of the first oxide semiconductor layer 152*a***.

In addition, the first oxide semiconductor layer **152*a* may have different crystallinities between the first area 152*a*1 and the second area 152*a*2. The crystallinity rate of the second area 152*a*2 of the first oxide semiconductor layer 152*a* is preferably higher than the crystallinity rate of the first area 152*a*1. The first area 152*a*1 of the first oxide semiconductor layer 152*a* may be in the form of amorphous, microcrystalline phase, or a mixed phase of amorphous and nano microcrystalline phase. The second area 152*a*2 of the first oxide semiconductor layer 152*a* may be in the form of amorphous, nanocrystalline phase, or a mixed phase of amorphous and nanocrystalline phase. In this case, the second area 152*a*2 has a higher mixing ratio of the microcrystalline phase than the first area 152*a*1** and may be in the form of a mixed phase with a polycrystalline phase.

The first oxide semiconductor layer **152*a* can be manufactured by a sputtering method. The first area 152*a*1 and the second area 152*a*2 can be manufactured by changing the sputtering conditions. For example, the first area 152*a*1 of the first oxide semiconductor layer 152*a* is formed using a rare gas such as Ar as a sputtering gas, and the second area 152*a*2 is formed using a rare gas such as Ar and an oxygen gas as a sputtering gas. Increasing the oxygen partial pressure at the time of forming the second area 152*a*2 with respect to the first area 152*a*1, the donor-defect of the second area 152*a*2 can be reduced, and the crystallinity rate can be improved. As a result, the carrier concentration of the second area 152*a*2 can be made lower than that of the first area 152*a*1**, and the specific resistance value can be made higher accordingly.

The first oxide semiconductor layer **152*a* may be combined so as to have the same composition of the first area 152*a*1 and the second area 152*a*2 and have different crystallinity rates. In addition, in the first oxide semiconductor layer 152*a*, the same type of metal oxide may be used in the first area 152*a*1 and the second area 152*a*2 and combined to have different compositions. Further, metal oxides having different compositions may be combined in the first area 152*a*1 and the second area 152*a*2. The carrier concentration can be made different, and the specific resistance value can be made different by applying such a combination to the first area 152*a*1 and the second area 152*a*2**.

Figure 21A:
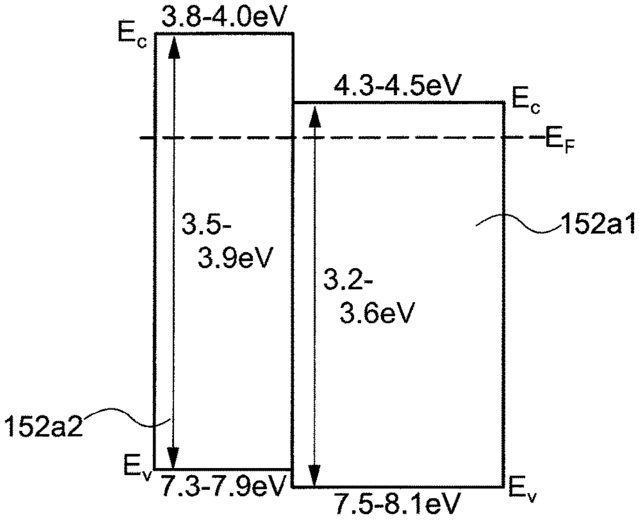
FIG. 21A is an energy band diagram of an oxide semiconductor layer according to an embodiment of the present invention.
Figure 22:
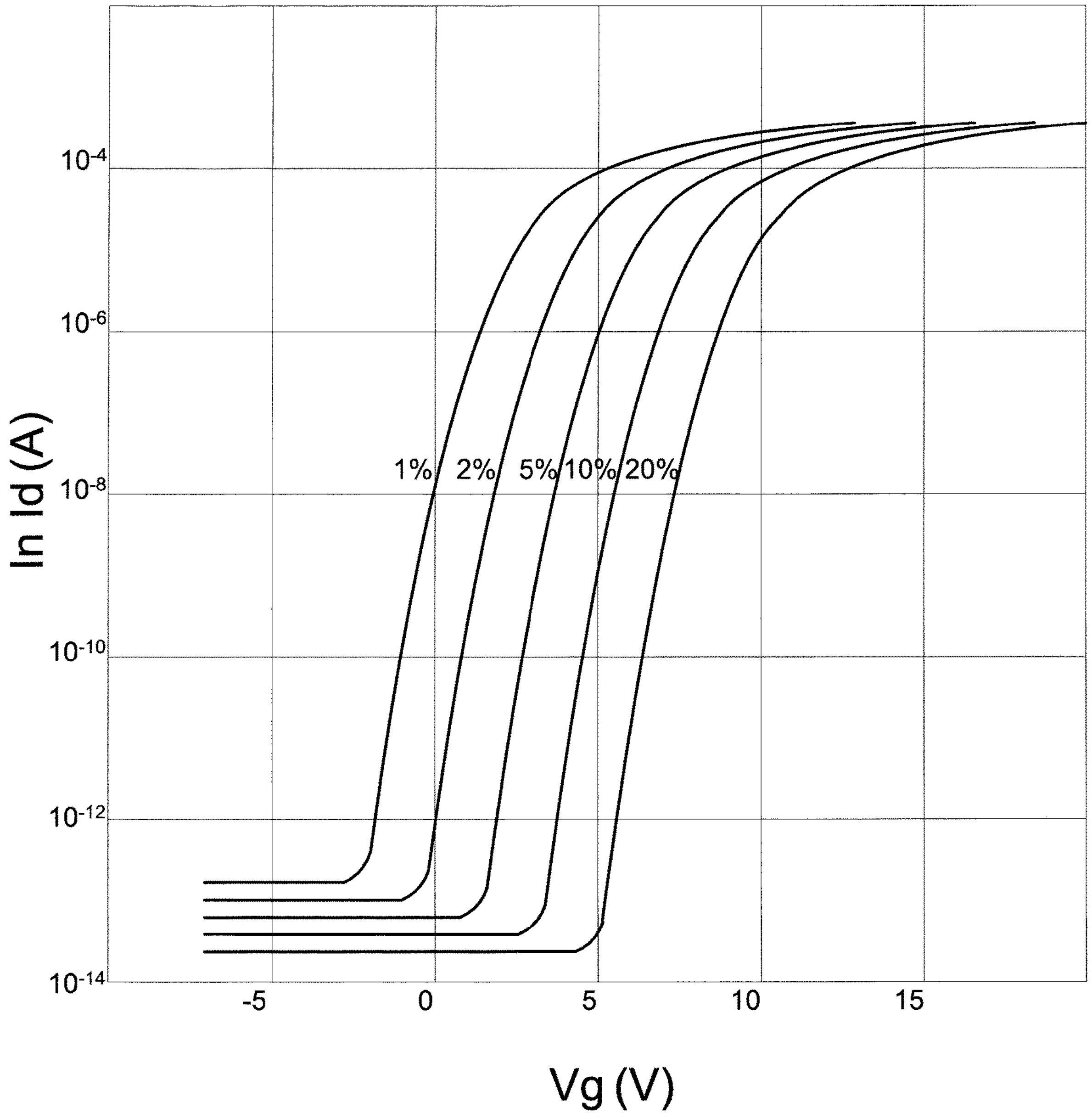
FIG. 22 is a diagram showing a relationship between an electrical characteristic of a transistor and an oxygen partial pressure at the time of deposition according to an embodiment of the present invention.

As shown in FIG. 21A, even when an oxide semiconductor target material (e.g., $InGaSnZnO_x$) having the same composition ratio is used, the crystallinity rate can be changed by changing the $O_2/(Ar+O_2)$ oxygen partial pressure of the sputtering gas, and it is possible to change the carrier concentration and the bandgap of each area. For example, the crystallinity rate of the second area **152*a*2 of the first oxide semiconductor layer 152*a*, which is a microcrystal, is higher than that of the first area 152*a*1 of the first oxide semiconductor layer 152*a*, which is amorphous, the carrier concentration is lower, the bandgap is larger, and the work function value is smaller. Forming in this manner makes it possible to improve the problem of reduction reaction due to hydrogen radical generated when the third insulating layer 122 is formed on the second area 152*a*2 of the first oxide semiconductor layer 152*a*. A P—$SiO_2$ film formed by a plasma CVD method using $SiH_4$ gas and $N_2O$ gas as a raw material is used for the third insulating layer 122. There is a problem in that hydrogen present in the raw material $SiH_4$ becomes hydrogen radical and reduces the surface of the second area 152*a*2 of the first oxide semiconductor layer 152*a*. Decreasing the carrier concentration of the second area 152*a*2 of the first oxide semiconductor layer 152*a* and increasing the crystallinity rate makes it possible to prevent the reduction by hydrogen radical from occurring and widen the process margin when forming a P—$SiO_2$ film by the plasma CVD method. Further, as shown in FIG. 22, the threshold voltage (Vth) of a thin film transistor element can be precisely controlled by changing the oxygen partial pressure at the time of a deposition of the second area 152*a*2. In order to simplify the circuit system and reduce the cost, the sub-threshold voltage of the thin film transistor element must be moved closer to the positive side than 0 V. According to FIG. 22, it can be understood that the partial pressure of oxygen at the time of the deposition of the second area 152*a*2 needs to be about 5%. If the thickness of the second area 152*a*2** is increased, it is also possible to shift the sub-threshold voltage to the positive side, and the optimum thickness may be selected.

Figure 21B:
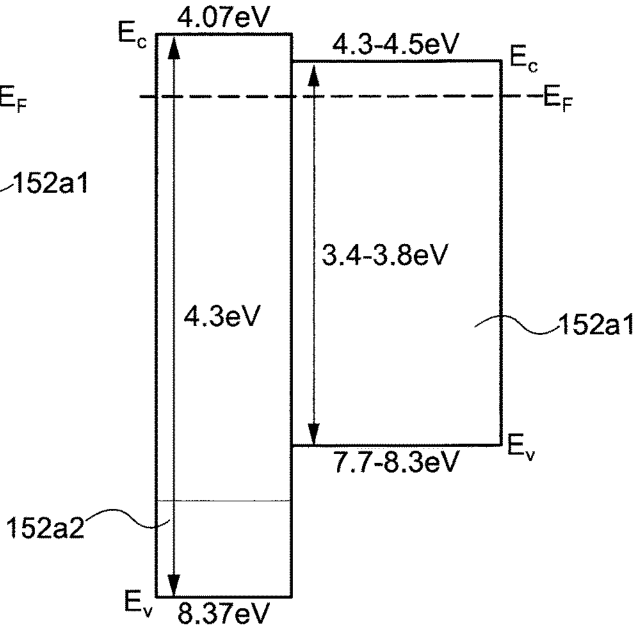
FIG. 21B is an energy band diagram of an oxide semiconductor layer according to an embodiment of the present invention.

As shown in FIG. 21B, for example, the same effect as in FIG. 21A can be obtained by using the amorphous $InGaSnO_x$ film in the first area **152*a*1 of the oxide semiconductor layer 152*a* and the amorphous $GaO_x$ film in the second area 152*a*2 of the first oxide semiconductor layer 152*a*. Even if the surface of the amorphous $GaO_x$ film is subjected to hydrogen ($H_2$) plasma treatment, the carrier concentration of the amorphous $GaO_x$ is increased from $10^{13}$ level to $10^{15}$ level and does not become conductive. Amorphous $GaO_x$ is less likely to cause a reduction reaction due to hydrogen radicals under the normal P—$SiO_2$ deposition condition, the P—$SiO_2$ film can be deposited by increasing the substrate temperature to 250° C. or higher, and a highly reliable thin film transistor element can be manufactured. Even in the case where the amorphous $GaO_x$ is used in the second area 152*a*2**, the threshold voltage (Vth) and the sub-threshold voltage of the thin film transistor element can be shifted to the positive side by increasing the oxygen partial pressure at the time of the sputtering deposition or increasing the thickness of the amorphous $GaO_x$.

In order to control the threshold voltage (Vth) and the sub-threshold voltage of the thin film transistor element described above, the thickness of the third insulating layer 122 must be thinner than the thickness of the first insulating layer 104 in the transistor configuration of FIGS. 20A and 20B. Specifically, the thickness of the third insulating layer

122 is preferably 150 nm to 250 nm and the thickness of the first insulating layer 104 is preferably 400 nm to 600 nm, which is twice or more of that thickness. That is, the electric field acting on the first oxide semiconductor **152*a* is preferred to be stronger on the side of the second gate electrode 156 than on the side of the first gate electrode 154. With such a configuration, at an interface where the first area 152*a*1 and the second area 152*a*2 of FIG. 21A and FIG. 21B are in contact with each other, a bandgap of about 0.3 eV is generated at the conduction band side. When the bottom energy (Ec) of the conduction band in the second area 152*a*2 is higher than that in the first area 152*a*1 and a positive gate voltage is applied, carriers (electrons) gather at this interface and become conductive. That is, the interface between the third insulating layer 122 and the second area 152*a*2 of the first oxide semiconductor layer 152*a* does not become conductive, but carriers (electrons) concentrate at the interface between the first area 152*a*1 and the second area 152*a*2, and a current flows. For this reason, a transistor element operation of a buried-channel structure is performed. The reliability of the buried-channel transistor element is very high, and almost no threshold voltage (Vth) shift occurs even in a PBTS evaluation test. In the double-gate, source/drain bottom contact type TFT used in an embodiment of the present invention, it is very critical to make the thickness of the third insulating layer 122, which is the gate insulating film of the top gate side, thinner than the thickness of the first insulating layer 104, which is the gate insulating film of the bottom gate side. The thickness of the third insulating layer 122, which is the gate insulating film of the top gate side, is preferably about ½ of the thickness of the first insulating layer 104**, which is the gate insulating film of the bottom gate side.

The select transistor 136 has a configuration similar to that of the drive transistor 138. That is, the select transistor 136 is configured to include the second oxide semiconductor layer **152*b*, the first gate electrode 154*b*, and the second gate electrode 156*b*. In the present embodiment, the second oxide semiconductor layer 152*b* has a structure in which a first area 152*b*1 and a second area 152*b*2 are stacked from the substrate 100**.

The capacitive element 140 is formed in an area where the second electrode **108*d* overlaps with the capacitance electrode 162 via the first insulating layer 104. The capacitance electrode 162 is also formed as the common potential line 144**.

The EL element **200*h* is electrically connected to the drive transistor 138. In the EL element 200*h*, an area corresponding to the second electrode 108 is contiguously formed from the drive transistor 138. With such a configuration, the routing of wirings is simplified, and the opening ratio of the pixel 302** (the ratio of the area where the EL element actually emits light with respect to the area occupied by one pixel) can be increased.

In the EL element **200*h*, an area corresponding to the first electron transport layer 106*a* is arranged with the same structure as that of the drive transistor 138. As shown in FIG. 20A, the first electron transport layer 106*a* may be arranged contiguously from the area of the drive transistor 138. In the present embodiment, the first electron transport layer 106*a* has a structure in which a first area 106*a*1 and a second area 106*a*2 are stacked from the substrate 100. In the first electron transport layer 106*a* has different carrier concentrations (concentrations of majority carriers) of the first area 106*a*1 and the second area 106*a*2. The carrier concentration of the second area 106*a*2 is smaller than the carrier concentration of the first area 106*a*1**.

As described above, the display device according to the present embodiment can be manufactured through the same manufacturing process as elements such as the drive transistor and the select transistor manufactured using the oxide semiconductor layer by using the oxide semiconductor layer as the electron transport layer for forming the EL element. In addition, in the display device according to the present embodiment, an electrode for controlling the amount of carrier injection is arranged in the EL element, and an electron transport layer with a high carrier (electron) mobility is arranged with respect to the electrode for controlling the amount of carrier injection via an insulating layer, so that the emission intensity in the pixel plane can be made uniform and high definition can be achieved.

In the present embodiment, the first oxide semiconductor layer **152*a* of the drive transistor 138 is composed of the first area 152*a*1 and the second area 152*a*2. Also, the carrier concentration of the second area 152*a*2 is configured to be lower than that of the first area 152*a*1. As a result, the drive transistor 138 is structured such that a channel is formed in the first area 152*a*1 of the first oxide semiconductor layer 152*a* away from the third insulating layer 122. The drive transistor 138 according to the present embodiment can improve field-effect mobility by arranging the second area 152*a*2 between the first area 152*a*1 of the first oxide semiconductor layer 152*a* and the third insulating layer 122. In addition, the fluctuation of the threshold voltage of the drive transistor 138 can be suppressed, and the reliability can be improved by the stable electrical characteristics. Further, since the drive transistor 138 has a double gate structure, the current drive capability is improved. Therefore, sufficient current can be supplied even if the voltage of the third electrode 118, which serves as an anode, is reduced when driving the EL element. Even if the operation point of the EL element fluctuates, constant current driving can be performed according to the fluctuation of the operation point. Since the drive transistor 138** has a double-gate structure, it is possible to reduce the power consumption, and therefore, it is possible to solve the heat generation problem that becomes apparent when the EL display device is enlarged, and the life of the EL element can be prolonged.

The present invention is not limited to the above-described embodiments, and can be appropriately modified without departing from the spirit thereof. In addition, the embodiments can be combined as appropriate.

Figure 35:
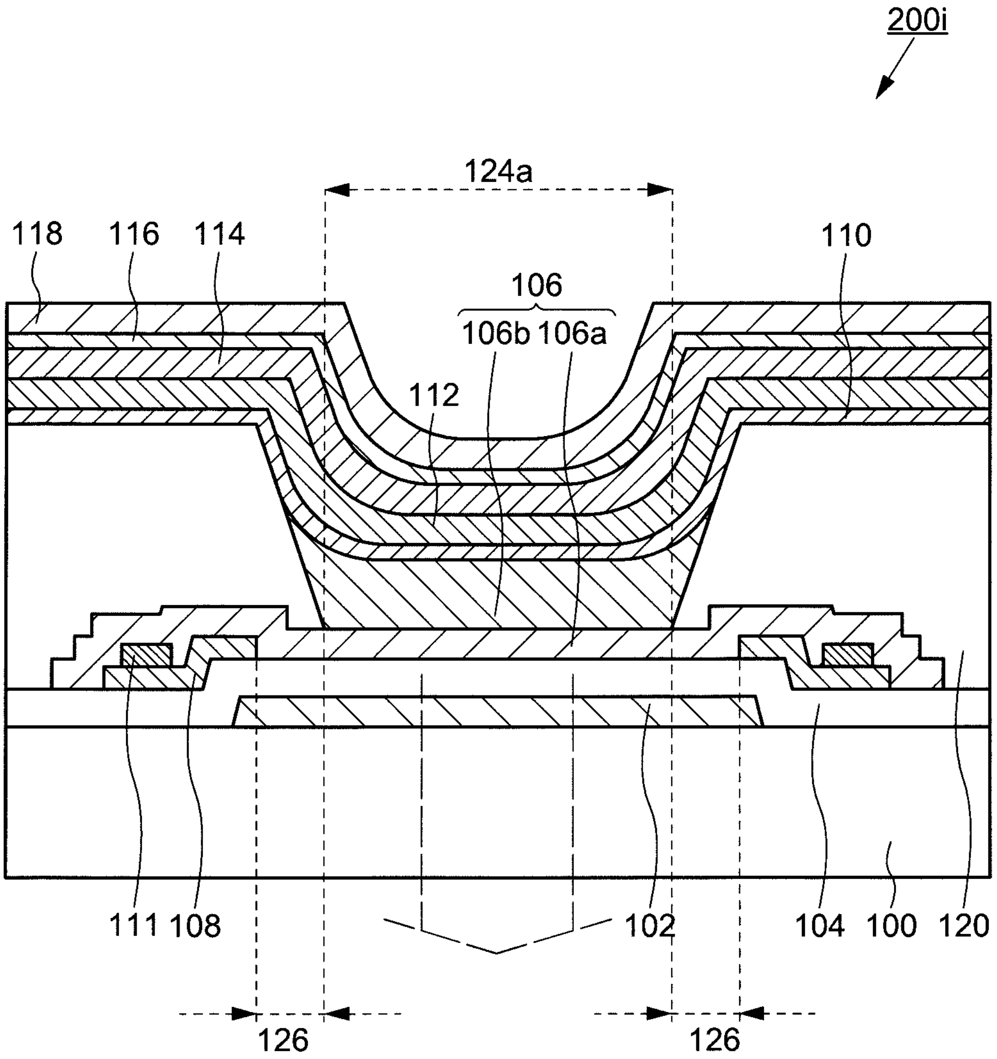
FIG. 35 is a cross-sectional view showing a configuration of an EL element according to a modification of the present invention.

FIG. 35 shows a cross-sectional structure of an EL element **200*i* according to a modification of the present invention. Since the EL element 200*i* shown in FIG. 35 is the same as the EL element 200*a* shown in FIG. 1 except that the light emitting layer 112** is arranged on substantially the entire surface, descriptions of common portions will be omitted.

Figure 36:
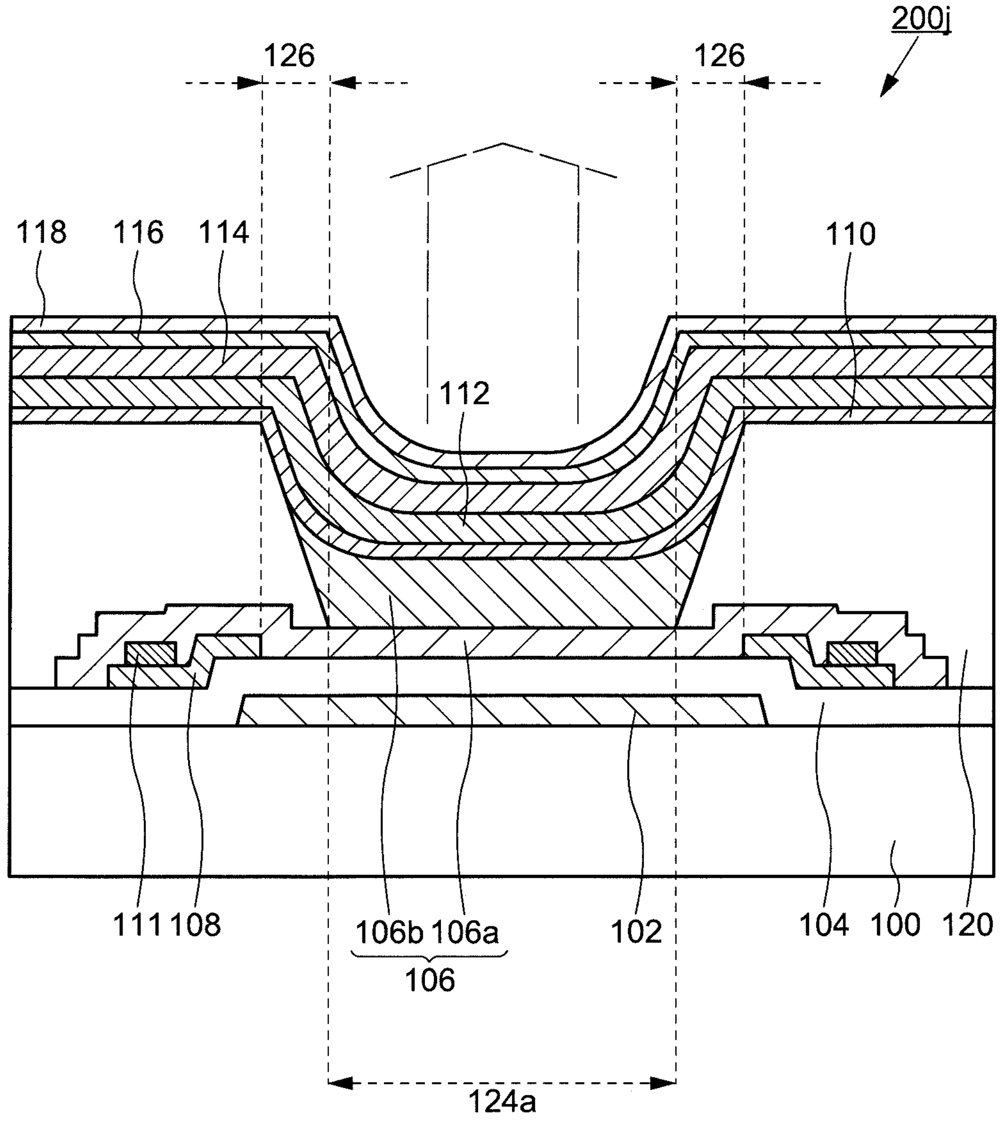
FIG. 36 is a cross-sectional view showing a configuration of an EL element according to a modification of the present invention.

FIG. 36 shows a cross-sectional structure of an EL element **200*j* according to a modification of the present invention. Since the EL element 200*j* shown in FIG. 36 is the same as the EL element 200*b* shown in FIG. 2 except that the light emitting layer 112** is arranged on substantially the entire surface, descriptions of common portions will be omitted.

Figure 37:
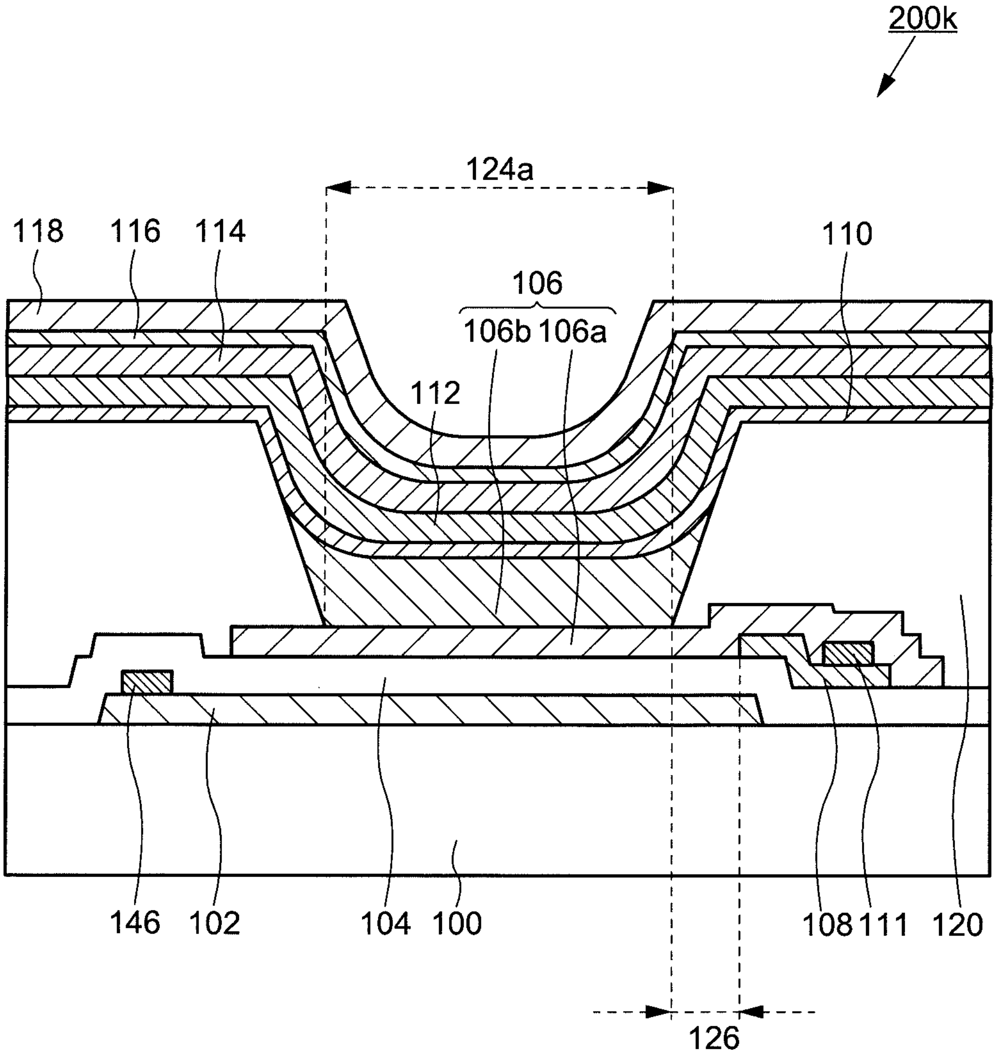
FIG. 37 is a cross-sectional view showing a configuration of an EL element according to a modification of the present invention.

FIG. 37 shows a cross-sectional view of an EL element **200*k* according to a modification of the present invention. Since the EL element 200*k* shown in FIG. 37 is the same as the EL element 200*f* shown in FIG. 16 except that the light emitting layer 112** is arranged on substantially the entire surface, descriptions of common portions will be omitted.

Figure 38A:
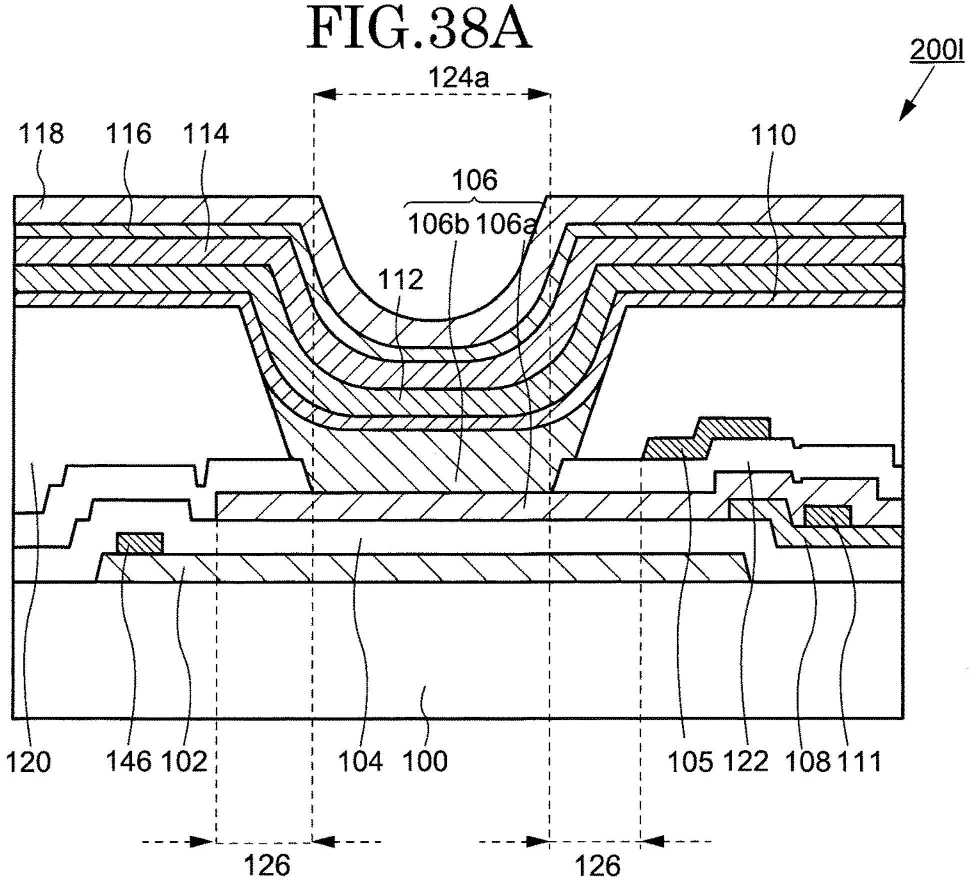
FIG. 38A is a cross-sectional view showing a configuration of an EL element according to a modification of the present invention.
Figure 38B:
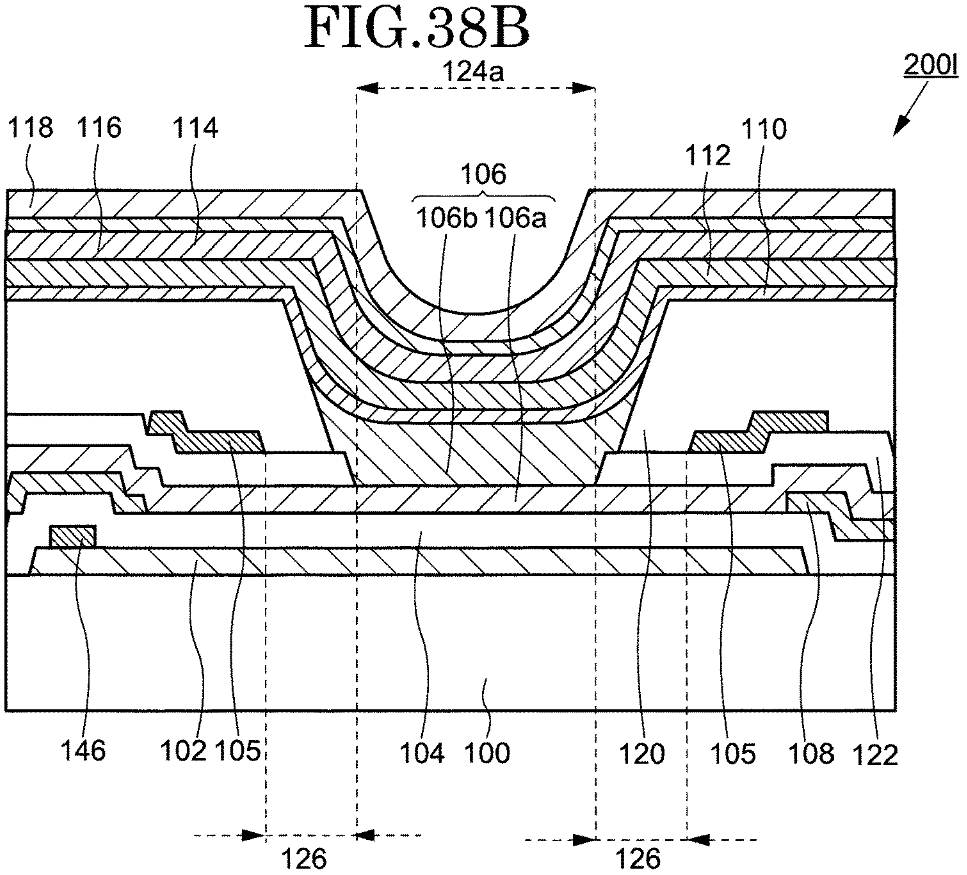
FIG. 38B is a cross-sectional view showing a configuration of an EL element according to a modification of the present invention.

FIGS. 38A and 38B shows a cross-sectional view of an EL element **200*l* according to a modification of the present invention. Since the EL element 200***l* shown in FIGS. 38A and 38B is the same as the EL element 200*g* shown in FIGS. 17A and 17B except that the light emitting layer 112 is arranged on substantially the entire surface, descriptions of common portions will be omitted.

Figure 39:
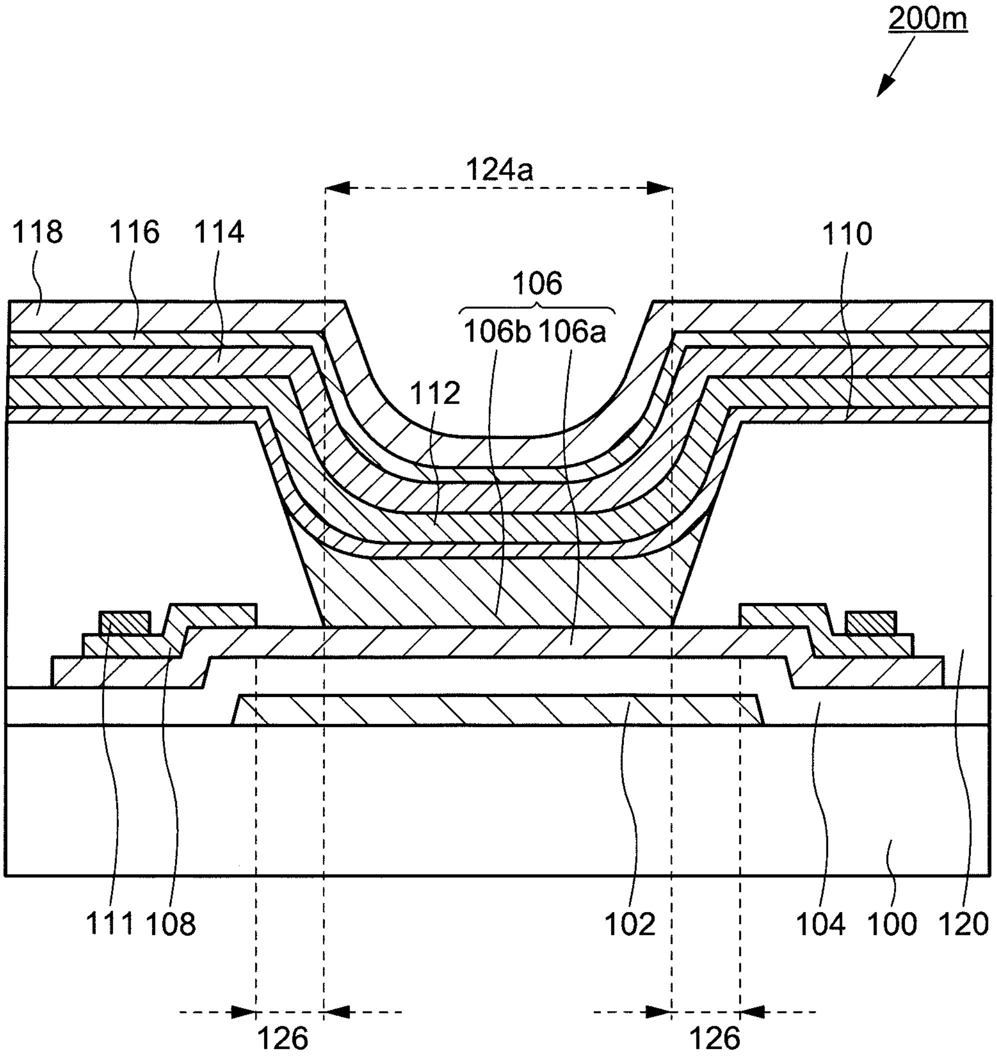
FIG. 39 is a cross-sectional view showing a configuration of an EL element according to a modification of the present invention.

FIG. 39 shows a cross-sectional view of an EL element 200*m* according to a modification of the present invention. Since the EL element 200*m* shown in FIG. 39 is the same as the EL element 200*c* shown in FIG. 13 except that the light emitting layer 112 is arranged on substantially the entire surface, descriptions of common portions will be omitted.

Figure 40:
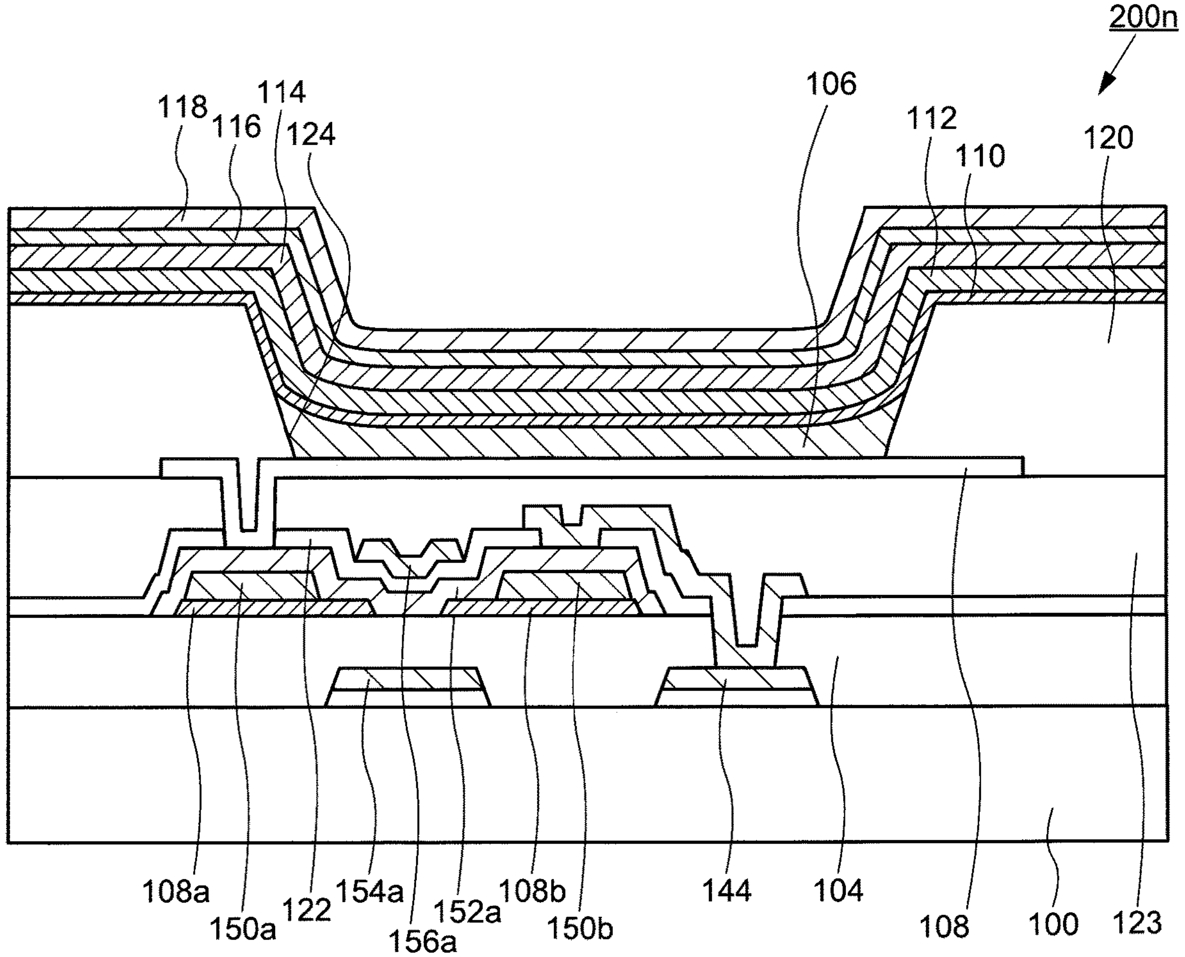
FIG. 40 is a cross-sectional view showing a configuration of an EL element according to a modification of the present invention.

FIG. 40 shows a cross-sectional view of an EL element 200*n* according to a modification of the present invention. Since the EL element 200*n* shown in FIG. 40 is the same as the EL element shown in FIG. 29 except that the light emitting layer 112 is arranged on substantially the entire surface, descriptions of common portions will be omitted.

Figure 41:
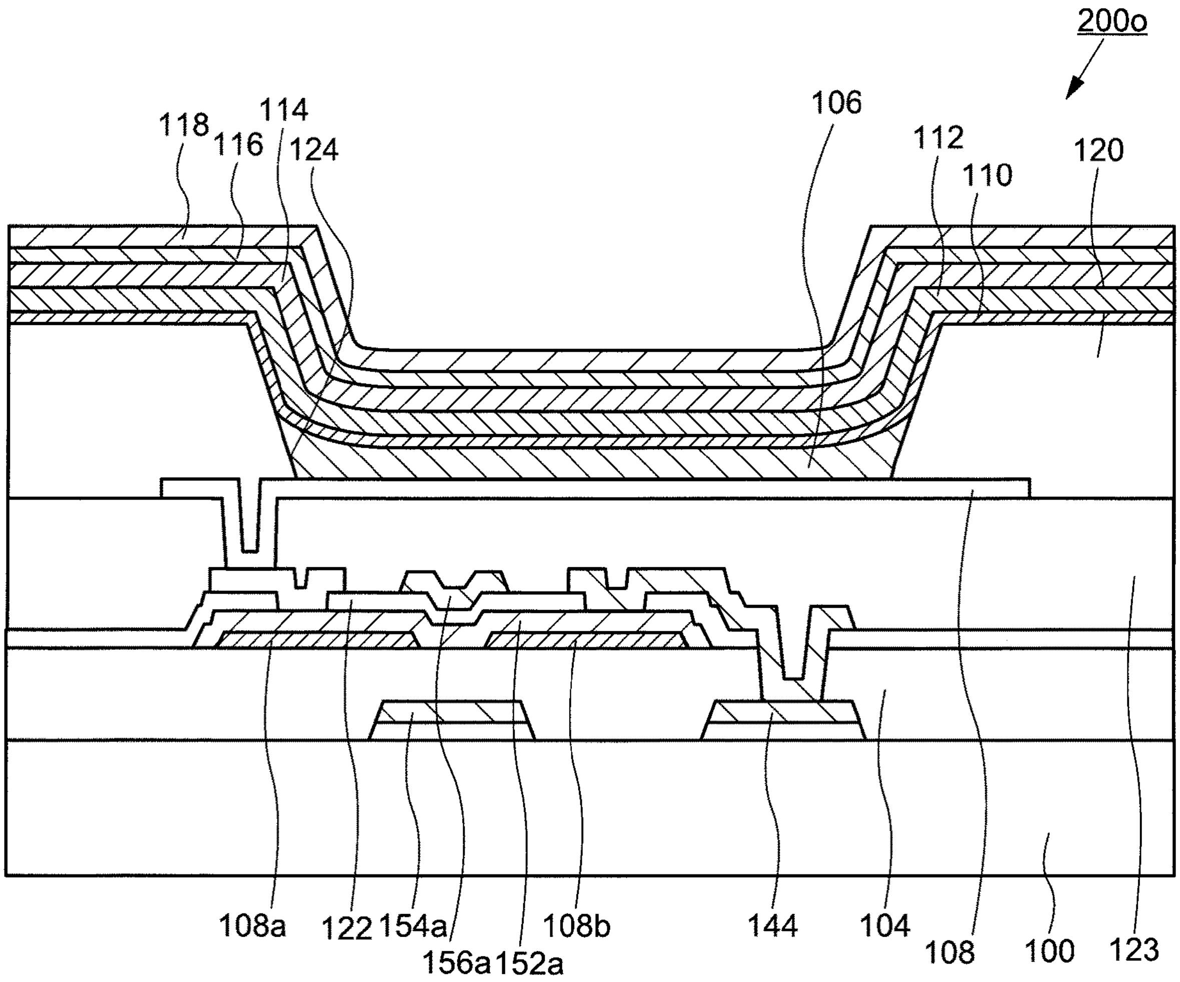
FIG. 41 is a cross-sectional view showing a configuration of an EL element according to a modification of the present invention.

FIG. 41 shows a cross-sectional view of an EL element 200*o* according to a modification of the present invention. Since the EL element 200*o* shown in FIG. 41 is the same as the EL element shown in FIG. 30 except that the light emitting layer 112 is arranged on substantially the entire surface, descriptions of common portions will be omitted.

The EL elements 200*i*, 200*j*, 200*k*, 200*l*, 200*m*, 200*n*, 200*o* according to FIG. 35 to FIG. 41 can be applied when the light emitting layer 112 is common to all pixels in the display device. For example, in the case where the light emitting layer 112 emits white light, the configurations shown in FIG. 35 to FIG. 41 can be applied. Since the light emitting layer 112 is common, they can be formed in the same process. That is, it is not necessary to paint the light emitting layer 112 for each predetermined color (material). Although the light emitting layer 112 of FIG. 35 to FIG. 41 is shown as a single layer, the light emitting layer 112 may be formed by stacking a plurality of layers having different emission wavelengths.

What is claimed is:

1. A method of manufacturing an inverted stack electroluminescence element, the method comprising:
- forming a first electrode on a substrate;
- forming a first electron transport layer in contact with the first electrode;
- forming a first insulating layer having an opening in a region overlapping with the first electrode;
- forming a second electron transport layer including metal oxide semiconductor by applying a liquid composition to the opening and removing a solvent by thermal treatment after application, wherein a specific resistance of the second electron transport layer is in the range of $10^2$ Ω·cm to $10^6$ Ω·cm, the second electron transport layer is smaller in area than an area of a region where the first electron transport layer is disposed;
- forming a light emitting layer overlapping with the second electron transport layer, the light emitting layer containing an electroluminescent material; and
- forming a second electrode in a region overlapping with the light emitting layer.

2. The method of manufacturing an electroluminescence element according to claim 1, wherein the liquid composition comprises an inorganic metal salt, a primary amide and the solvent.

3. The method of manufacturing an electroluminescence element according to claim 1, wherein the liquid composition is an organic Group 2 metal compound and an organic Group 3 metal compound dissolved in an organic solvent.

4. An inverted stack electroluminescence element comprising:
- A first electrode;
- a second electrode having a region facing the first electrode;
- a first insulating layer between the first electrode and the second electrode;
- an electron transport layer electrically connected to the first electrode; and
- a light emitting layer containing an electroluminescent material between the electron transport layer and the second electrode,
- wherein the first insulating layer has an opening,
- wherein the opening has an overlapping region where the second electrode, the light emitting layer, the electron transport layer, and the first electrode overlap,
- wherein the electron transport layer has a first electron transport layer in contact with the first electrode and a second electron transport layer arranged in the opening and in contact with the first electron transport layer, and
- wherein a thickness of the second electron transport layer is larger at an edge of the opening than at a center of the opening, the second electron transport layer is in contact with a side surface of the opening and rises along the side surface the second electron transport layer is positioned within the opening, an area where the second electron transport layer is arranged is smaller than an area where the first electron transport layer is arranged, and a specific resistance opening of the second electron transport layer in the range of $10^2$ Ω·cm to $10^6$ Ω·cm.

5. The electroluminescence element according to claim 4, wherein the electron mobility of the first electron transport layer is higher than the electron mobility of the second electron transport layer.

6. The electroluminescence element according to claim 5, wherein the carrier concentration of the first electron transport layer is higher than the carrier concentration of the second electron transport layer.

7. The electroluminescence element according to claim 5, wherein the first electron transport layer has a bandgap of 3.0 eV or more, and the second electron transport layer has a bandgap of 3.0 eV or more.

8. The electroluminescence element according to claim 5, wherein the first electron transport layer and the second electron transport layer contain an oxide semiconductor, the thickness of the second electron transport layer is larger than the thickness of the first electron transport layer, and the film thickness of the second electron transport layer is 150 nm or more.

9. The electroluminescence element according to claim 8,
- wherein the first electron transport layer contains tin oxide and indium oxide, and at least one selected from gallium oxide, tungsten oxide, aluminum oxide and silicon oxide,
- wherein the second electron transport layer contains zinc oxide and at least one selected from silicon oxide, magnesium oxide, indium oxide, aluminum oxide and gallium oxide.

10. The electroluminescence element according to claim 4, wherein a work function of the second electron transport layer is 3.8 eV or less.

11. A display device comprising:
- a pixel comprising the inverted stack electroluminescence element according to claim 4, and a driving transistor connected to the electroluminescence element on a substrate;

wherein the driving transistor comprises:

an oxide semiconductor layer, a first insulating layer located under the oxide semiconductor layer;

a first gate electrode having a region overlapping with the oxide semiconductor layer, the first gate electrode arranged on the substrate side of the oxide semiconductor layer with the first insulating layer interposed therebetween;

a second gate electrode having a region overlapping with the oxide semiconductor layer and the first gate electrode, the second gate electrode arranged opposite to the substrate side of the oxide semiconductor layer wherein the first electrode is electrically connected to the oxide semiconductor layer.

12. The display device according to claim 11, wherein the electron mobility of the first electron transport layer is higher than the electron mobility of the second electron transport layer.

13. The display device according to claim 12, wherein the carrier concentration of the first electron transport layer is higher than the carrier concentration of the second electron transport layer.

14. The display device according to claim 12, wherein the first electron transport layer has a bandgap of 3.0 eV or more, and the second electron transport layer has a bandgap of 3.0 eV or more.

15. The display device according to claim 12, wherein the first electron transport layer and the second electron transport layer contain an oxide semiconductor, and the thickness of the second electron transport layer is larger than the thickness of the first electron transport layer.

16. The display device according to claim 15, wherein the first electron transport layer contains tin oxide and indium oxide, and at least one selected from gallium oxide, tungsten oxide, aluminum oxide and silicon oxide, wherein the second electron transport layer contains zinc oxide and at least one selected from silicon oxide, magnesium oxide, indium oxide, aluminum oxide and gallium oxide.

17. The display device according to claim 11, wherein a work function of the second electron transport layer is 3.8 eV or less.

* * * * *